United States Patent [19]

Kodosky et al.

[11] Patent Number: 4,914,568

[45] Date of Patent: Apr. 3, 1990

[54] GRAPHICAL SYSTEM FOR MODELLING A PROCESS AND ASSOCIATED METHOD

[75] Inventors: Jeffrey L. Kodosky; James J. Truchard, both of Austin, Tex.; John E. MacCrisken, Palo Alto, Calif.

[73] Assignee: National Instruments, Inc., Austin, Tex.

[21] Appl. No.: 923,127

[22] Filed: Oct. 24, 1986

[51] Int. Cl.[4] .................. G06F 15/46; G06F 3/153
[52] U.S. Cl. ........................ 364/200; 364/221.2;
364/237.5; 364/286; 364/286.2; 364/300;
364/578
[58] Field of Search .............. 364/200 MS, 300 MS, 364/900 MS, 578

[56] References Cited

U.S. PATENT DOCUMENTS

| 4,064,394 | 12/1977 | Allen | 364/300 X |
|---|---|---|---|
| 4,315,315 | 2/1982 | Kossiakoff | 364/300 |
| 4,455,619 | 6/1984 | Masui et al. | 364/900 |
| 4,546,435 | 10/1985 | Herbert et al. | 364/300 |
| 4,656,603 | 4/1987 | Dunn | 364/900 |
| 4,663,704 | 5/1987 | Jones et al. | 364/900 X |
| 4,677,587 | 6/1987 | Zemahy, Jr. | 364/900 |
| 4,695,968 | 9/1987 | Sullivan, II et al. | 364/578 |
| 4,813,013 | 3/1989 | Dunn | 364/900 |

OTHER PUBLICATIONS

Sharp, J. A., *Data Flow Computing*, Ellis Horword Ltd, Chicester, England, 1985.
Martin, James and Carma McClure, *Diagramming Techniques for Analysts and Programmers*, Prentice-Hall, Inc. New Jersey, 1985, Chapter 7, pp. 93-108 & Chapter 23, pp. 327-348.
Agerwala, Tilak and Arvind, "Data Flow Systems", *Computer*, Feb. 1982, pp. 10-13.
Ackerman, William B., "Data Flow Languages", *Computer*, Feb. 1982, pp. 15-25.
Davis, Alan L. & Robert M. Keller, "Data Flow Program Graphs", *Computer*, Feb. 1982, pp. 26-41.
Arvind & Kim P. Gostelow, "The U-Interpreter", *Computer*, Feb. 1982, pp. 42-49.
Gajski, D. D., D. A. Padua, D. J. Kuck, & R. H. Kuh, "A Second Opinion on Data Flow Machines and Languages", *Computer*, Feb. 1982, pp. 58-69.
Watson, Ian & John Gurd, "A Practical Data Flow Computer", *Computer*, Feb. 1982, pp. 51-57.

*Primary Examiner*—Raulfe B. Zache
*Assistant Examiner*—Florin R. Muteanu
*Attorney, Agent, or Firm*—Flehr, Hohbach, Test, Albritton & Herbert

[57] ABSTRACT

A method for programming a computer system having a display console for displaying inages to control at least one of a virtual instrument and an instrument by the steps of displaying on the screen at least one first function-icon that references at least one first control module for controlling at least one first function; displaying on the screen at least one iteration-icon that references iteration control module for controlling multiple iterations of data flow displaying on the screen at least one first input variable-icon that references at least one first input variable; displaying on the screen at least one first output variable-icon that references at least one first output variable; assembling on the screen a panel and assembling on the screen a first acyclic data flow diagram including the at least one first function-icon and the at least one iteration-icon and the at least one first input variable-icon and the at least one first output variable-ion, such that the diagram displays a first procedure for producing at least one value for the at least one first output variable-icon from at least one value for the at least one first input variable-icon, and such that the at least one iteration-icon in the diagram indicates multiple iterations of the at least one first function in the course of the first procedure.

28 Claims, 64 Drawing Sheets

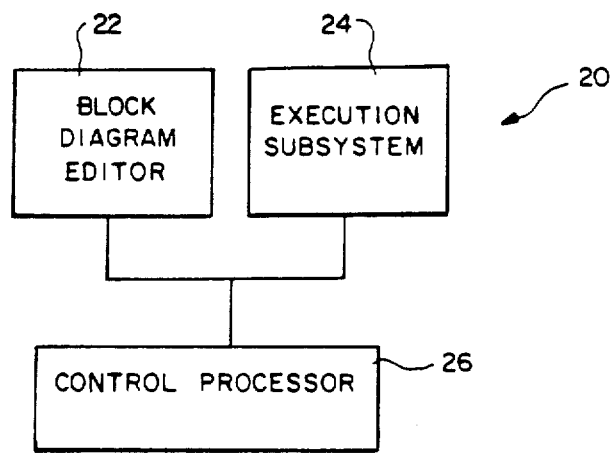
FIG.−1
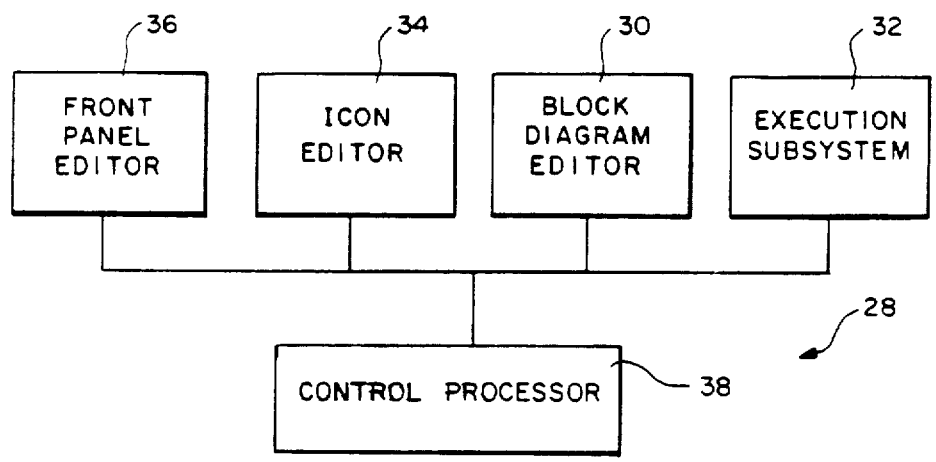
FIG.−2

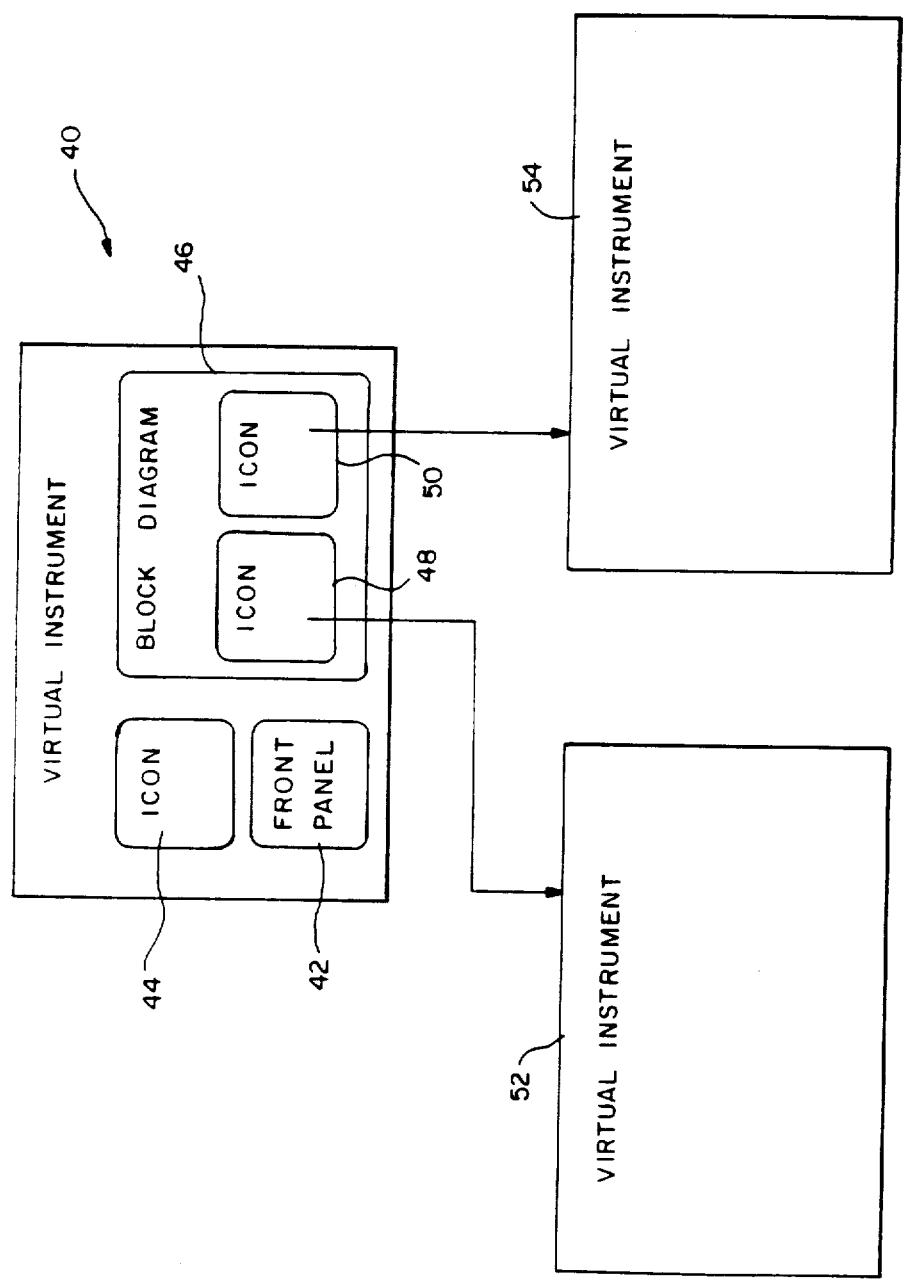

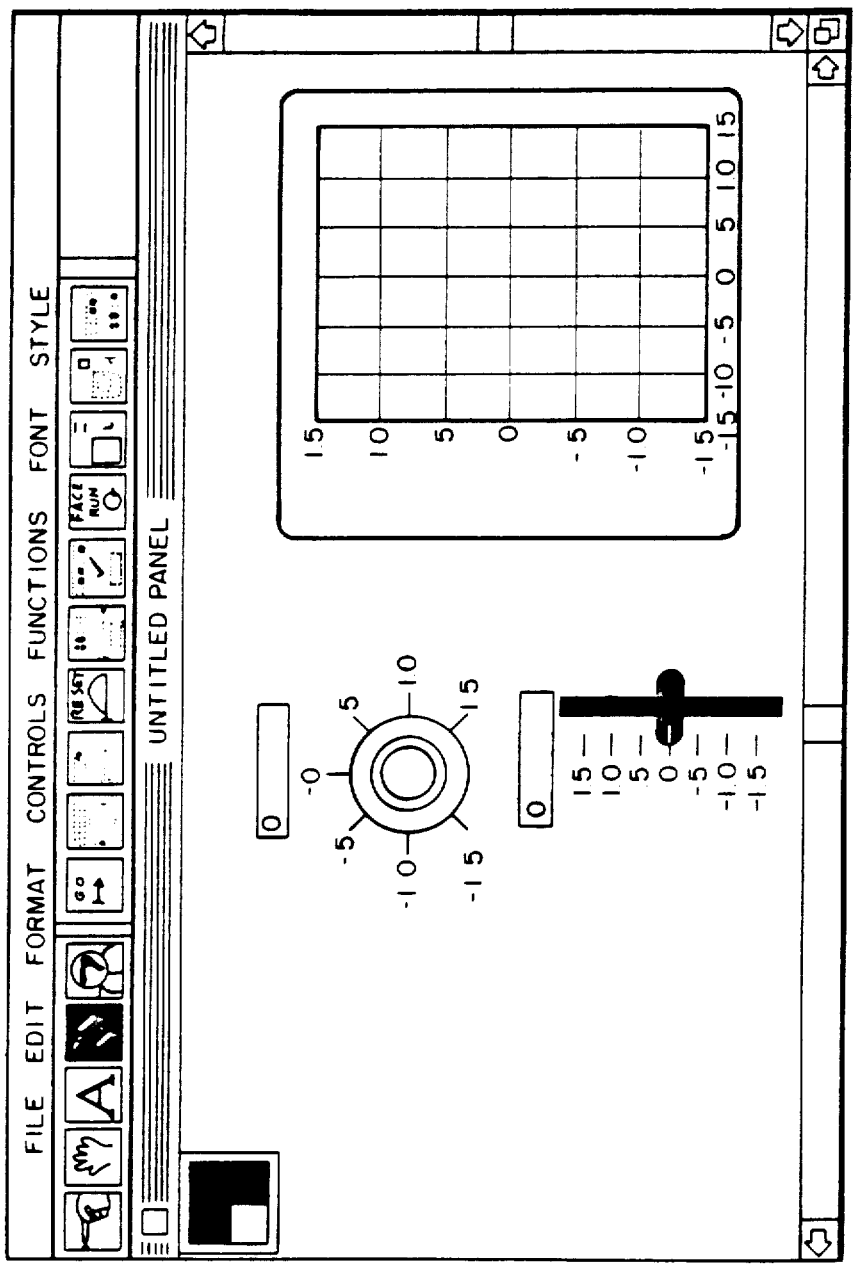
FIG.—5

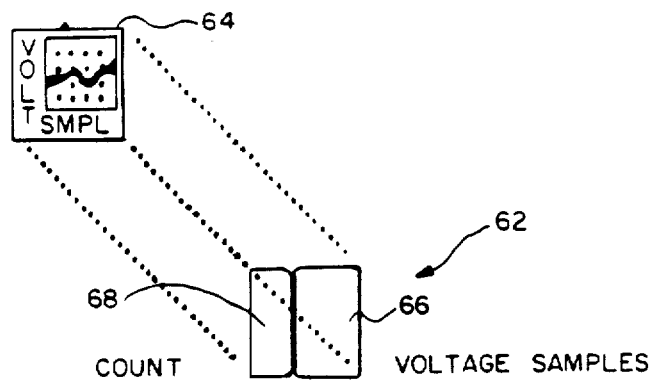
FIG.—6
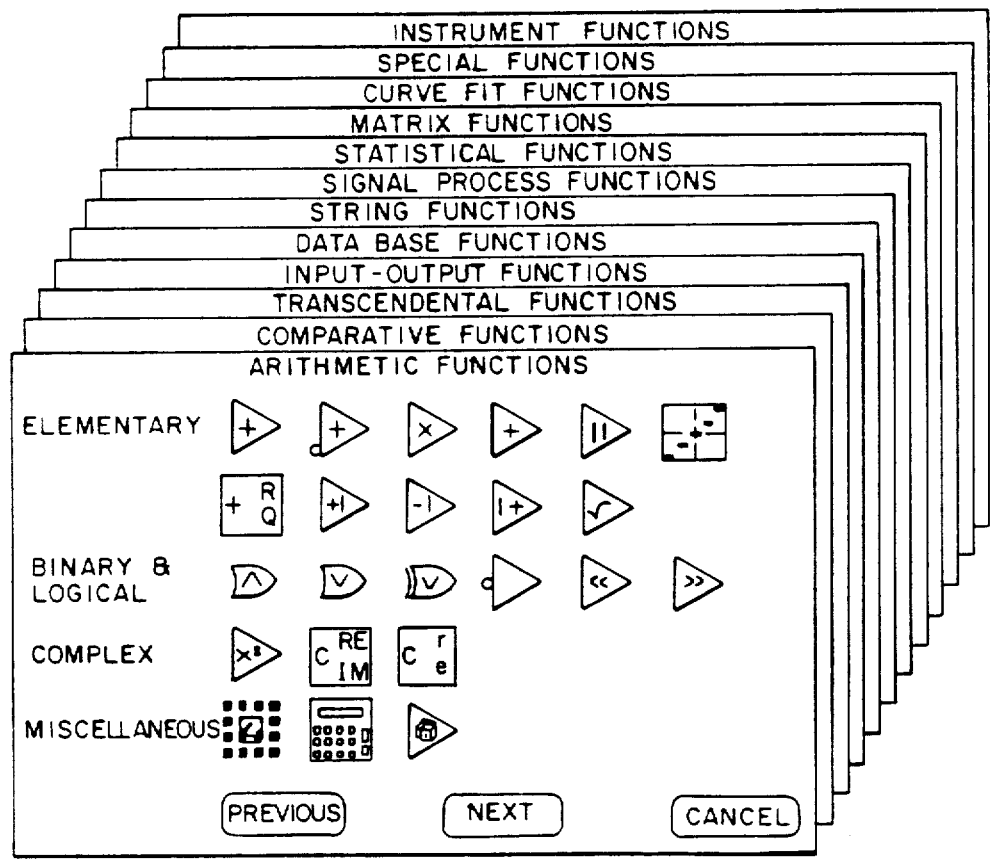
FIG.—7

SEQUENCE STRUCTURE

CONDITIONAL STRUCTURE

ITERATIVE LOOP STRUCTURE

INDEFINITE LOOP STRUCTURE

SHIFT REGISTER ON EACH LOOP STRUCTURE

FIG.—14

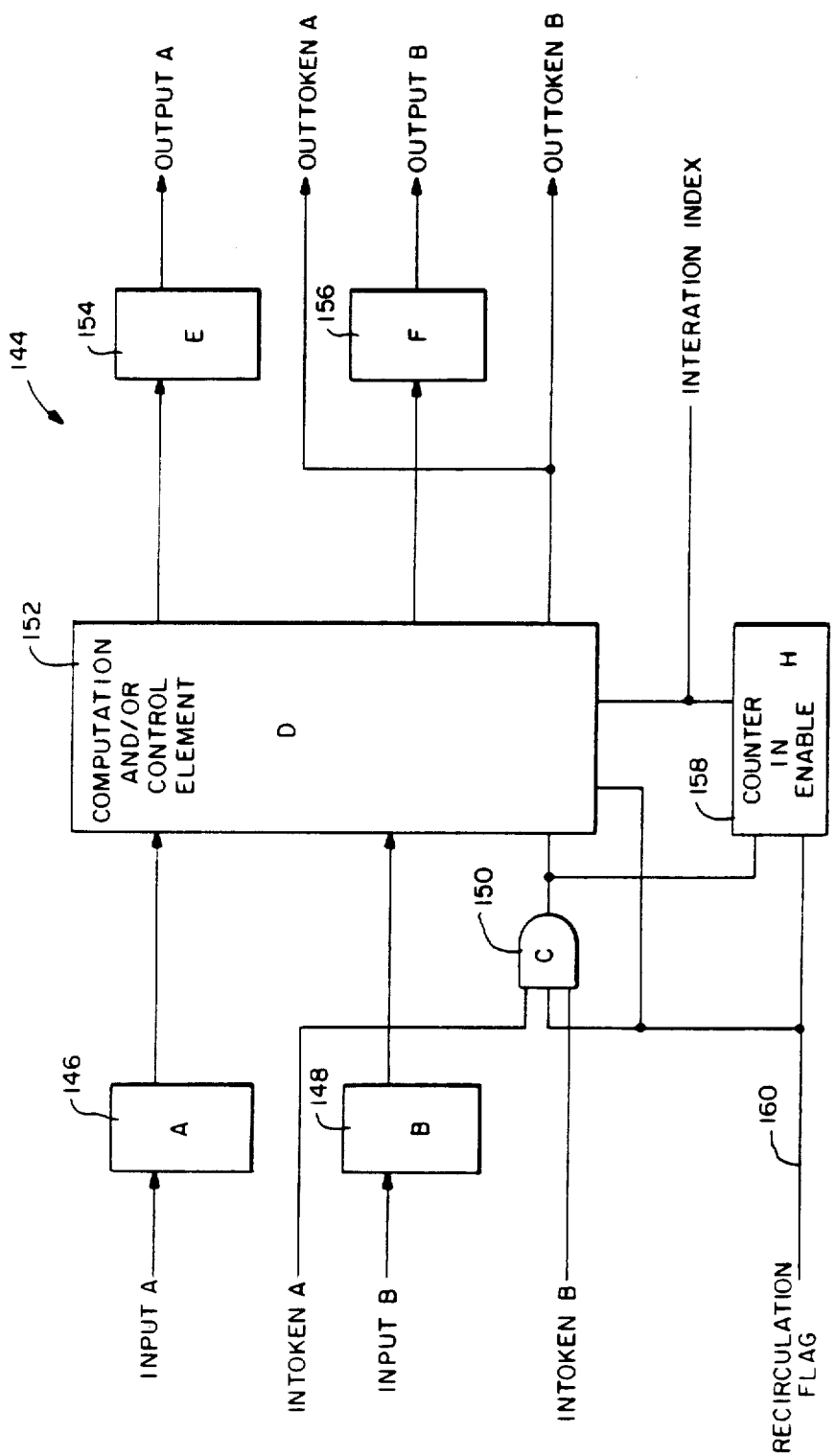
FIG.—16

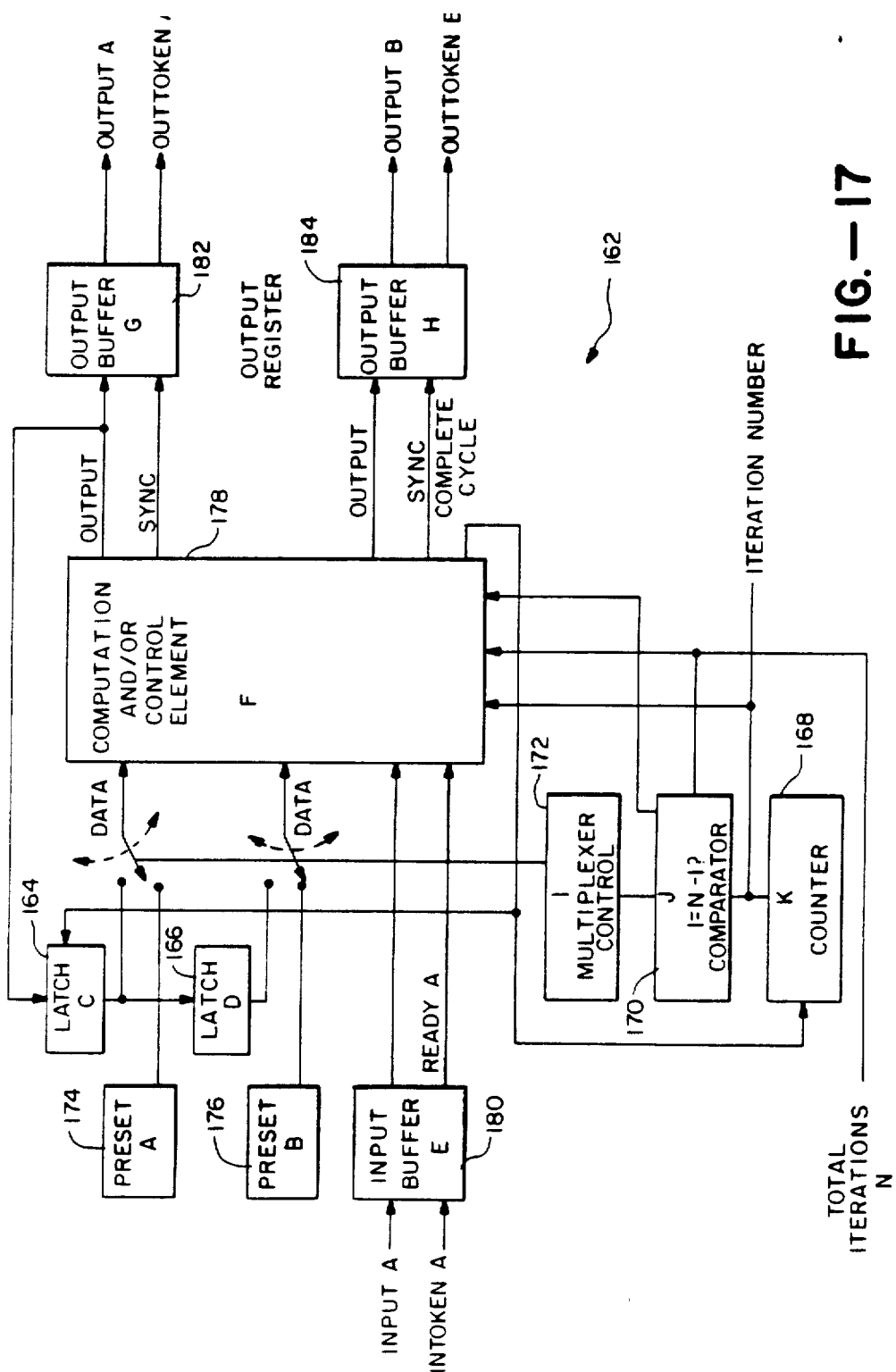
FIG.—17

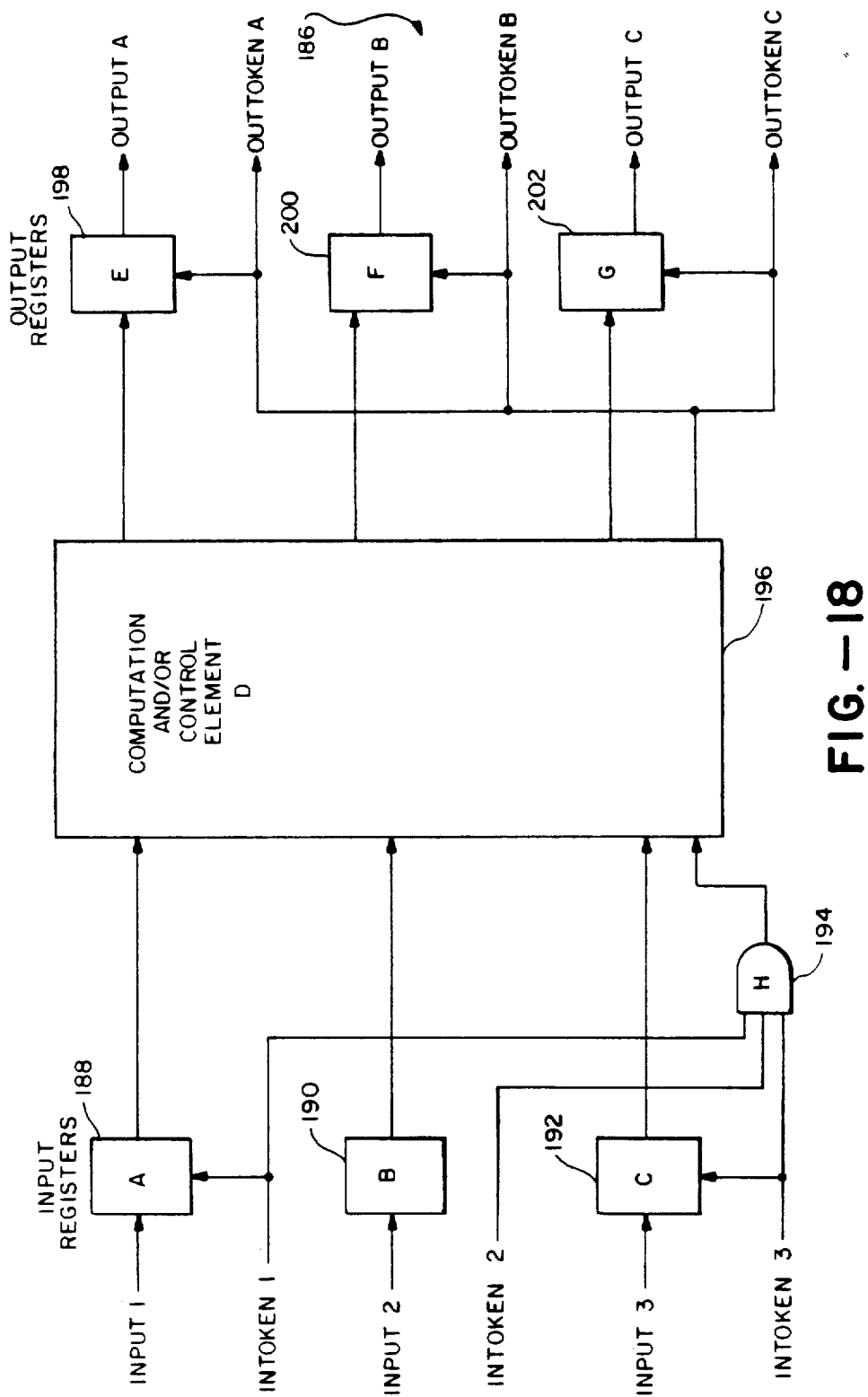

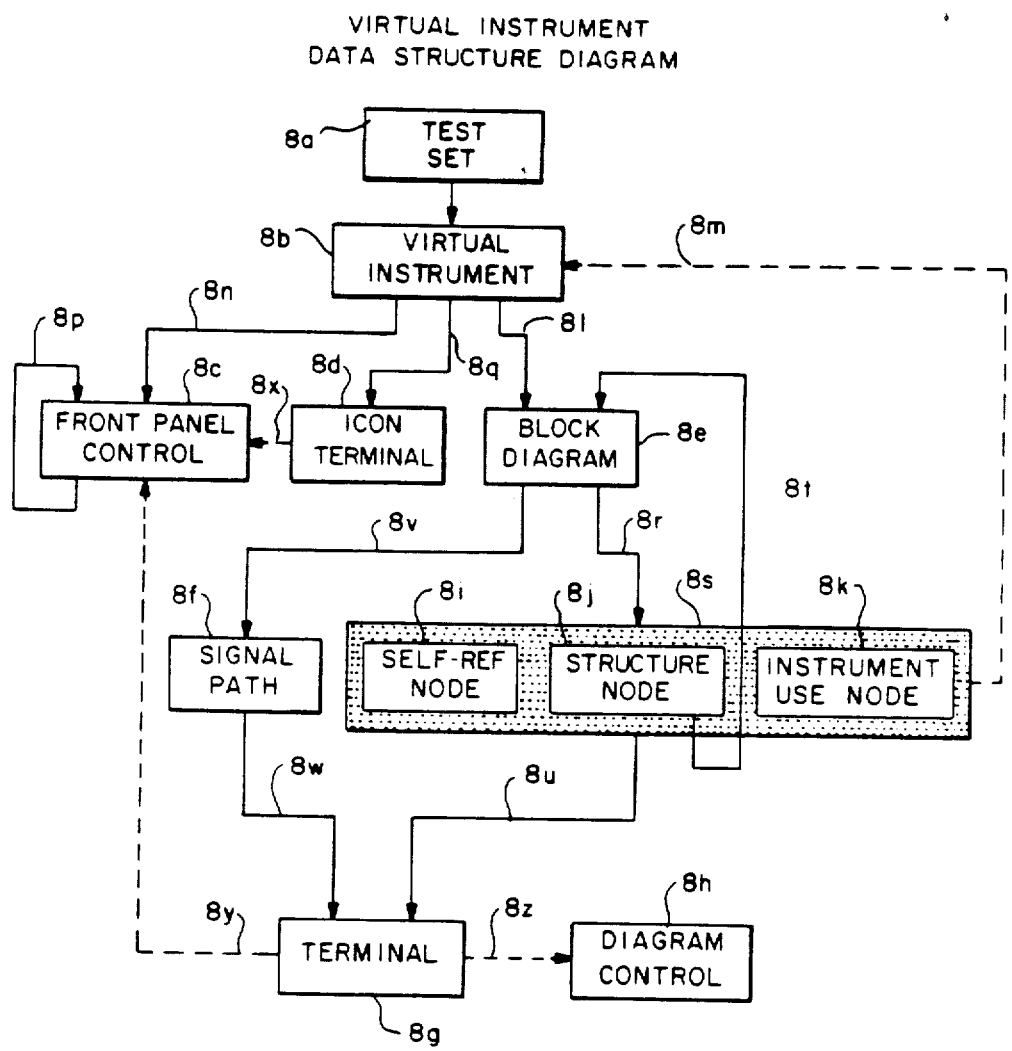
FIG.—19A
FIG.—19B

FIG.-20A
BLOCK DIAGRAM
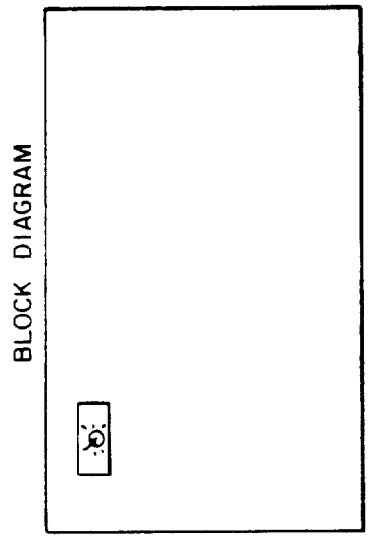
FRONT PANEL
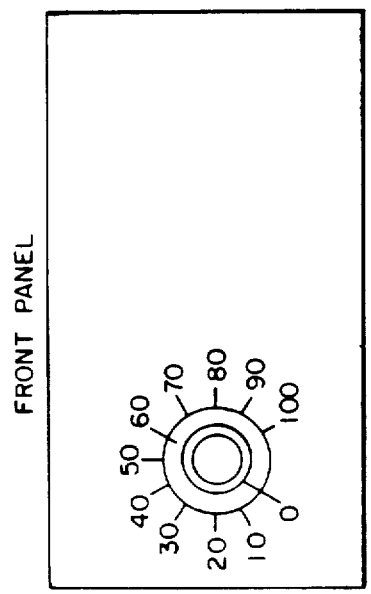
FIG.-20B
BLOCK DIAGRAM
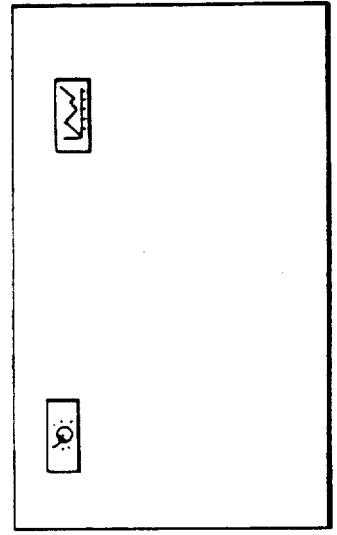
FRONT PANEL
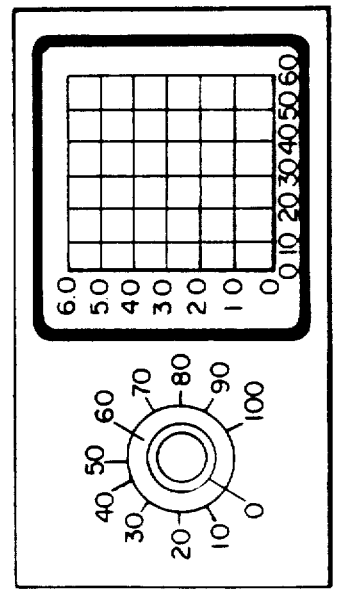

FIG.-20C
FIG.-20D
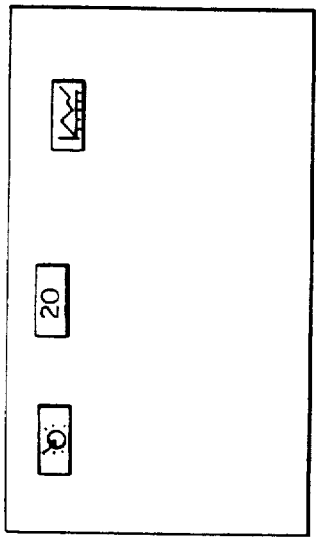
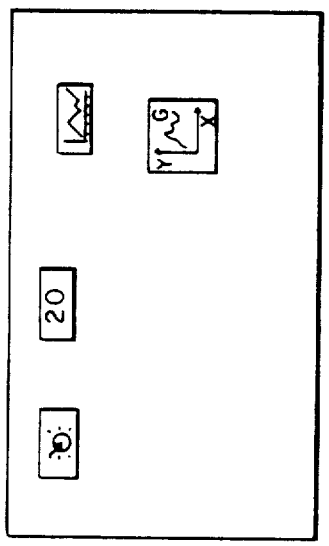
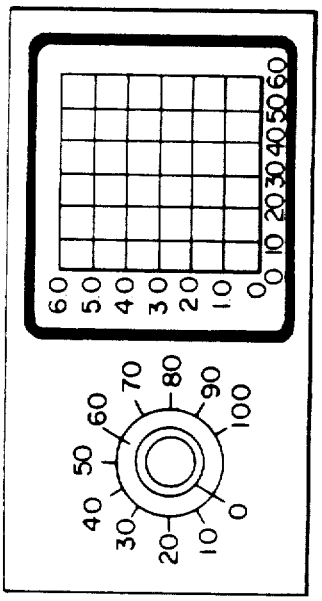
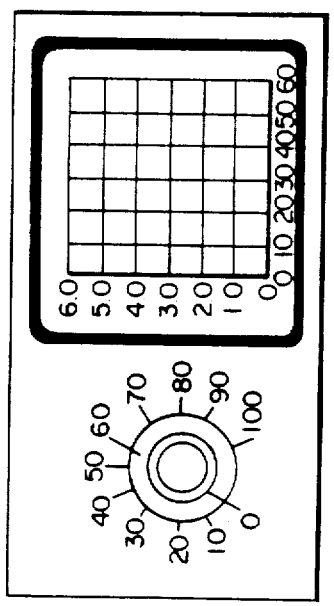

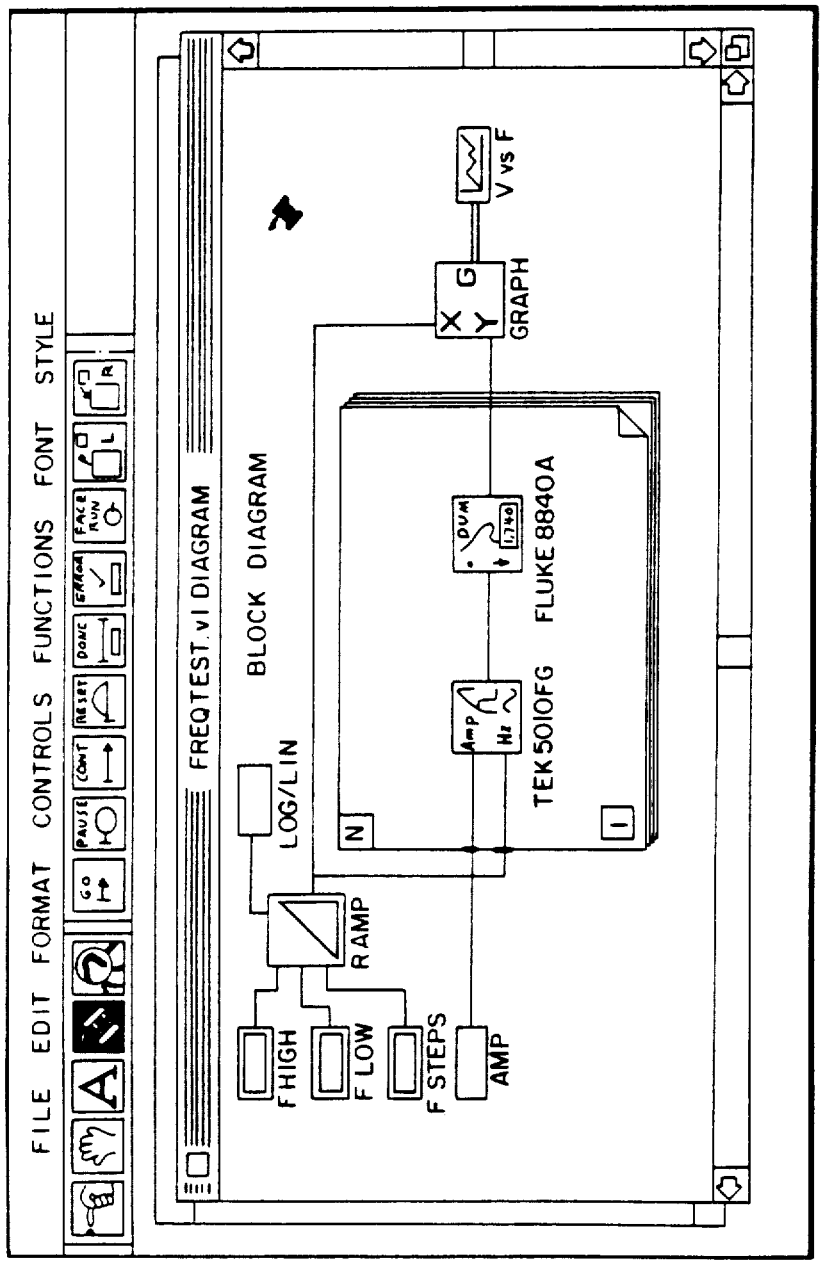
FIG.—22

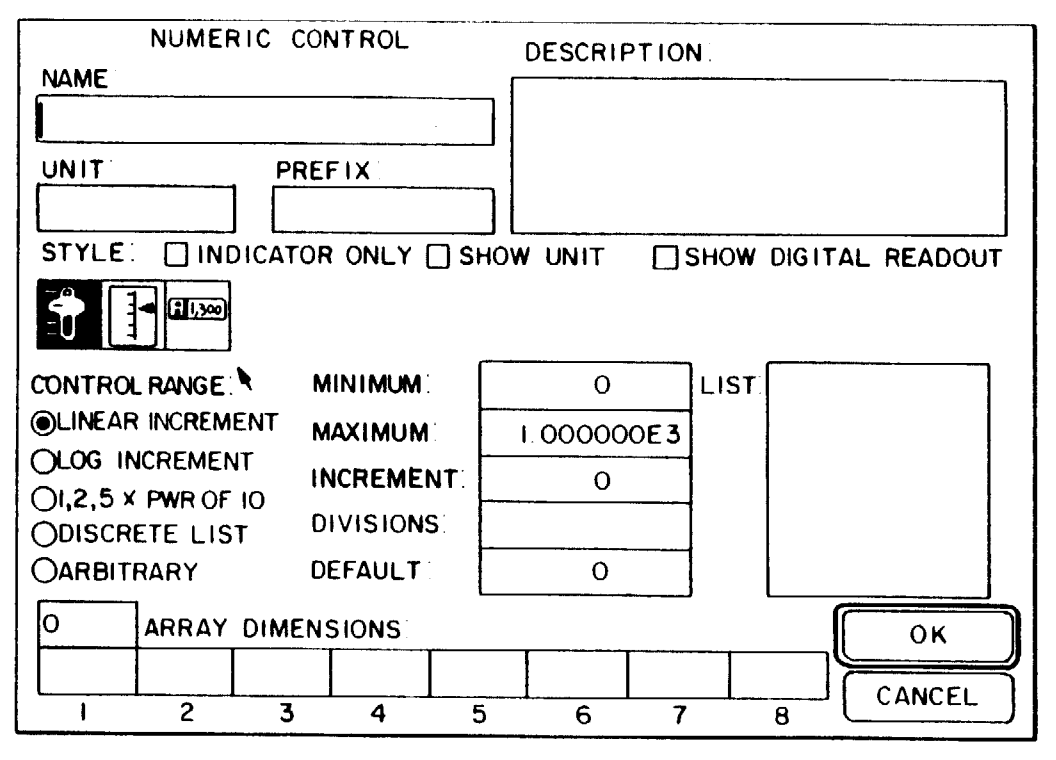

FIG.—28

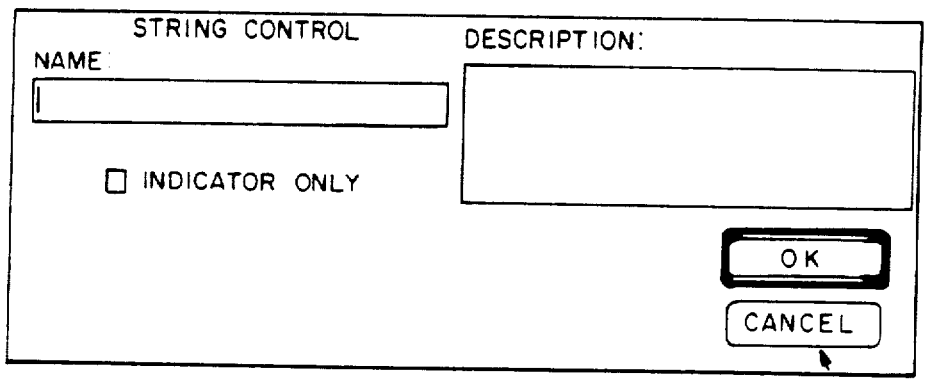
FIG.—29
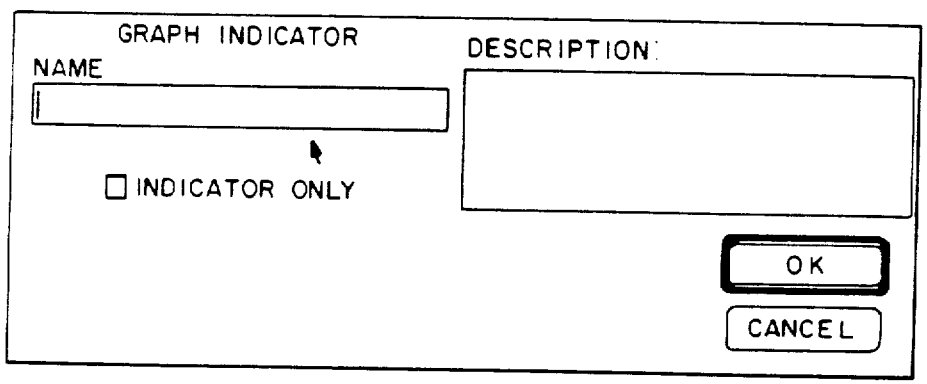
FIG.—30

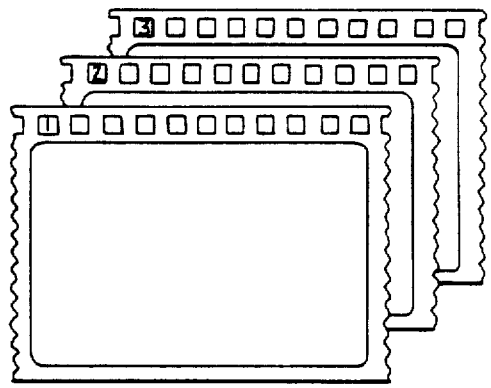
FIG.-33
FIG.-34
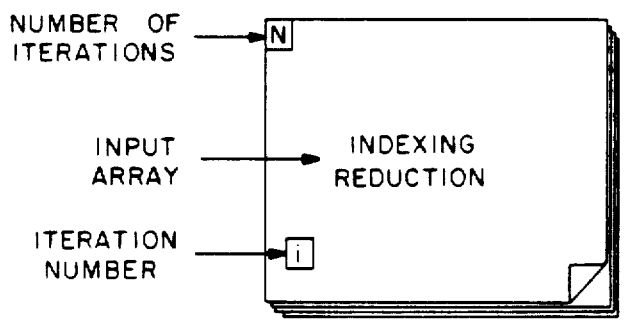
FIG.-35
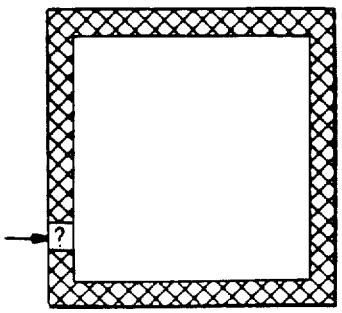
FIG.-36

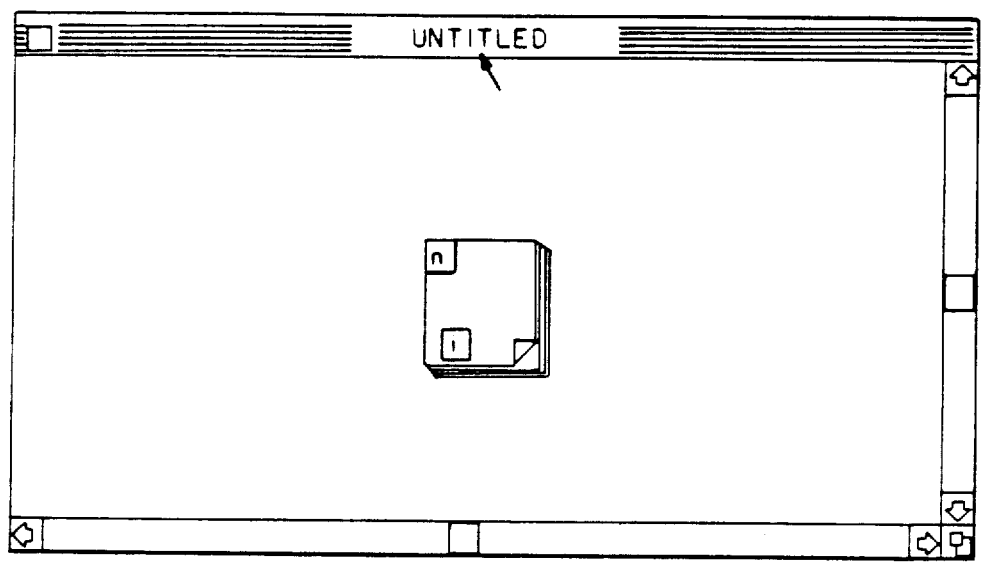
FIG.—40
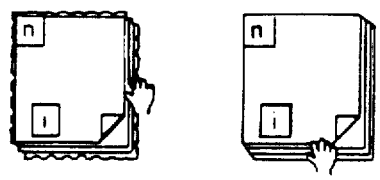
FIG.—41
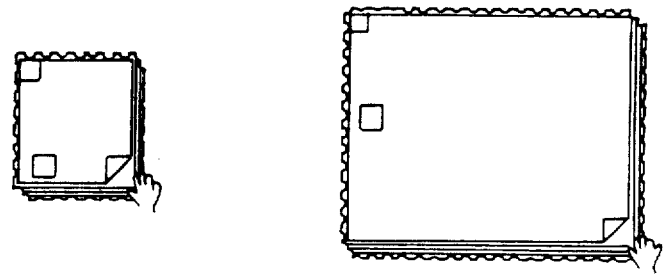
FIG.—42

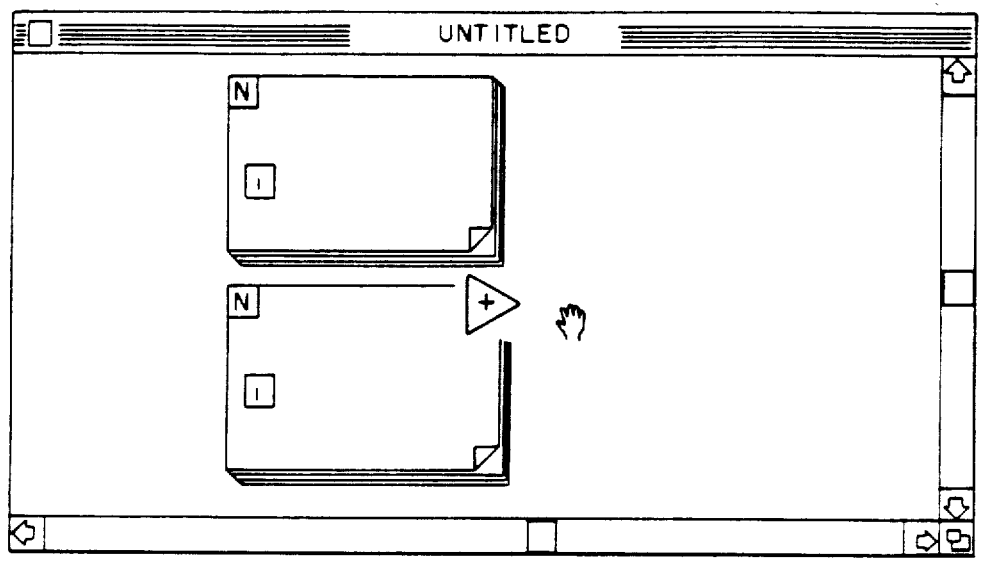
FIG.—45
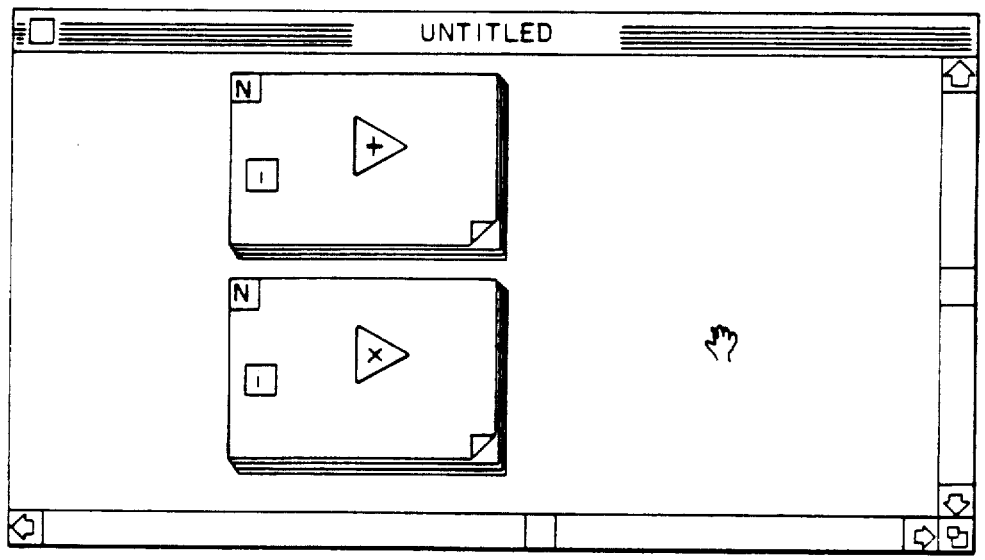
FIG.—46

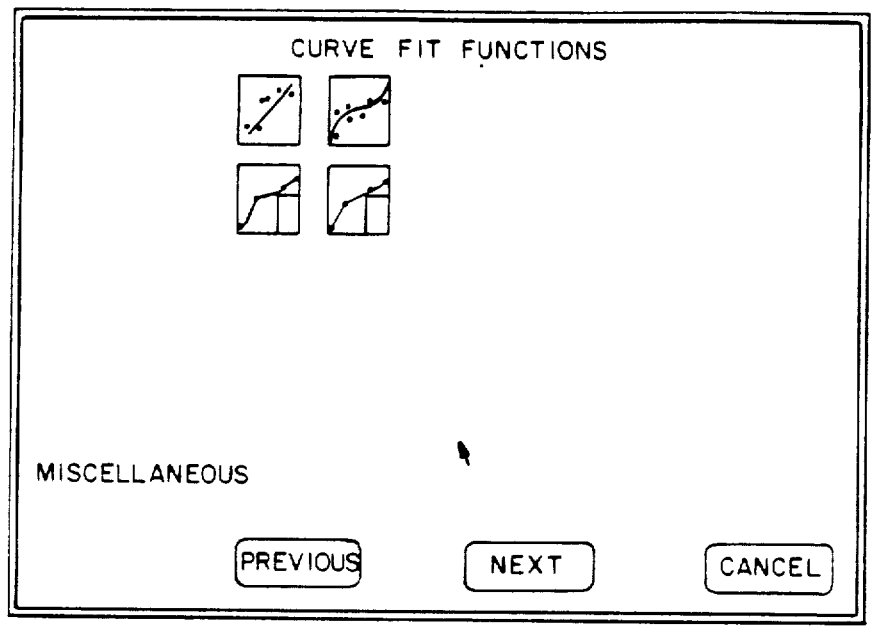
FIG.—47
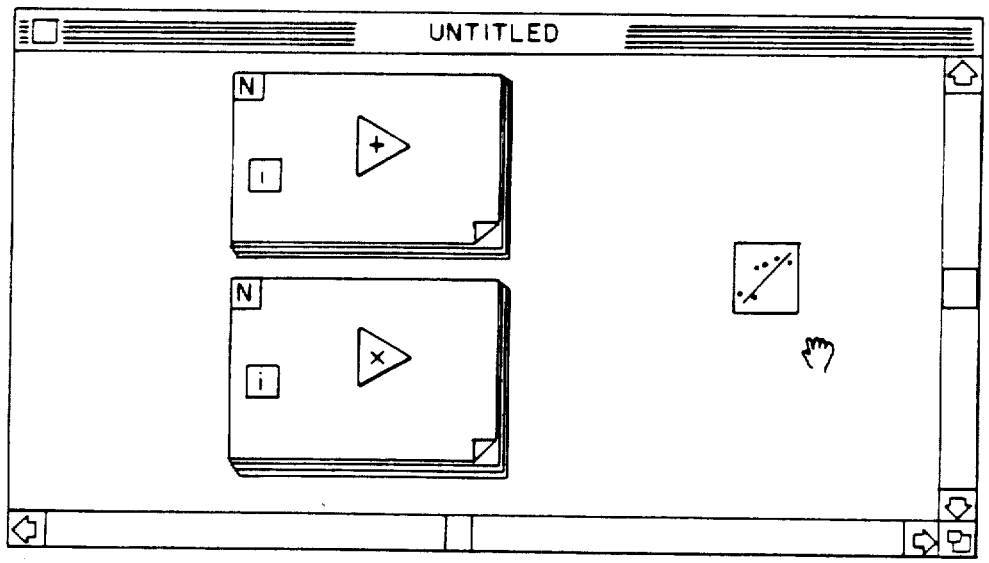
FIG.—48

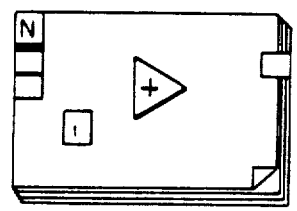
FIG.—49
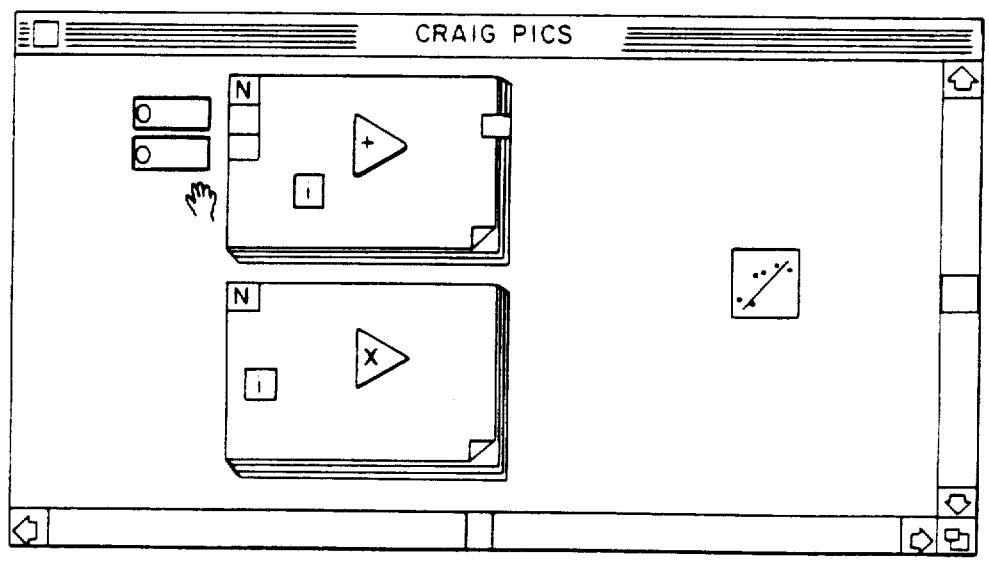
FIG.—50

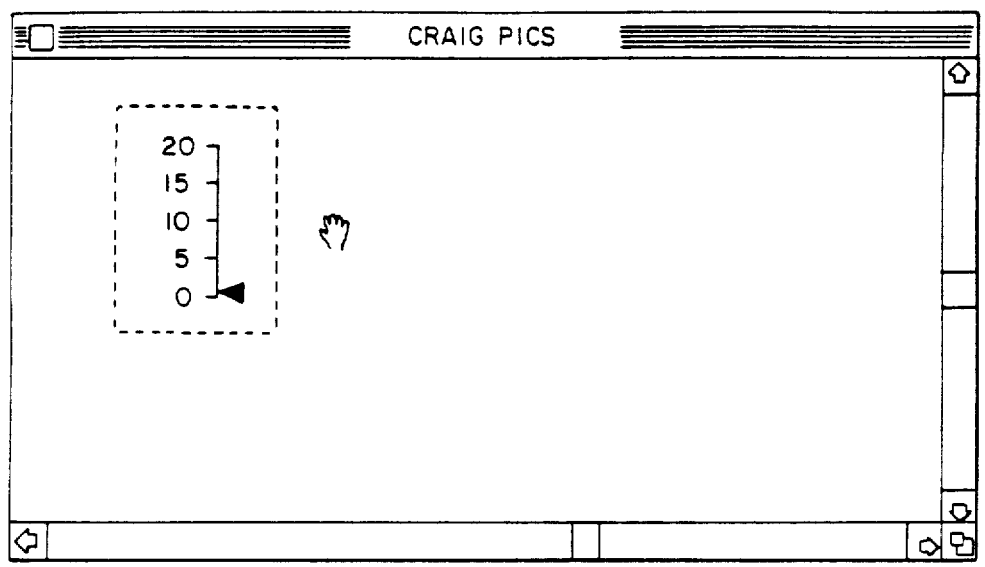
FIG.—51
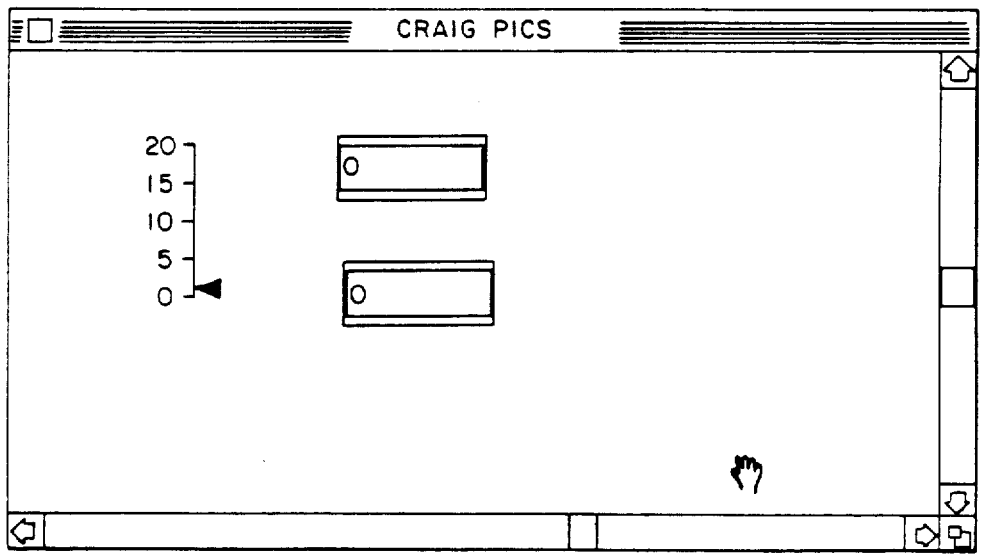
FIG.—52

ARITHMETIC FUNCTIONS

 ADD

 SUBTRACT

 MULTIPLY

 DIVIDE

NUMERIC $\boxed{\frac{a}{b}\,c}$ NUMERIC
NUMERIC c = a op b

COMPARATIVE FUNCTIONS

 EQUAL

 GREATER-THAN

 LESS-THAN

NUMERIC $\boxed{\frac{a}{b}\,c}$ BINARY
NUMERIC c = a op b

INPUT OUTPUT FUNCTIONS

 GPIB READ

 GPIB WRITE

DUMMY INPUT STRING ▭ NUMERIC OUTPUT

COMMAND STRING ADDRESS STRING ▭ DUMMY OUTPUT STRING

OTHER FUNCTIONS

 STRING BUILDSTRING

 SIGNAL PROCESS RAMP GENERATOR

 CURVE FIT LINEAR FIT

FREQUENCY AMPLITUDE ▭ POWER SUPPLY COMMAND STRING

STEPS $\boxed{\frac{HIGH}{LOW}}$ RAMP y-ARRAY x-ARRAY ▭ LINEAR FIT GRAPH

FIG.—56

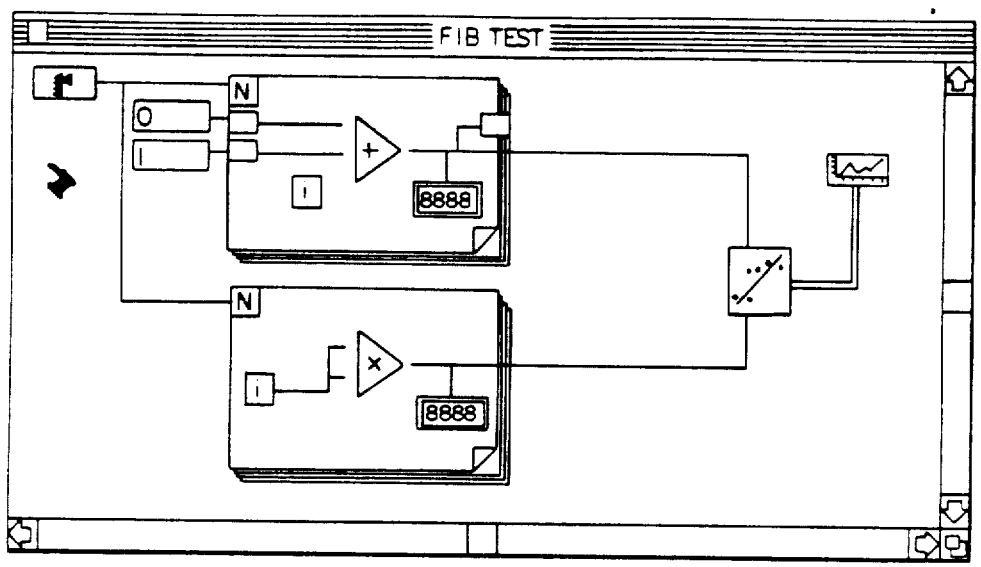
FIG. —57
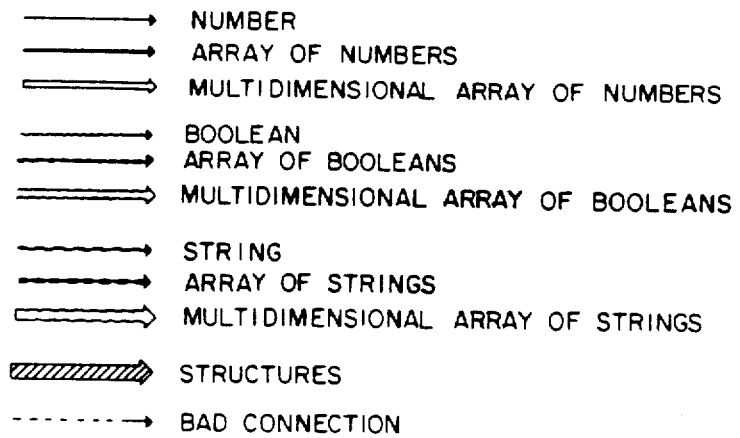
FIG. —58

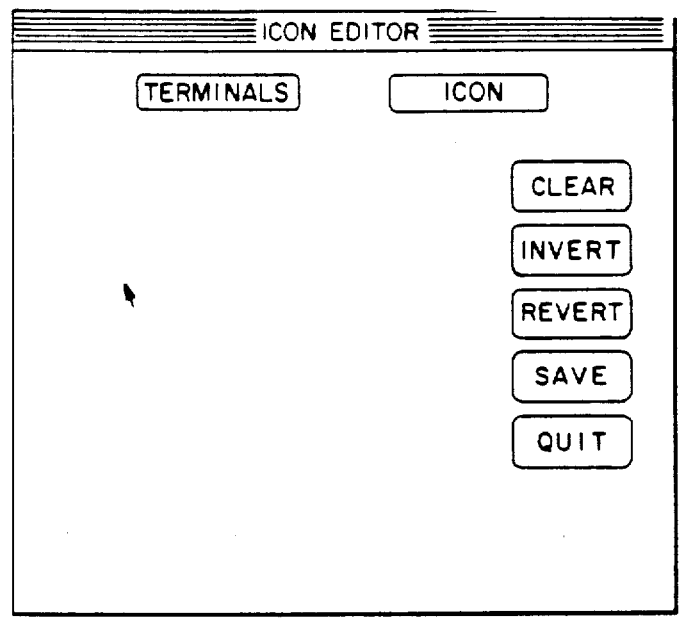
FIG.—59
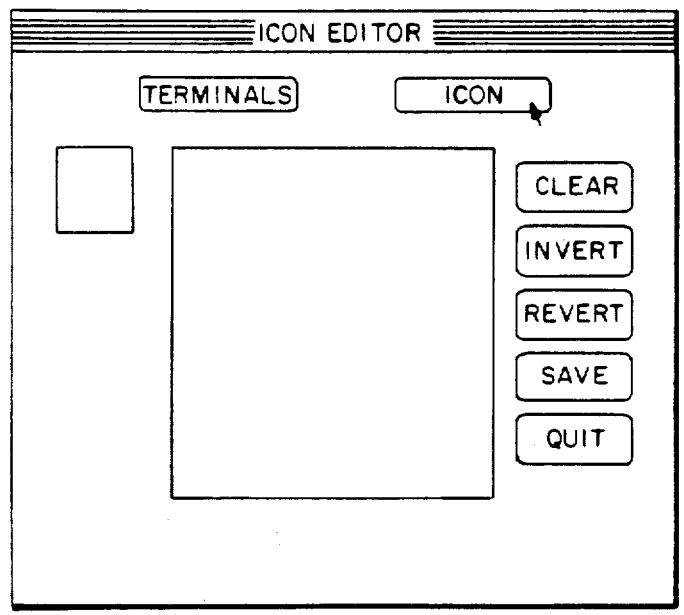
FIG.—60

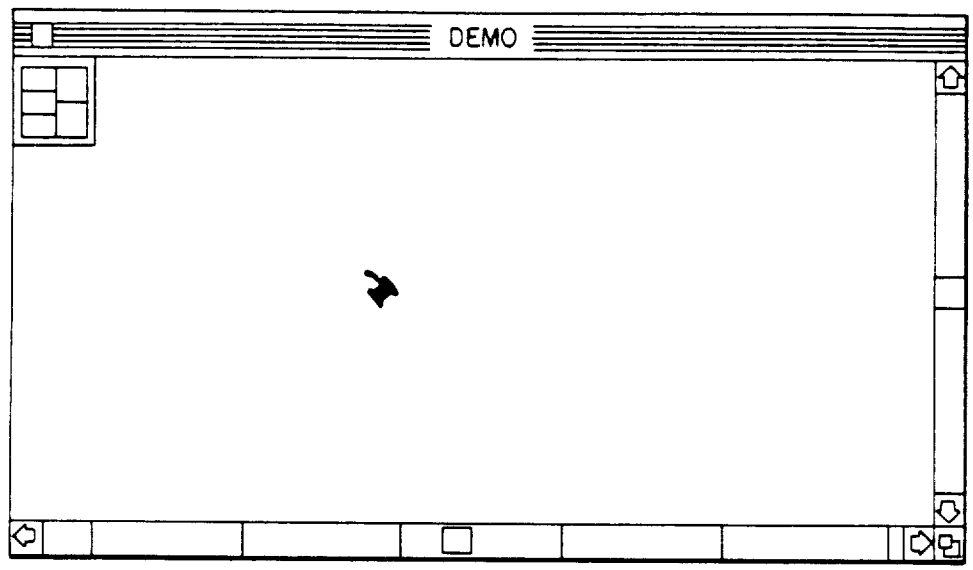
FIG. −63
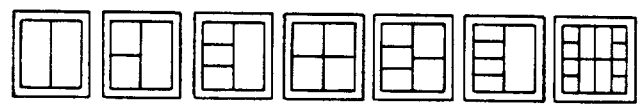
FIG. −64

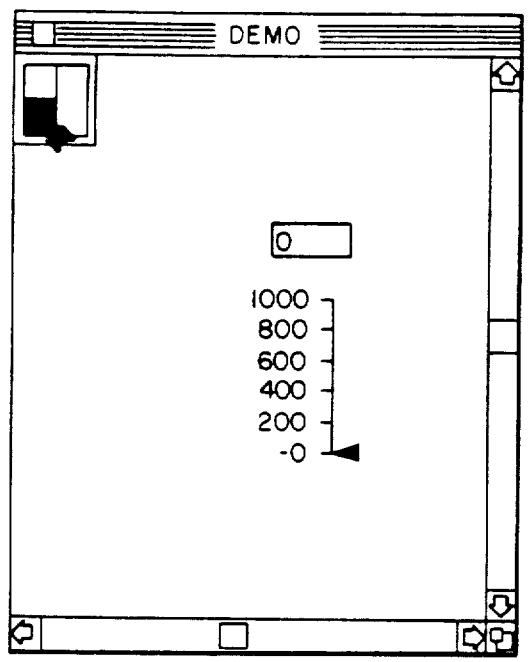
FIG.—65A
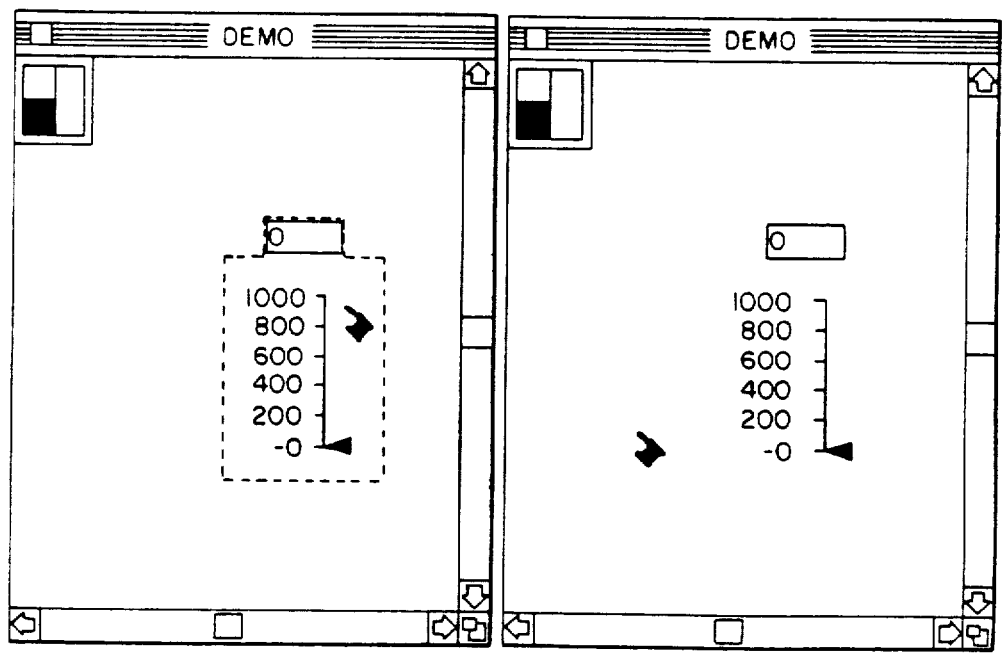
FIG.—65B  FIG.—65C

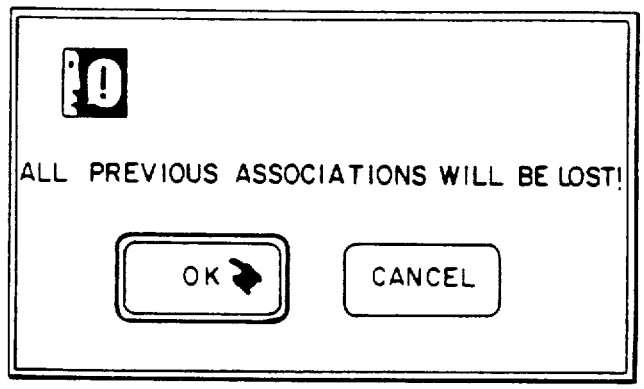
FIG.—66
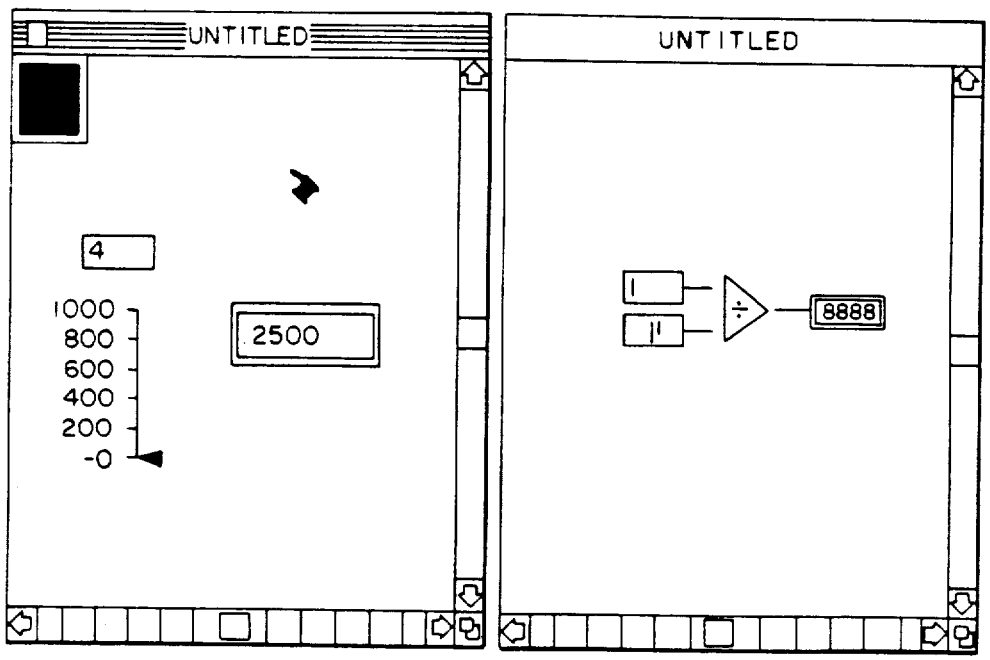
FIG.—67   FIG.—68

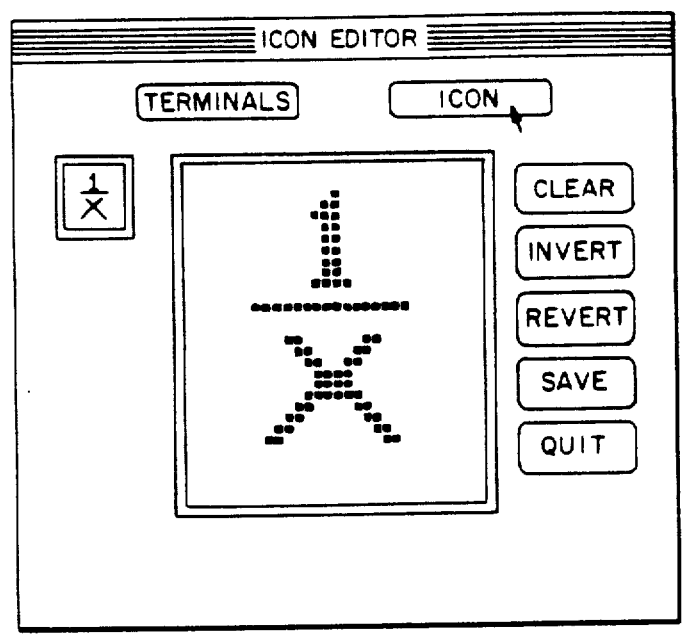
FIG.—69
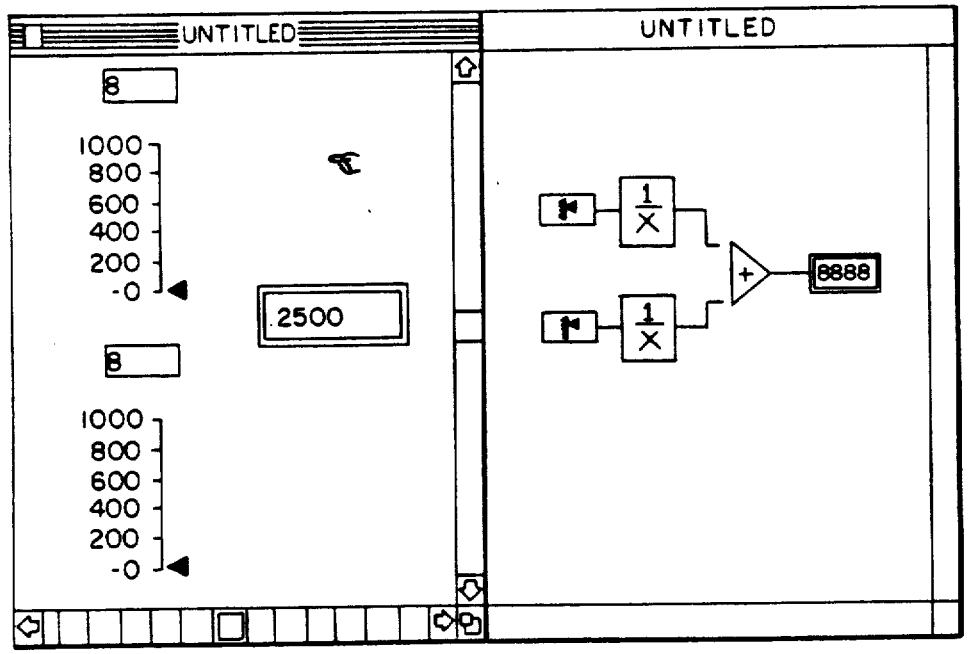
FIG.—70

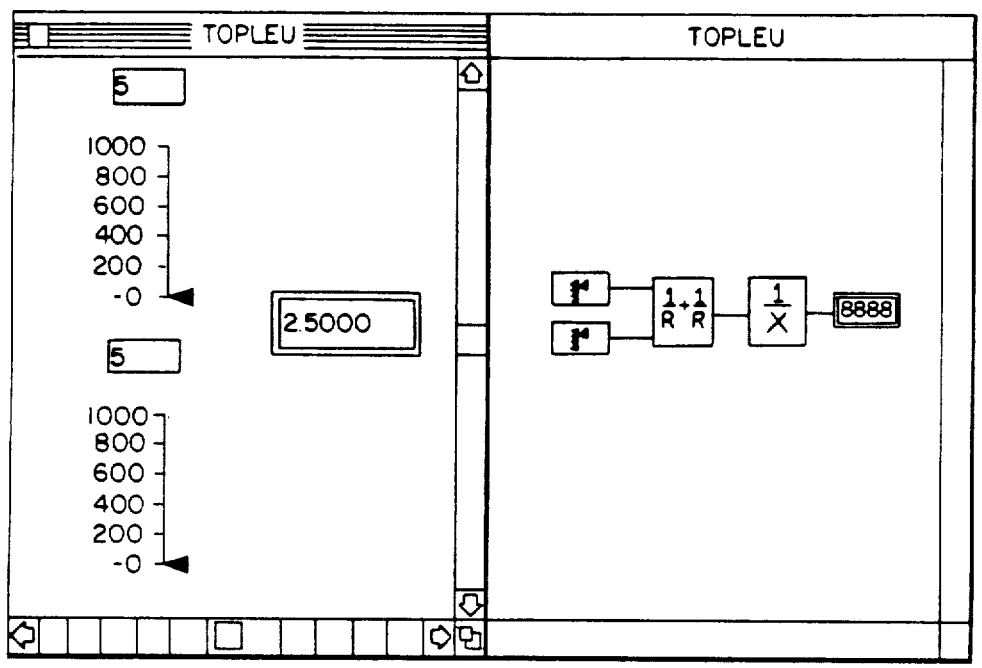
FIG.—74
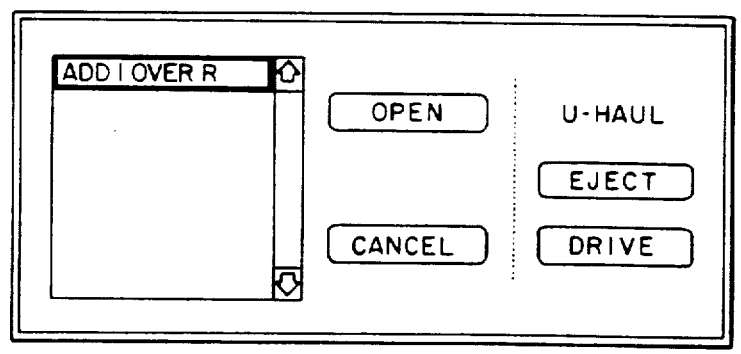
FIG.—75

CONTROL AND INDICATORS

DIAGRAMS

SELFREF NODES

STRUCTURE NODES

CLONE

PARALLEL BLOCK DIAGRAM INSTRUMENT

DATAFORK*

|  | CONTROL 1 | CONTROL 2 | INDICATOR 1 | INDICATOR 2 | FRONT PANEL CONTROL LIST |
|---|---|---|---|---|---|
| RUN 1 | VALUE | VALUE | VALUE | VALUE | |
| RUN 2 | | | | | |
| | | | | | |

| TYPES | STORAGE SPACE |
|---|---|
| NUMERIC | 10 BYTES (IEEE EXTENDED FORMAT) |
| BINARY | 2 BYTES |
| STRING | 4 BYTES + # OF CHARACTERS |
| ARRAY NUMERIC | 16 BYTES FOR DIMENSION & HEADER INFO + (NUMERIC * SIZE OF ARRAY) |
FIG.-104
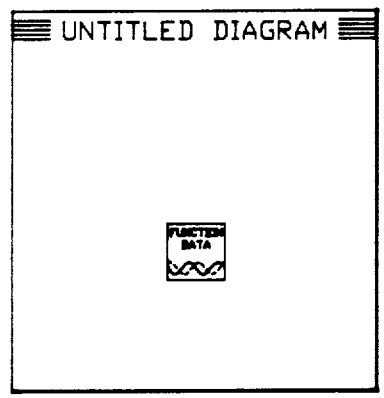
FIG.-105
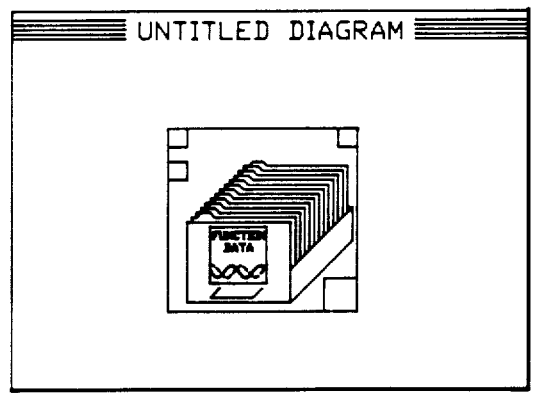
FIG.-106

GRAPHICAL SYSTEM FOR MODELLING A PROCESS AND ASSOCIATED METHOD

BACKGROUND OF THE INVENTION

1. Field of the Invention

The present invention relates to systems for modeling processes and more particularly to computer systems for modeling processes.

2. Description of the Related Art

Currently there is a strong movement toward very high level programming languages which can enhance programmer productivity by making a programming task more understandable and intuitive. The increasing use of computers by users who are not highly trained in computer programming techniques has lead to a situation in which the user's programming skills and ability to interact with a computer system often become a limiting factor in the achievement of optimal utilization of the computer system.

There are numerous subtle complexities which a user often must master before she can efficiently program a computer system. For example, typical earlier computer systems generally comprise software subsystems which include multiple programs, and such programs often utilize one or more subroutines. Software systems typically coordinate activity between multiple programs, and each program typically coordinates activity between multiple subroutines. However, techniques for coordinating multiple programs generally differ from techniques for coordinating multiple subroutines. Furthermore, since programs ordinarily can stand alone while subroutines usually cannot, techniques for linking programs to a software system generally differ from techniques for linking subroutines to a program. Complexities such as these often make it difficult for a user, who although she may be a specialist in her field is not a specialist in the computer field, to efficiently make use of powerful computer systems which are available for her use.

The task of programming a computer system to model a process is further complicated by the fact that a sequence of mathematical formulas, mathematical steps or other procedures customarily used to conceptually model such a process often does not closely correspond to the traditional programming techniques used to program a computer system to model such a process. For example, a user of a computer system frequently develops a conceptual model for a physical system which can be partitioned into functional blocks, each of which corresponds to actual systems or subsystems. Computer systems, however, ordinarily do not actually compute in accordance with such conceptualized functional blocks. Instead, they often utilize calls to various subroutines and retrievals of data from different memory storage locations to implement a procedure which could be conceptualized by a user in terms of a functional block. Thus, a user often must substantially master different skills in order to both conceptually model a system and then to cause a computer system to model that system. Since a user often is not fully proficient in techniques for causing a computer system to implement her model, the efficiency with which the computer system can be utilized to perform such modelling often is reduced.

One particular field in which computer systems are employed to model physical systems is the field of instrumentation. An instrument typically collects information from an environment. Some of the types of information which might be collected by respective instruments, for example, include: voltage, distance, velocity, pressure, frequency of oscillation, humidity or temperature. An instrumentation system ordinarily controls its constituent instruments from which it acquires data which it analyzes, stores and presents to a user of the system. Computer control of instrumentation has become increasingly desirable in view of the increasing complexity and variety of instruments available for use.

In recent years, increasing effort has been directed toward providing more efficient means for implementing instrumentation systems. The task has been complicated by the fact that such systems include arbitrary combinations of hardware instruments and software components. The need for more efficient means of implementation has been prompted by increasing demands for automated instrumentation systems and an increasing variety of hardware and software combinations in use.

In the past, many instrumentation systems comprised individual instruments physically interconnected. Each instrument typically included a physical front panel with its own peculiar combination of indicators, knobs, or switches. A user generally had to understand and manipulate individual controls for each instrument and record readings from an array of indicators. Acquisition and analysis of data in such instrumentation systems was tedious and error prone. An incremental improvement in user interface was made with the introduction of centralized control panels. In these improved systems, individual instruments were wired to a control panel and the individual knobs, indicators or switches of each front panel were either preset or were selected to be presented on a common front panel.

Another significant advance occurred with the introduction of computers to provide more flexible means for interfacing instruments with a user. In such computerized instrumentation systems the user interacted with a software program of the computer system through a terminal rather than through a manually operated front panel. These earlier improved instrumentation systems provided significant performance efficiencies over earlier systems for linking and controlling test instruments.

Additional problems soon developed, however. Computer programs used to control such improved instrumentation systems had to be written in conventional programming language such as, for example, machine code, FORTRAN, BASIC, Pascal, or ATLAS. Traditional users of instrumentation systems, however, often were not highly trained in programming techniques and, therefore, implementation of such systems frequently required the involvement of a programmer to write software for control and analysis of instrumention data. Thus, development and maintenance of the software elements in these instrumentation systems often proved to be difficult.

Some reasons for the difficulties associated with earlier computerized instrumentation systems included, for example: (1) textual programming languages were non-intuitive and unfamiliar to the instrumentation system user; (2) traditional programming languages did not readily support the parallel activity of multiple individual instruments; (3) concepts embodied in a computer program often were significantly different from concepts embodied in an instrumentation system's instrument hardware; (4) computer program software modules often did not match an instrumentation system's hardware modularity making interchangeability of software and hardware difficult; and (5) techniques for designing, constructing, and modifying computer software were significantly different from corresponding techniques for developing an instrument hardware system.

A general type of programming technique involves data flow programming. Data flow programming typically involves an ordering of operations which is not specifically specified by a user but which is implied by data interdependencies. An advantage of data flow programming is that it introduces parallelism into a computer system which, of course, usually increases the speed and efficiency of the system.

Unfortunately, there has been difficulty constructing data flow computer systems because such systems often experience difficulty implementing conditional type and loop type operations. Furthermore, data flow computer systems often are relatively difficult to construct or even to comprehend due to the their relative complexity.

Thus, there exists a need for a system which can be relatively easily programmed for use in modelling a process. Furthermore, there exists a need for an instrumentation system utilizing such a system. Finally, there exists a need for such a system which employs data flow techniques. The present invention meets these needs.

SUMMARY OF THE INVENTION

The present invention provides a system for modelling a process. A process typically can be characterized by one or more input variables and one or more output variables. The system includes a computer. It also includes an editor for displaying at least one diagram and for constructing execution instructions. The diagram graphically displays a procedure by which the one or more input variables can produce the one or more output variables. It also results in the construction of execution instructions which characterize an execution procedure which substantially corresponds to the displayed procedure. The system also includes an execution subsystem for assigning respective values for the one or more input variables and for executing the execution instructions to produce respective values for the one or more output variables.

The invention also provides a method for electronically modelling a process. A process typically can be characterized by a reception of one or more input variables and a provision of one or more output variables. The method includes the step of electronically constructing at least one diagram display such that the diagram display graphically displays a procedure by which the one or more input variables can produce the one or more output variables. In response to the step of electronically constructing the diagram display, execution instructions are electronically constructed which characterize an execution procedure which substantially corresponds to the displayed procedure. Respective values are assigned for the respective input variables. The execution instructions are electronically executed to produce respective values for respective output variables.

These and other features and advantages of the present invention will become more apparent from the following detailed description of exemplary embodiments thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which:

FIG. 1 shows a block diagram of a first system for modelling a process in accordance with the present invention;

FIG. 2 shows a block diagram of a second system including the first system of FIG. 1;

FIG. 3 is an illustrative drawing of a representation of a virtual instrument produced using the second system of FIG. 2;

FIG. 5 shows an illustrative front panel produced using the front panel editor of the instrumentation system of FIG. 4;

FIG. 6 shows an illustrative icon produced using the icon editor of the instrumentation system of FIG. 4; .

FIG. 7 shows an illustrative representation of an icon library which can be stored in a memory and used to construct a block diagram using the block diagram editor of the instrumentation system of FIG. 4;

FIG. 16 shows an illustrative block diagram generally corresponding to the graphical representation of an indefinite loop structure shown in FIG. 11;

FIG. 17 shows an illustrative block diagram generally corresponding to the graphical representation of an iterative loop structure including a shift register shown on the left in FIG. 12;

FIG. 18 shows a block diagram representing an exemplary data flow system;

FIG. 19a illustrates a virtual instrument data structure diagram used by the first system of FIG. 1, the second system of FIG. 2 and the instrumentation system of FIG. 4;

FIG. 19b shows a legend applicable to the illustration FIG. 19a;

FIGS. 20a-l illustrate computer terminal displays during each successive step in a construction of an exemplary block diagram using the block diagram editor of FIGS. 2 or 4;

FIG. 22 is a drawing representing a block diagram according to the present invention as displayed on a computer console to model the illustrative hardware system of FIG. 21;

FIG. 28 illustrates the NUMERIC control dialog box;

FIG. 29 is an illustration of the STRING control dialog box;

FIG. 30 shows the GRAPHICAL dialog box;

FIG. 33 illustrates FUNCTION menu from Block-Diagram window;

FIG. 34 shows a graphical representation of a sequence structure;

FIG. 35 shows a graphical representation of a for loop structure;

FIG. 36 shows a graphical representation of a case selection structure;

FIG. 40 illustrates a "for" loop structure layed down in the active block diagram window by selecting a glyph from the dialog box shown in FIG. 39;

FIG. 41 illustrates selection regions on structure glyphs (Moving dashded box encircles a glyph when it is selected);

FIG. 42 illustrates that the the left side shows the proper position for placement of the grabber tool for residing the structure glyph (Click-dragging produces the result shown in the right side of the figure. Release the mouse button and the enlarged structure will remain in place);

FIG. 45, shows a block diagram window after addition function was chosen from dialog box show in FIG. 44;

FIG. 46 shows a block diagram window with addition and multiplication functions placed inside loop structures;

FIG. 47 shows a dialog box obtained by choosing CURVE FIT from the FUNCTIONS menu.

FIG. 48 shows a block diagram window with CURVE-FIT object in place;

FIG. 49 illustrates loop structure with shift register installed;

FIG. 50 is an illustration of the final positions of constant objects alongside the inputs to the shift register;

FIG. 51 shows a pointer control in the front panel window obtained from the dialog box displayed by choosing the NUMERIC option from the CONTROLS menu;

FIG. 52 shows the front panel window with one pointer control and two indicator controls;

FIG. 56 illustrates "hot spots" for available functions;

FIG. 57 is an illustration of the wired Fibonacci virtual instrument block diagram;

FIG. 58 is an illustration of examples of data types and their block diagrams representations;

FIG. 59 is an illustration of the ICON EDITOR dialog box obtained by selecting the ICON EDIT PANE option from the FORMAT menu in the front panel window;

FIG. 60 is an illustration of the icon editor following selection of the ICON button;

FIG. 63 shows a terminal connector pane displayed in the upper left-had corner of the active window by choosing CONNECTOR PANE option from the FORMAT menu;

FIG. 64 is an illustration of available arrangements of connector terminals;

FIG. 65a is an illustration of the front panel window with selected terminal in connector pane;

FIG. 65b is an illustration of the highlighted terminal and control to be connected;

FIG. 65c is an illustration of the connection between the established terminal and control;

FIG. 66 is an illustration of the dialog box warning of consequences of clearing associations between controls and terminals;

FIG. 67 (left) is an illustration of the virtual instrument to invert value set by control and display result on indicator;

FIG. 68 (right) is an illustration of correctly operating inverter virtual instrument;

FIG. 69 is an illustration of an icon for the inverter instrument;

FIG. 70 is an illustration of an instrument for inverting and then adding two numbers;

FIG. 74 is an example solution for adding two resistances in parallel using two low-level, user-created virtual instruments in a hierarchical virtual instrument;

FIG. 75 is an illustration of an dialog box from INSTRUMENTS option in the FUNCTIONS menu displaying two user-created virtual instruments;

FIG. 104 illustrates a chart showing different data types;

FIG. 105 illustrates a virtual instrument icon in a diagram;

FIG. 106 illustrates a virtual instrument icon together with a data base structure.

DESCRIPTION OF THE PREFERRED EMBODIMENTS

Figure 4:
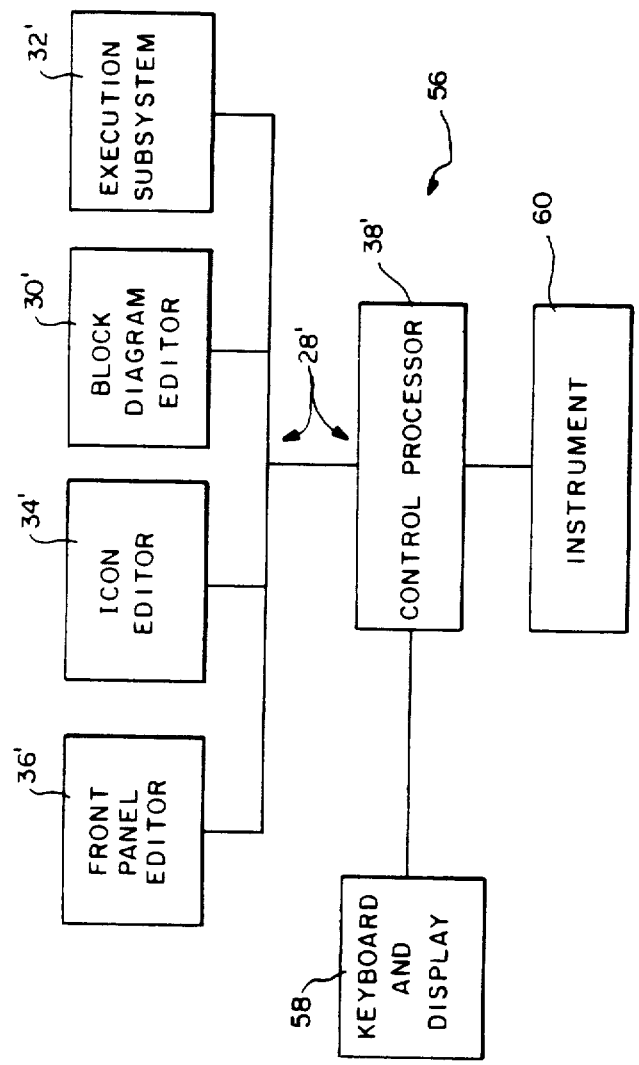
FIG. 4 shows a block diagram of an instrumentation system including the second system of FIG. 2.

The present invention comprises a novel system and associated method for modelling a process. The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Referring to the drawing of FIG. 1, there is shown a generalized block diagram 20 of a first system for modelling a process in accordance with the present invention. The first system 20 includes a block diagram editor 22, an execution subsystem 24 and a control processor 26. In the preferred embodiment, the block diagram editor 22 and the execution subsystem 24 are constructed in software.

As will be explained more fully below the block diagram editor 22 can be used to construct and to display a graphical diagram which visually and pictorially displays a procedure by which an input variable can produce an output variable. The procedure together with the input variable and output variable comprise a model of a process. Furthermore, the block diagram editor 22 constructs execution instructions which characterize an execution procedure which substantially corresponds to the displayed procedure. The execution subsystem 24 assigns at least one value to the input variable and executes the execution instructions to produce a value for the output variable. The control processor 26 implements the block diagram editor 22 and the execution subsystem 24 of the preferred embodiment.

The illustrative drawing of FIG. 2 shows a second system 28 for modelling a process in accordance with the present invention. The second system 28 includes a respective block diagram editor 30, and an execution subsystem 32 which are substantially identical to the block diagram editor 22 and the execution subsystem 24 of the first system 20. The second system 28 also includes an icon editor 34 and a front panel editor 36. The second system 28 also includes a control processor 38 which is substantially identical to that of the first system 20.

The second system 28 permits a user to construct a virtual instrument 40 such as that represented in generalized form in the illustrative drawings of FIG. 3. The virtual instrument 40 includes a front panel 42 which permits interactive use of the virtual instrument 40 by a user. As will be explained more fully below, the front panel permits graphical representation of input and output variables provided to the virtual instrument 40. The virtual instrument 40 also includes an icon 44 which permits use of the virtual instrument 40 as a subunit in other virtual instruments (not shown). The virtual instrument 40 also includes a block diagram 46 which graphically provides a visual representation of a procedure by which a specified value for an input variable displayed in the front panel 42 can produce a corresponding value for an output variable in the front panel 42. The virtual instrument 40 itself is a hierarchical construction comprising within its block diagram 46 respective icons 48 and 50 referencing other virtual instruments indicated generally by respective blocks 52 and 54.

The generalized block diagram of FIG. 4 shows an instrumentation system 56 incorporating the second system 28 shown in FIG. 2. Elements of the instrumentation system 56 which are substantially identical to those of the second system 28 are referenced by primed reference numerals identical to those of the second system 28. The instrumentation system 56 includes a keyboard and display 58 and an instrument 60. In a presently preferred embodiment, the control processor 38' and the keyboard and display 58 are implemented using a Macintosh Plus Computer manufactured by the Apple Computer Company of Cuppertino, Calif. However, a Macintosh Computer also produced by the Apple Computer Company could be used instead.

The instrumentation system 56 can be used to control the instrument 60, to acquire data from the instrument 60 to analyze that data, to store that data and to present that data. FIG. 5 shows details of an illustrative front panel 62 which can be produced using the front panel editor 36' and which can be displayed using the keyboard and display 58. It will be appreciated that the illustration of FIG. 5 represents an actual graphical computer-generated display of an exemplary front panel for the instrument 60. The graphical representation of FIG. 5 illustrates physical control dials and switches for providing variable input information and illustrates a coordinate plane type indicator for displaying variable output information. More particularly, FIG. 5 shows a circular turn-dial and a slide switch for setting input variable data. The turn-dial and slide switch each correspond to respective rectangular boxes for digitally illustrating variable input data in digital form. The illustrative front panel also includes a coordinate plane display for illustrating variable output data. The graphical representations of input controls and output indicators are stored in a memory library, and a user may select from among a variety of different graphical representations of input controls and output indicators in order to construct a panel display which conforms to a user's intuitive understanding of how the instrument 60 is controlled and how it provides data.

FIG. 6 illustrates an icon 62 which can be used to reference a front panel 64. A visual representation of the icon 62 can be produced using the icon editor 34'. The icon 62 corresponds to a particular front panel 64. As will be explained more fully below, the icon 62 can be used as a building-block in a hierarchical system constructed using the block diagram editor 30'. The dashed lines of FIG. 6 indicate the one-to-one correspondence between the icon 62 and the particular front panel 64. The icon 62 can be divided into respective two-dimensional regions (or hot spots) 66 and 68 which correspond to respective variable input data and variable output data illustrated by controls and displays of the corresponding front panel 64. For example, the front panel might include input data in the form a sequence of samples and might provide output data in the form of an indicator showing voltage reading per sample. The icon 62 then might be divided into two two-dimensional regions 68 and 66 which respectively correspond to the input sample count and the voltage reading for that sample count.

FIG. 7 illustrates a memory library including a plurality of software modules each representing a respective front panel and each corresponding to a respective illustrative icon which references its respective front panel. As will be explained more fully below, a user may utilize the icons of the memory library to build a block diagram; or he/she may build his/her own respective front panels and corresponding icons using the front panel editor 36' or the icon editor 34' in order to build a block diagram; or he/she may use both the icons of the icon memory library and icons which he/she produces himself/herself using the front panel editor 36' and icon editor 34' in order to build a block diagram.

Figure 8:
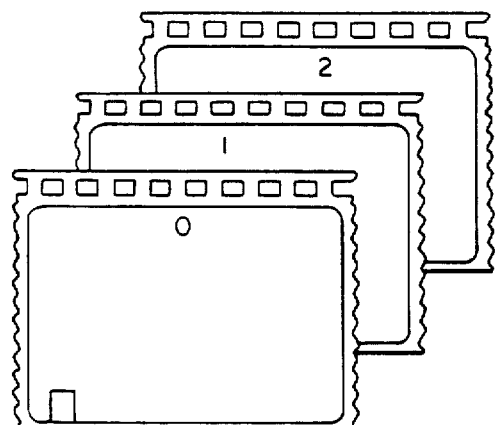
FIG. 8 shows a graphical representation of a sequence structure.
Figure 10:
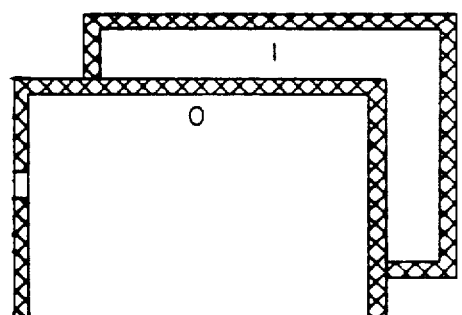
FIG. 10 shows a graphical representation of a conditional structure.
Figure 9:
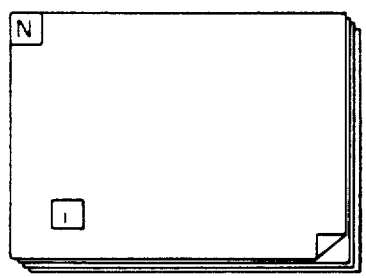
FIG. 9 shows a graphical representation of an iterative loop structure.
Figure 11:
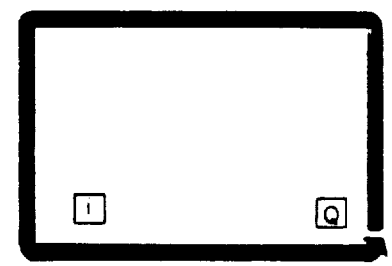
FIG. 11 shows a graphical representation of an indefinite loop structure.
Figure 12:
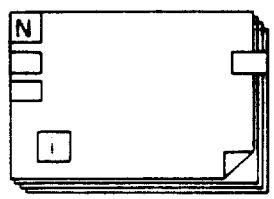
FIG. 12 shows graphical representations of shift registers on the respective iterative loop structure of FIG. 9 and indefinite loop structure of FIG. 11.

The drawings of FIGS. 8–12 show the graphical representations of structures utilized in constructing a block diagram as described below using the block diagram editor 30'. The structures represented in FIGS. 8–12 substantially facilitate the application of data flow programming techniques which are used in the preferred embodiments of the present invention. FIG. 8 illustrates a sequence structure. FIG. 9 illustrates an iterative loop structure. FIG. 10 illustrates a conditional structure. FIG. 11 illustrates an indefinite loop structure. FIG. 12 illustrates a shift register on an iterative loop structure (on the left side) and a shift register on an indefinite loop structure (on the right side).

It will be appreciated that the graphical representations of the structures illustrated in FIGS. 8–12 can be stored in a memory library as can execution instructions corresponding to the respective structures. Thus, a user can call upon a graphical structure library in order to display any one or more of the structures using the display facilities of the control processor 38' and keyboard and display 58 of the instrumentation system of FIG. 4.

The sequence structure, which has its graphical representation illustrated in FIG. 8, serves to divide a data-flow diagram into two subdiagrams, one representing an inside and another representing an outside of the sequence structure borders. The outside diagram behaves exactly as if the sequence structure and its contents were replaced by an icon with a terminal (or hot spot) for each line crossing the sequence structure border. The drawing of FIG. 8 shows a three-diagram sequence. In order to minimize space used on a computer console screen, only one diagram of the sequence structure is available at a time. Inside the structure border, are multiple diagrams which execute in sequence. The sequence of diagrams are indicated by the respective numbers in the respective sequence diagrams. When the first diagram (indicated by the number 0) in this sequence completes its execution, the next one begins. The process is repeated until all diagrams in the sequence have been executed.

Each diagram in the sequence uses a subset of incoming signal paths and produces a subset of outgoing signal paths (the outgoing subsets must be mutually exclusive, but the incoming subsets are arbitrary). Constants may be used with any of the diagrams without any constraints. Variables used within a diagram are strictly local to the sequence structure and may be assigned only once. Variables can be used multiple times in the diagrams following the diagram where the variable was assigned.

In accordance with data-flow principles, used in the preferred embodiments of the present invention, the sequence structure does not begin execution until all incoming signal paths have data available, and none of the outgoing signal paths produce data until all diagrams have completed execution.

Figure 13:
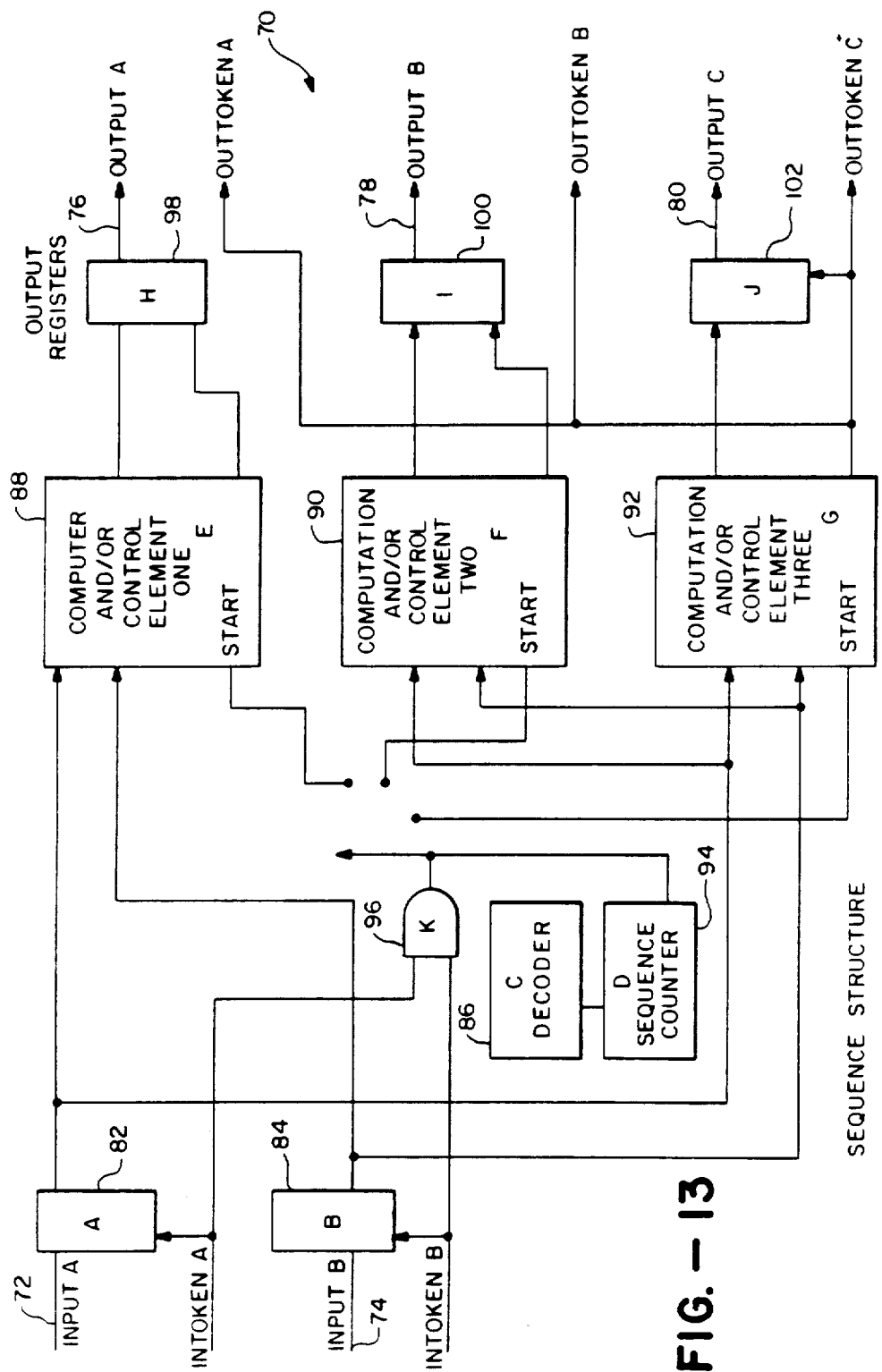
FIG. 13 shows an illustrative block diagram generally corresponding to the graphical representation of a sequence structure shown in FIG. 8.

FIG. 13 shows an illustrative block diagram 70 of a sequence structure. The sequence structure is coupled to receive input signals on respective lines 72 and 74 and to provide respective output signals on respective lines 76, 78 and 80. Input registers 82 and 84 are provided to collect input data. A decoder 86 is provided to determine which computation and/or control element 88, 90, or 92 to select, and a sequence counter 94 is included to undertake a count for sequencing between respective elements 88, 90 and 92. When all data inputs are present, an output of AND gate 96 becomes TRUE. This starts computation in computation and/or control element 88 (assuming that it is the first element selected). When the control element 88 has completed computation, its output is stored in register 98. When the first element 88 has completed computation, the sequence counter 94 is free to advance by one. The decoder 86 will select the second computation element 90. As soon as inputs are available for the second computation element 90, the output of AND gate 96 will become TRUE again and, computation will begin in the second element 90. The output of the second element 90 will be stored in output register 100. The sequence repeats for the third element 92, and its output is stored in output register 102. After the completion of the computation by the third element 92, the output data from all computations will be available for further computation by other instruments (not shown) of a block diagram system as will be explained more fully below.

The iterative loop structure, a graphical representation of which is shown in FIG. 9, is similar to the sequence structure in that the iterative loop structure partitions the data-flow graph into two parts. The interior diagram contains the body of the loop. Signal paths crossing the border of an iteration loop structure typically have a transformation applied. Incoming data are indexed in the most significant dimensions so that the data inside the structure have dimensionality one less than outside. Outgoing data has the inverse transformation performed.

All signal paths crossing the border must have the same size for the indexed dimension. It is possible to disable the indexing on a signal path, in which case, the data behaves as if it were a constant available to each iteration. If indexing is disabled on an outgoing signal path, the data value is repeatedly overwritten and only the last sequence progates out from the iteration structure.

There are two special variables which behave as constants within the body of the iterative loop structure: the number of iterations, N, and the iteration number or index, i. Usually, the number of iterations to be executed is automatically set by the size of the dimension being indexed for an incoming signal path. In the event that there are no incoming signal paths, a scaler value must be specifically connected to the variable to specify the number of iterations. The iteration number is similar to a constant within the diagram except that its value is 0 for the first iteration and increments by 1 at the end of each iteration.

Iterations are independent and can, in principle, be executed in any order or completely in parallel except in the case where a non-reentrant virtual instrument is used. In that case, the iterations would be executed strictly sequentially. In accordance with data flow principles, all inputs must be available to start execution of an iteration loop. Furthermore, all outputs are generated after execution completes.

Figure 14:
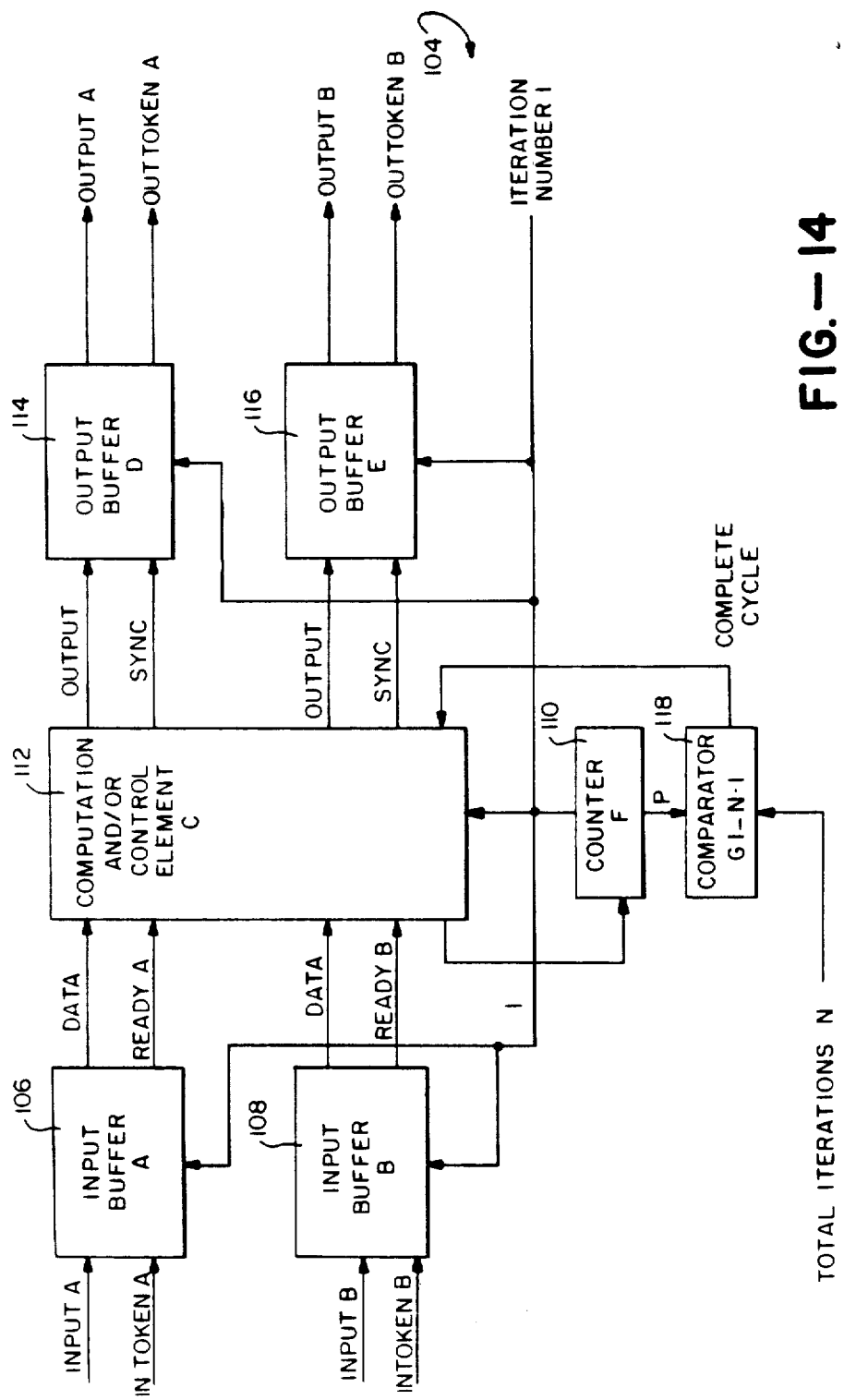
FIG. 14 shows an illustrative block diagram generally corresponding to the graphical representation of an iterative loop structure show in FIG. 9.

Referring to the illustrative drawings of FIG. 14, there is shown a block diagram 104 for an iterative loop. An iterative loop structure operates on data in an array one element at a time. The data for each element are sequentially stored in respective input buffers 106 and 108. A counter 110 begins its count at 0. When the first data elements are available for both inputs of both respective input buffers 106 and 108, computation and/or control element 112 will generate outputs to be stored in respective output buffers 114 and 116. At that time, the counter 110 will advance to 1, and the process will repeat for the second data element in the array. This process will repeat until the counter 110 reaches N-1 making a total of N computations. At that time a complete cycle signal will be generated by the comparator 118. The output signals stored in the respective output buffers 114 and 116 then will be available for use by other computation instruments (not shown).

The conditional structure, a graphical representation of which is shown in FIG. 10, is similar in appearance to the sequence structure in its use of screen space, but it differs in its handling of signal paths crossing its border in that in each case a diagram may use any subset of incoming signal paths, but must produce all outgoing signal paths. In accordance with data-flow principles, all inputs must be available in order to start execution. Furthermore, all outputs are generated after execution is completed.

There must be a signal path that terminates at the case-selection terminal on the structure border. In the simplest case, a boolean-valued scaler is connected to the selector to select between case 0 (FALSE) and case 1 (TRUE). In the general case, a scaler number is connected to the selector. A special diagram (default case) may be specified to be used in the event that the selector does not lie in the range of specified cases.

Figure 15:
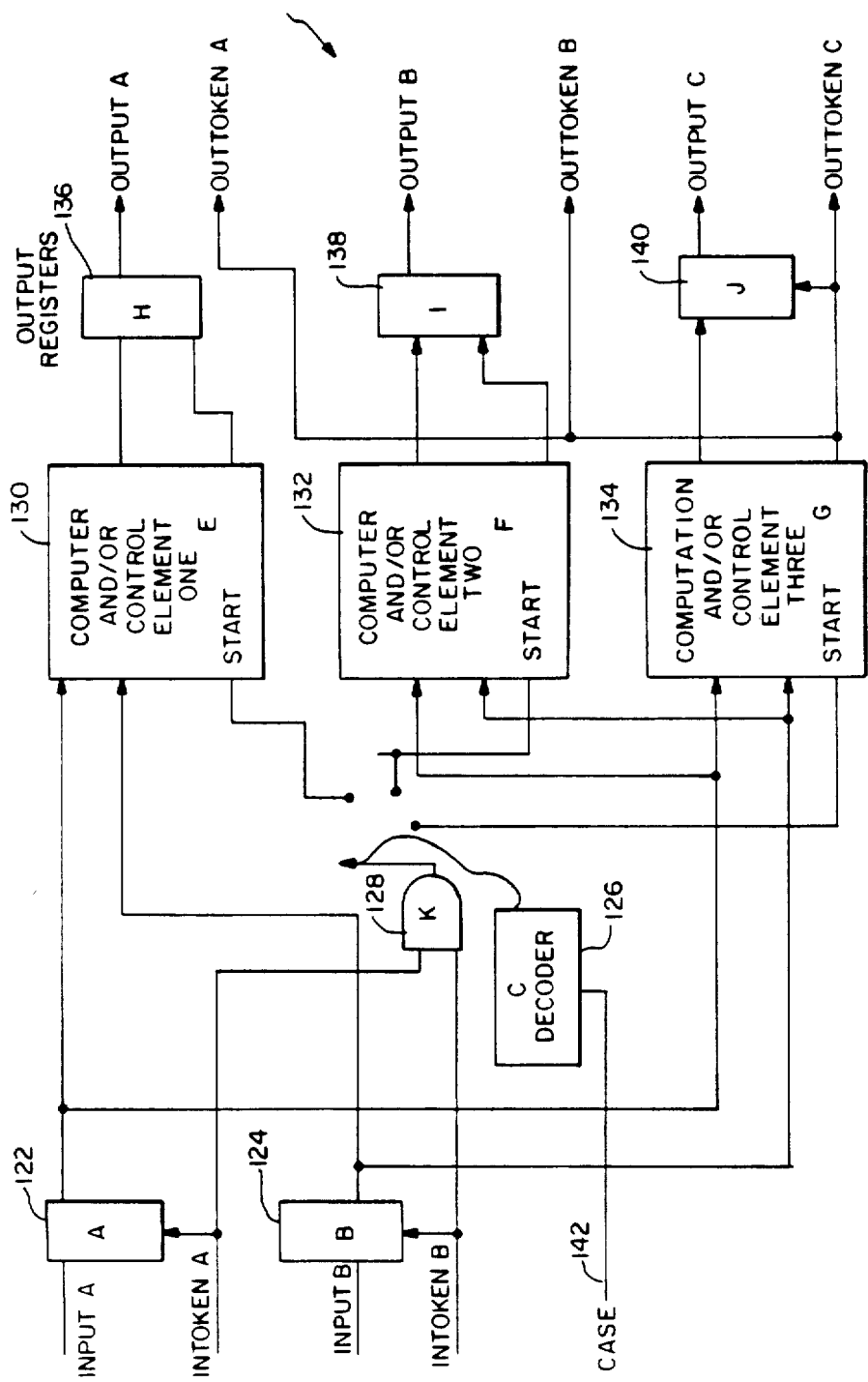
FIG. 15 shows an illustrative block diagram generally corresponding to the graphical representation of a conditional structure shown in FIG. 10.

The drawings of FIG. 15 illustrate a block diagram 120 corresponding to a conditional structure. The block diagram 120 for the conditional structure is substantially similar to that of the block diagram 70 for the sequence structure. The block diagram 120 for the conditional structure includes respective input registers 122 and 124, a decoder 126, an AND gate 128, three respective computer and/or control elements 130, 132 and 134 and three respective output registers 136, 138, and 140 all coupled as shown in the drawings of FIG. 15. In operation, the conditional structure block diagram 120 operates in a manner substantially similar to that of the sequence structure block diagram 70, except that the decoder 126 of block diagram 120 is directly controlled by the case selection input provided on line 142.

The indefinite loop structure, a graphical representation of which is shown in FIG. 11, is similar in concept to the iterative loop structure in that the interior of the structure diagram represents the body of the loop, but it differs in that signal paths crossing the border of the indefinite loop structure do not usually have an indexing transformation applied.

There are two special variables applied within the body of the indefinite loop structure: iteration number or index, i, and recirculation flag, Q. The iteration number starts at zero and increments by one at the end of each iteration. A boolean value or expression is connected to the circulation flag. A value of TRUE means that another iteration will be performed. If the recirculation flag is left unconnected, it is equivalent to connecting a TRUE constant. In accordance with data-flow principles applied in the preferred embodiments, all inputs must be available in order to start execution. Furthermore, outputs are generated after execution is complete.

The illustrative drawings of FIG. 16 shows a block diagram 144 which corresponds to the graphical representation of an indefinite loop structure shown in FIG. 11. In operation, when data inputs are available on both respective input registers 146 and 148, an output of AND gate 150 will become TRUE to enable computation and/or control element 152. After computation is complete, output data are stored in respective output registers 154 and 156. After completion of the first loop, counter 158 increments, and the cycle begins again. This process continues until a recirculation flag provided on line 160 goes FALSE. The output data are present after each cycle.

A special construction available for use only within the respective loop structures is the shift register. A graphical representation of each respective loop structure type incorporating a shift register is show in FIG. 12. The shift register eliminates the need for cycles in a data-flow graph making the result easier to comprehend and to prove correct. The shift register behaves as if it were an ordered set of two or more variables, all of the same type and dimensionality.

The first variable in a set is an output of the loop-body diagram and is located on the right border of the loop structure. The other variables of the set are inputs to the loop-body diagram and are located on the left border of the structure at the same elevation.

At the conclusion of each loop iteration, the data from the shift register output variable are shifted into the first input variable, and the previous value of the first input variable is shifted into the second input variable.

The drawing of FIG. 17 shows an illustrative block diagram 162 illustrating operation of an iterative loop structure including a shift register. Respective latches 164 and 166 are provided to implement the shift register. In operation, the block diagram 162 of FIG. 17

(which represents an iterative loop structure with a shift register) operates similarly to the block diagram 104 of FIG. 14 (which represents an iterative loop structure minus a shift register) except that computation inputs are provided which give the system feedback from a previous cycle.

An output provided by loop counter 168 is sensed by the comparator 170. For the first loop, the multiplexer control 172 selects preselect inputs from respective preset gates 174 and 176. For all other cycles, respective latches 164 and 166 are selected. The selected input is fed into the computation and/or control element 178. Data from input buffer 180 also is fed into the computation element 178. After each cycle, the computed output data are fed into respective output buffers 182 and 184. When the comparator 170 reaches N-1, the process is completed, and the output data can be passed to a next instrument (not shown).

The following discussion regarding data flow principles and a virtual instrument data structure diagram will assist in understanding the operation of the respective block diagram editors 22, 30 and 30' and the respective execution subsystems 24, 32 and 32' of the respective first system 20, second system 28 and the instrumentation system 56.

Referring now to the illustrative drawings of FIG. 18, there is shown a block diagram 186 of an exemplary data flow system. The block diagram 186 includes three respective input registers 188, 190 and 192 which provide an accumulation of input data. As soon as all input data are present, an output of AND gate 194 will become TRUE, and computation and/or control element 196 will begin computation. The computation element 196 will begin generating output data which are stored in respective output registers 198, 200 and 202. When all output data are available, an output token will be generated by the computation element 196 indicating that output data are available for transmission to a next system (not shown). It will be appreciated that the computation element can be a combination of more than one subsystem (not shown).

FIG. 19a illustrates a virtual instrument data structured diagram. The first system 20 of FIG. 1, the second system 28 of FIG. 2, and the instrumentation system 56 of FIG. 4 each utilize the principles set forth in the data structure diagram of FIG. 19a. It will be appreciated that implementation of a system utilizing a data structure such as that diagrammed in the diagram of FIG. 19a advantageously permits the implementation of a data flow system like that illustrated in FIG. 18.

Furthermore, it will be appreciated that implementation of the data structure like that of the diagram of FIG. 19a advantageously permits the implementation of a system in which execution instructions can be constructed in a graphical fashion. More particularly, execution instructions can be constructed by constructing a visual display in which at least one input variable produces at least output variable according to a displayed procedure. Furthermore, the execution instructions are constructed such that, when a value is assigned to a particular input variable, a value for a corresponding output variable is produced substantially according to the procedure illustrated in the visual display. Additionally, the execution instructions can be constructed in response to the construction of a block diagram comprising the graphical display. Thus, a user need only construct an appropriate visual display in order to construct the execution instructions.

Moreover, implementation of data flow principles by using a data structure such as that shown in the diagram of FIG. 19a advantageously permit the use of parallel processing which increases the speed with which the execution of execution instructions can be accomplished.

More particularly, FIG. 19a shows a system representation of a virtual instrument. Boxes $8a$–$8k$, indicate conceptual objects in the system that have well-defined properties. Objects $8i$, $8j$ and $8k$ are grouped into shaded box $8s$ and share some properties and form a class of objects.

As indicated in FIG. 19b which represents a legend applicable to the illustration of FIG. 19a, a solid line with an arrow is used to indicate a potential one-to-many relationship, i.e., the source object contains zero or more destination objects (e.g., a vehicle containing zero or more wheels). A wiggly line with an arrow is used to indicate a potential one-to-many relationship, i.e., the source object may reference zero or one destination object (e.g., a library book may or may not have a borrower).

Line $8n$ indicates that a virtual instrument $8b$ contains a front panel with a multiplicity of controls $8c$. A control may be of clustered type in which case it contains a multiplicity of subcontrols as indicated by line $8p$. Line $8q$ indicates that a virtual instrument contains an icon with a multiplicity of terminals $8d$. Line $8l$ indicates that virtual instrument also contains a multiplicity of block diagrams $8e$.

In the system of the present invention, a virtual instrument either contains one diagram or none. Built-in virtual instruments representing primitive computations have no diagrams. Line $8r$ indicates that a block diagram contains a multiplicity of objects of the node class. A block diagram contains exactly one self reference node $8i$, and an arbitrary number of structure nodes $8j$ or instrument use nodes $8k$. Line $8t$ indicates that a structure node contains a multiplicity of subdiagrams.

A sequence structure or a conditional structure contains one or more sub-diagrams, and an iterative loop structure or indefinite loop structure contains exactly one diagram. Line $8m$ indicates that an instrument use node is used to reference another virtual instrument. The instrument use node may reference a virtual instrument in real-time; or it may reference previous data acquired by the virtual instrument. Line $8u$ indicates that each object of the node class contains a multiplicity of terminals $8g$. Line $8v$ indicates that a block diagram also contains a multiplicity of signal paths $8f$. Each signal path contains a multiplicity of terminals as indicated by line $8w$. There is at most one terminal per signal path that is designated as the source of the signal. Each terminal contained in a signal path also is contained in a node. However, there may be terminals in nodes which are not in signal paths. The terminals in a signal path are typically in different nodes. Lines $8y$ and $8z$ indicate that each terminal may reference a front panel control or a block diagram control (e.g., a constant). A terminal references exactly one control, and it is either on the front panel or on the block diagram.

FIGS. 20a–l illustrate computer screen displays during each successive step in a construction of an exemplary block diagram using a block diagram editor such as that of FIGS. 2 or 4. (It should be appreciated that the block diagram editor of FIG. 1 operates in a similar fashion; except that it does not include an icon editor or a front panel editor for user-constructed front panel).

More particularly, in FIG. 20a, a control knob is placed in the front panel, and its associated terminal automatically appears in the block diagram. The system representation shows the virtual instrument with a diagram containing a self reference node, and a terminal in the self reference node which references the front panel control.

In FIG. 20b, a control graph indicator type is placed in the front panel, and its associated terminal automatically appears in the block diagram in the same position relative to the other terminal as the graph is to the knob. This makes it possible to distinguish the terminal even without supplementing the graphics with text labels.

In FIG. 20c, a constant with value 20 is placed in the block diagram, and is reflected in the system representation by another terminal and control attached to the self reference node.

In FIG. 20d, an icon referring to a built-in virtual instrument is placed in the block diagram. (An alternative view of the block diagram could show the icon terminals instead of the icon itself). The system representation shows another node of instrument use type in the virtual instrument diagram and three terminals and controls corresponding to the terminals and controls the referenced virtual instrument.

Figure 20I:
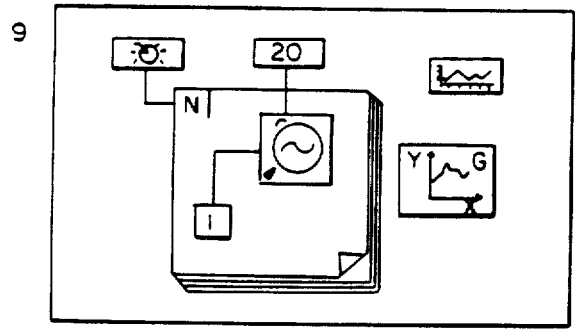
Figure 20J:
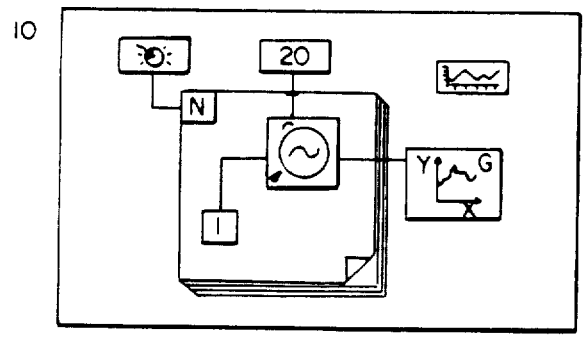
Figure 20K:
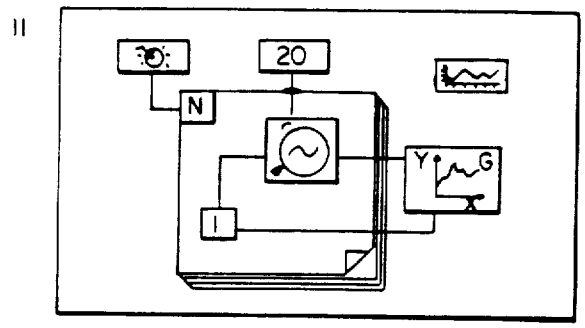
Figure 20L:
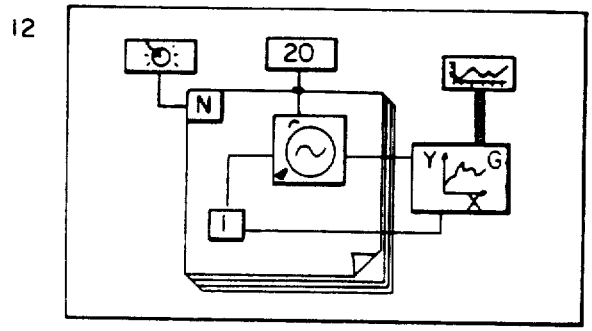
Figure 20E:
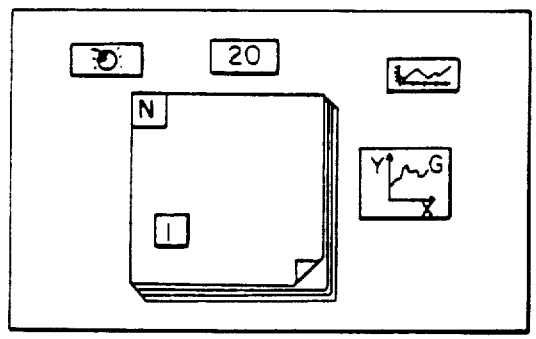

In FIG. 20e, an iterative loop structure is placed in the block diagram. The system representation shows the structure node in the diagram along with terminals and controls for the loop variables. Note that the iteration number is accessible only from within the loop; while the iteration limit is available inside and outside the loop as evidenced by the two terminals which reference it, one in the structure node and the other in the self-reference node of the diagram within the structure node.

Figure 20F:
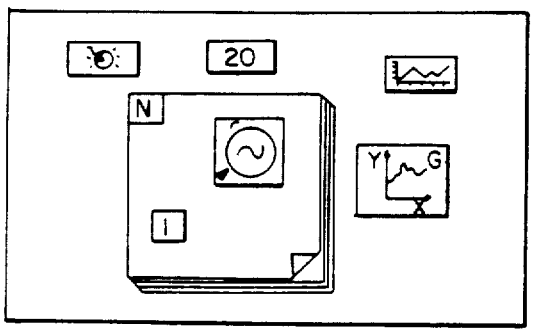

In FIG. 20f, an icon referencing another built-in virtual instrument is placed inside the iterative loop structure.

Figure 20G:
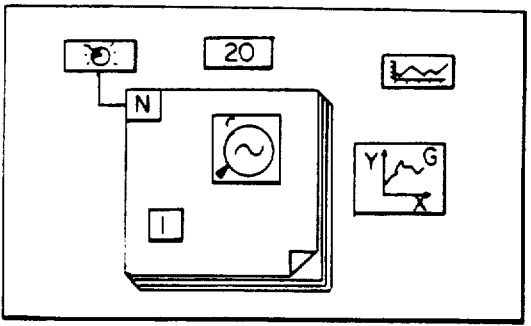

In FIG. 20g, a wire is connected from the terminal associated with the front panel knob to the loop limit terminal of the loop structure. The front panel knob terminal is determined to be the signal source.

Figure 20H:
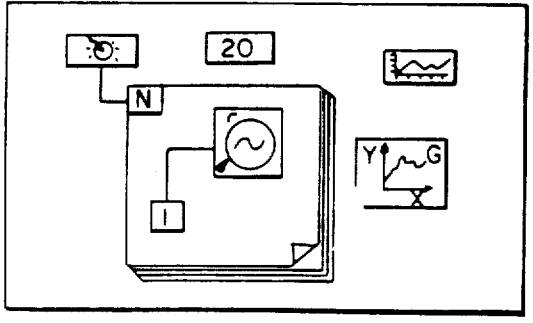

In FIG. 20h, a wire is connected from the iteration number terminal to a terminal on the virtual instrument inside the loop. This signal path lies completely within the loop structure subdiagram. The system representation shows the signal path with the iteration number terminal and the terminal on the instrument use node. The iteration number terminal is determined to be the signal source.

In FIG. 20i, the constant is wired to a terminal of the virtual instrument within the loop. In this case, the wire crosses the structure border so that a pair of terminals and a control are created, and the wire is split into two signal paths, one outside the loop structure and one inside. The constant is determined to be the source terminal of the outside signal, and the inside terminal at the border is determined to be the source of the inside signal.

In FIG. 20j, a wire is drawn from the virtual instrument inside the loop to the virtual instrument outside the loop. This wire crosses the border so it is split into two signal paths. The wire on the outside is thicker because it represents an array signal path (as will be explained more fully below).

In FIG. 20k, the iteration number terminal is connected to a terminal on the outside virtual instrument. The wire crosses the border so that it is split into two signal paths. The inside signal path is joined to the existing signal path originating at the iteration number terminal.

In FIG. 20l, the output of the virtual instrument outside the loop is connected to the terminal associated with the front panel graph. The wire pattern indicates that it represents a cluster signal path (as will be explained more fully below).

The following description describes the operation of the execution subsystems 24, 32 and 32' of the respective first system 20, second system 28 and the instrumentation system 56.

The first step in the execution of a virtual instrument is accomplished by executing its block diagram. The first step in the execution of a block diagram is accomplished by scanning the terminals contained in the diagram's self-reference node. For each terminal which is the source of a signal, the data token is moved from the control reference by the terminal to the terminal itself. The second step in the execution of a diagram is to initialize the token short-count of each node in the diagram to the number of input signals to that node. The third step in the execution of a diagram is to propagate signals from the self-reference node. Propagation of signals from a node is accomplished by scanning all of the node's terminals for each. Terminal that is source of a signal the data token on the terminal is copied to each destination terminal of the signal path. Each token placed on a destination terminal causes the short-count of the node containing the terminal to be decremented. If it becomes zero in the process, then that node is scheduled to execute.

The first step in the execution of a node is accomplished by copying the tokens from the node's terminals to the reference controls. The second step depends upon the type of node. For an instrument use node that references a real-time virtual instrument, the next execution step is to copy the tokens from the node's controls to the virtual instrument's controls and to execute the virtual instrument. For an instrument use node that references previous stored data of a virtual instrument, the tokens from the appropriate data record are read in and placed on the node's terminals. For a sequence structure node, the next step is to execute the first subdiagram. For a conditional structure node, the next step is to execute the subdiagram indicated by the value of the token on the selected control. For an iterative or indefinite loop structure node, the next step is to set the value of the token on the iteration number control to zero and to execute the subdiagram. For a self-reference node, the next step is to perform the next step in the execution of the node or the virtual instrument which contains the diagram that contains the self-reference node.

The third step in the execution of a node also depends upon the type of node. For an instrument use node or a conditional structure node the output data tokens are propagated along the signal paths. For a sequence structure node, the next subdiagram is executed, if one exists, and if not, the output tokens are propagated. For a loop structure node, the shift registers are clocked, the iteration numbers incremented, and the subdiagram is reexecuted, if appropriate; otherwise the output tokens are propagated.

The second step in the execution of the virtual instrument is to log the tokens on the front panel controls if data logging is enabled. The third step in the execution of the virtual instrument is to copy the tokens from the virtual instrument's indicators to the instrument use node's output terminals and to schedule the instrument use node to execute its next step. The third step of virtual instrument execution is performed only if the virtual instrument was executed in response to an instrument use node request. If the virtual instrument was executed interactively, there is no third step.

Figure 21:
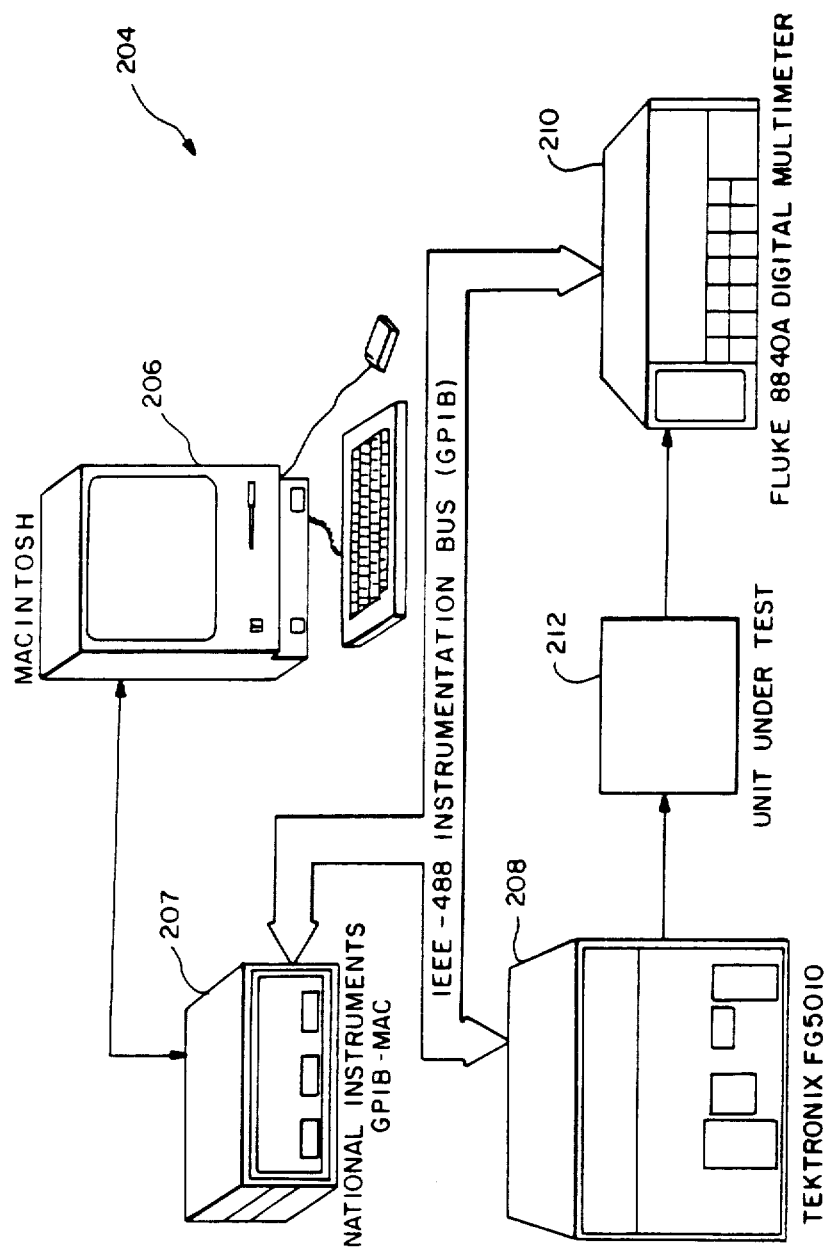
FIG. 21 is a drawing of an illustrative hardware instrumentation system of the present invention.

FIG. 21 shows an illustrative hardware configuration of an instrumentation system 204 according to the present invention. The system 204 includes a Macintosh computer 206 with an interface to a GPIB (general purpose instrument bus) 207, a Tektronix 5010 Function generator 208, a Fluke 8840A digital multimeter 210, and a unit under test 212 all coupled as shown. The traditional approach to automating this measurement would be to create a program in the computer language BASIC to interact with the test instruments 208 and 210 to collect, format, and display the measured values pertaining to the unit under test 212.

FIG. 22 shows a drawing of a computer-generated display of a completed block diagram for the design example of FIG. 21. This block diagram is the graphical program representing the instrument's operation. It shows the interconnections between the elements of the instrument, the signal paths, and the relationship to other virtual instruments. At the upper left of the diagram, four front panel input controls are shown connected to a "Ramp" icon. This icon is built-in function which takes input minimum and maximum values, number of steps, and a flag to indicate linear or log steps, and produces as output an array of sample points, in this case the frequencies of interest. The output is a bold one, which indicates that the data type is an array.

The large rectangular region in the center of the diagram is an iteration loop structure. The diagram placed inside this region will be executed multiple times: for i=0 to N-1. The inputs to the iteration loop are amplitude and the array of frequencies, shown on the left. The amplitude remains the same data type as it crosses the loop boundary. The array, however, as shown by the change in line type, is automatically indexed as it crosses the boundary to provide one array element per iteration. Since there is no connection to the loop-count (the N at the upper left corner), the length of the input array is used by default as the number of iterations.

Inside the iteration loop are two virtual instrument icons. The first takes as input an amplitude and a frequency and performs the appropriate IEEE-488 operations to set the function generator 208 of FIG. 21. The second performs the appropriate IEEE-488 operations to obtain a voltage measurement from the multimeter 210 of FIG. 21. The dotted line indicates that there is no data flow, but ensures that they execute sequentially. These two icons represent simple virtual instruments that are easily designed using built-in high level IEEE-488 functions to communicate with the multimeter 210.

Each iteration of the iteration loop produces one voltage measurement. This results in an array of values, as shown by the line change as it exits the loop at the right. The graph function takes this array and the array of frequencies as input and produces as output the data structure for the front panel graph indicator. Note the self-documenting effect of the graphical language, with the iteration loop structure contributing to the readability of the program.

With the front panel and block diagram complete, the instrument is ready to be used. The instrument is operated from the front panel. To execute the instrument, the user simply configures the input controls and "clicks" the GO button on the top of the screen (as will be appreciated from the description below).

Operation of the Preferred Embodiments

The presently preferred embodiments of the invention are implemented in software. A copy of a program listing for the presently preferred embodiments is filed as Appendix A to this patent application and is incorporated herein by this reference. The following description explains the operation of the presently preferred embodiment as implemented using either an Apple Macintosh Plus Computer or an Apple Macintosh Computer. The explanation is intended to be illustrative and not exhaustive and uses specific examples to explain the principles of operation of the preferred embodiments. It will be appreciated that the principles of operation explained below will serve as a basis for the heuristic learning process necessary to fully appreciate and practice the full scope of the present invention. Thus, it is not intended that the scope and content of protection afforded to the present invention be limited in any way by the following explanation.

The following explanation explains how to use the implemented functions of the preferred embodiments. A walk through of the display menus is provided first, with working functions described. This presentation is followed by a walk through of an example application program that computes Fibonacci numbers.

To start, double click on PROTO icon. The PROTO icon is illustrated in FIG. 23a.

Figure 23B:
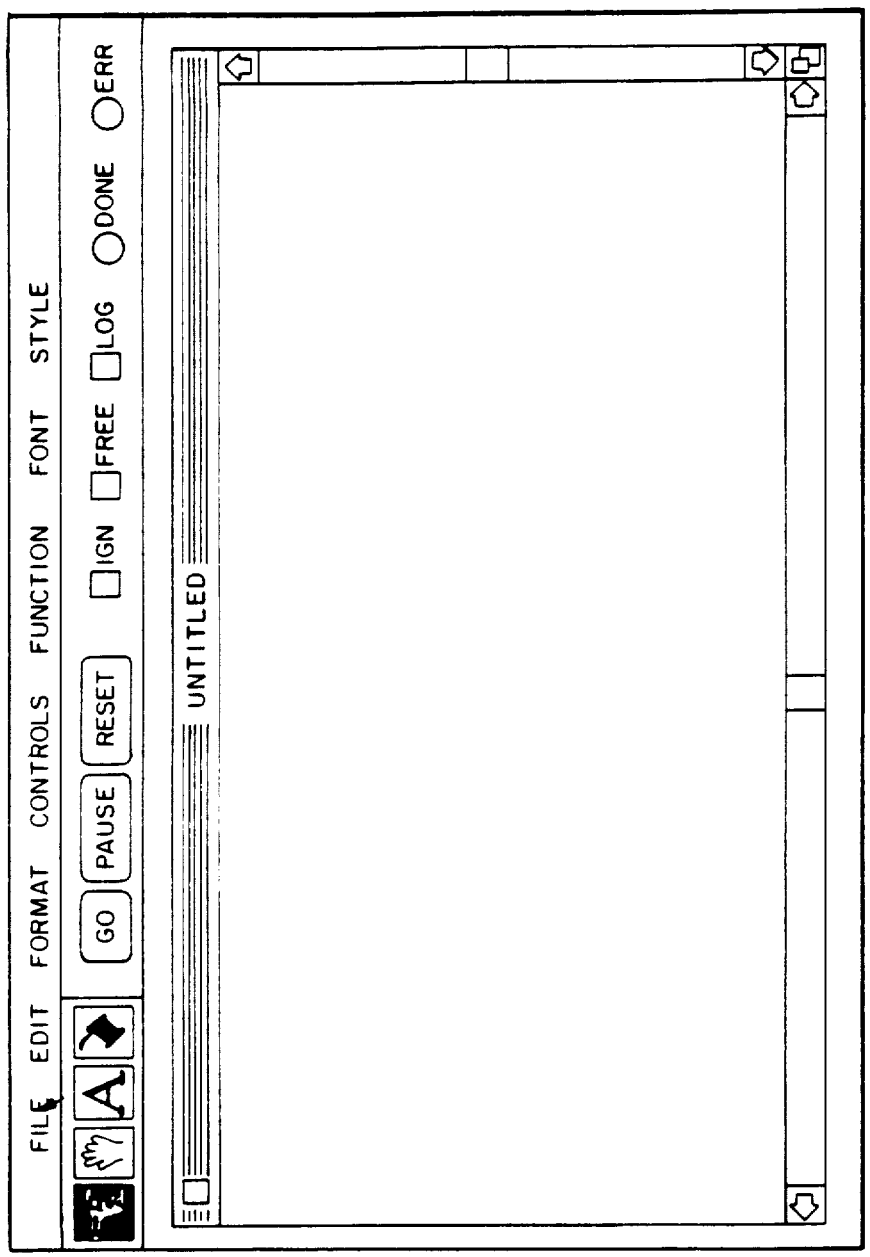
FIG. 23b the startup screen with empty front panel window.
Figure 23A:
FIG. 23a shows the PROTO icon.

The opening screen is shown in FIG. 23b. This screen is the front panel window on which controls can be implemented. The tools and controls below the menu bar will be described later.

Figure 24:
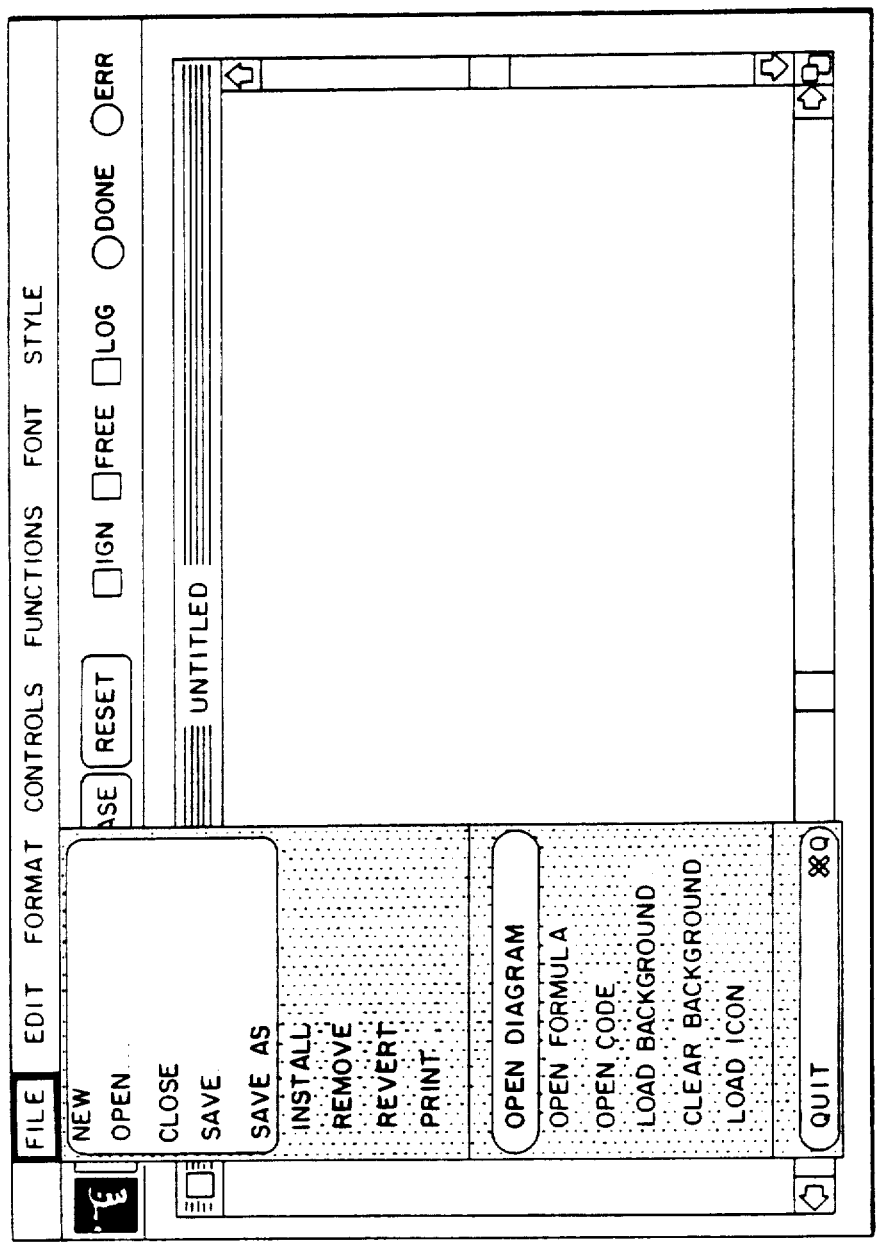
FIG. 24 illustrates the FILE menu (Items in clear surrounds can be used and stippled items do not yet work)

FIG. 24 shows the contents of the FILE menu. In this and subsequent screen pictures, items in clear surrounds can be selected. Stippled items do not yet work. The NEW, OPEN, CLOSE, SAVE and SAVE AS . . . items work as in any other MacIntosh program that follows Apple's user-interface guidelines. NEW opens a new instrument, OPEN brings up a dialog box with existing instruments' names, CLOSE closes the current instrument, SAVE saves the instrument with the current file name, and SAVE AS . . . saves a copy of the current instrument under the user-specified instrument name. OPEN DIAGRAM opens the block diagram window. Its use will be describe later. QUIT exits from PROTO and returns the user to the Finder.

Figure 25:
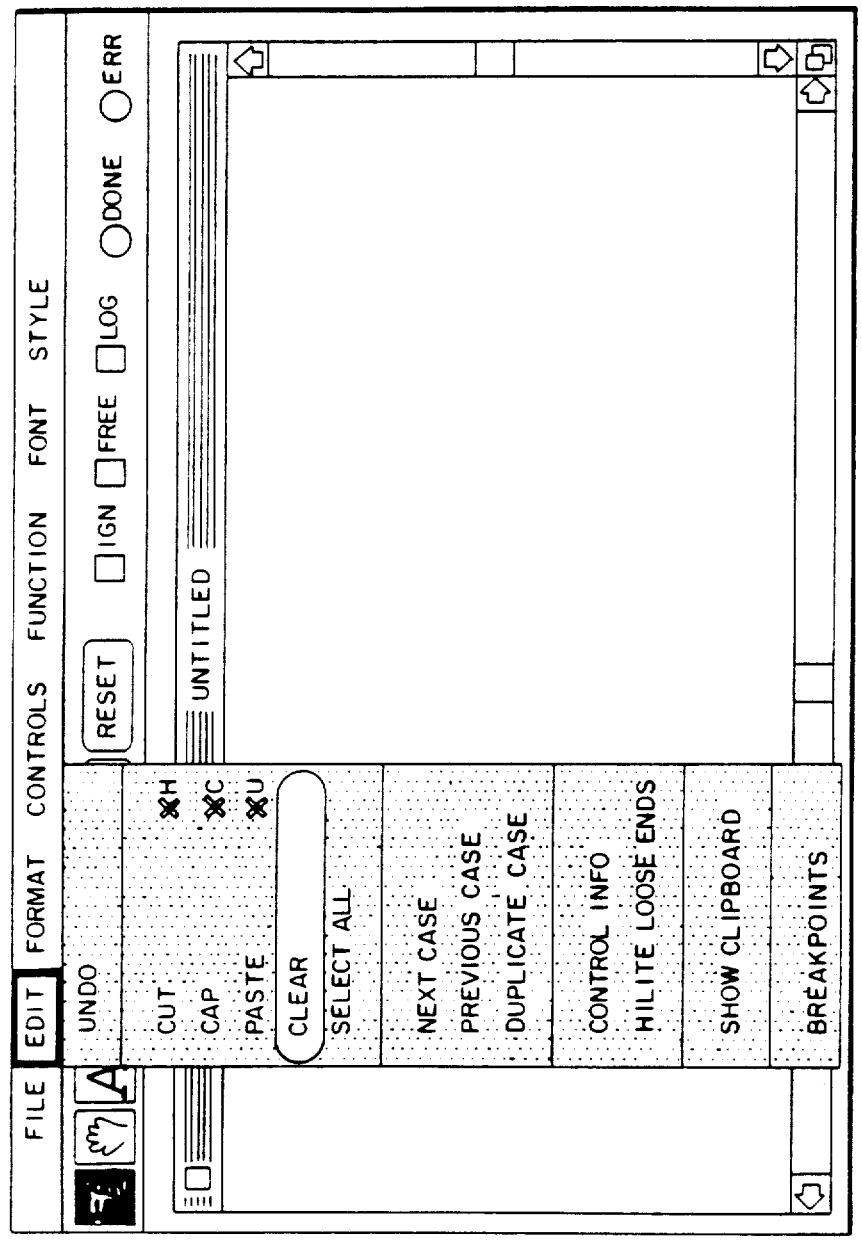
FIG. 25 illustrates the EDIT menu.

FIG. 25 shows the EDIT menu selections. This one is easy. Only CLEAR works. CLEAR is useful for removing items from the active window, e.g., selected wires and structures from the block diagram window, or controls from the front panel window.

Figure 26:
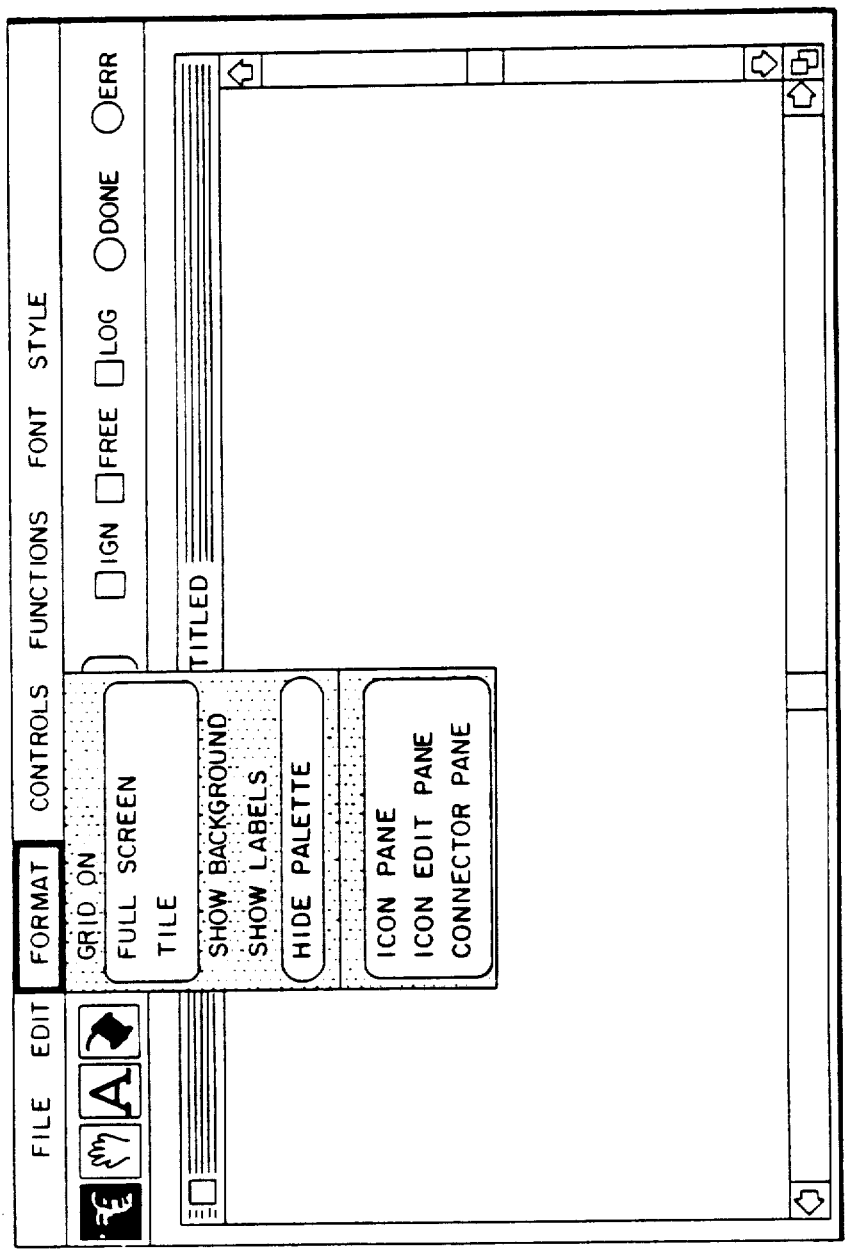
FIG. 26 illustrates the FORMAT menu.

FIG. 26 shows the FORMAT menu. The FORMAT menu has five working items. The first two FULL SCREEN and TILE alter the screen display. The FULL SCREEN options produces over-lapping windows. The TILE option produces non-overlapping windows. Both the FULL SCREEN and TILE selections can be reverted by selecting them again. The TILE option is dimmed if a block diagram window is not open.

Figure 27:
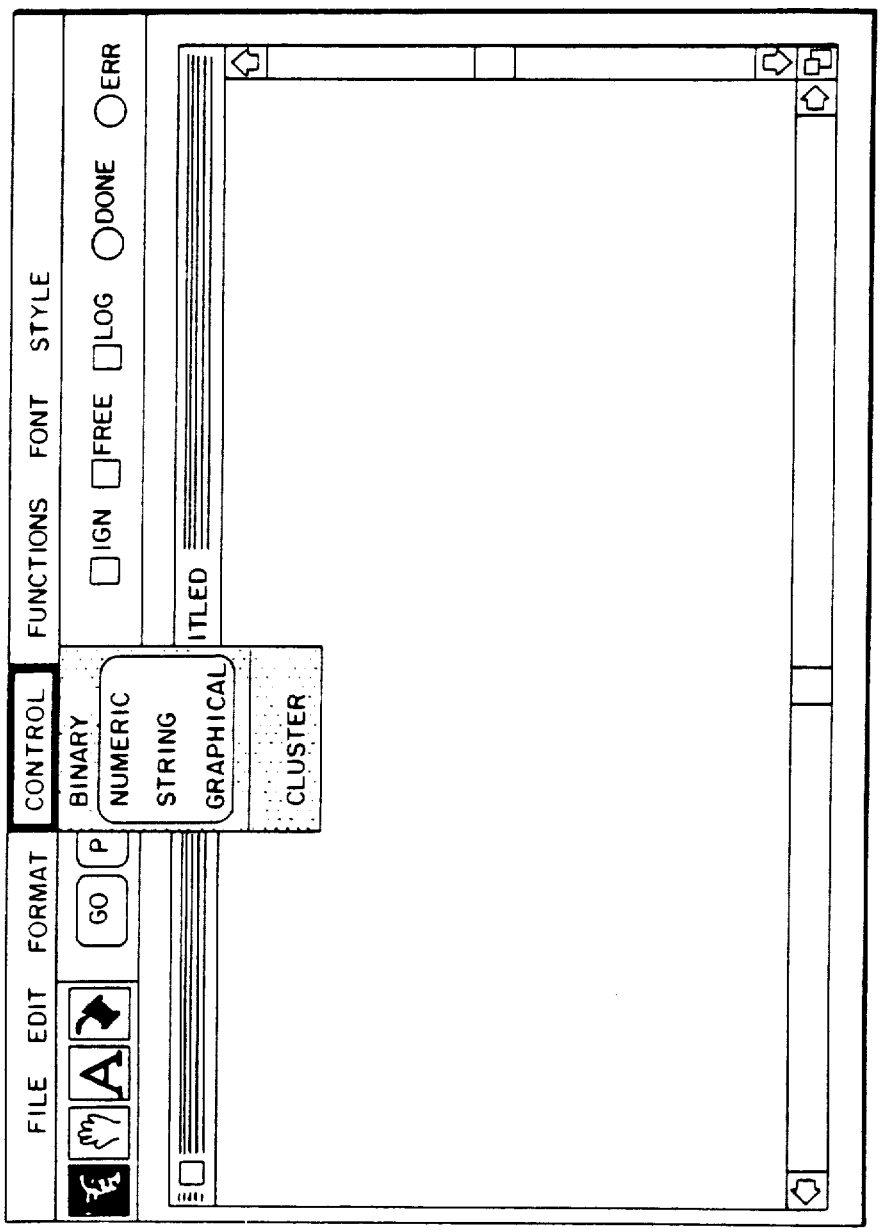
FIG. 27 illustrates the CONTROL menu from the front panel window.

FIG. 27 shows the contents of the CONTROL menu. The CONTROL menu is only available when the front panel window is active. The NUMERIC, STRING and GRAPHICAL items all work to some degree. Choosing the NUMERIC item brings up the dialog box shown in FIG. 28. This box offers the user many choices, however, only a few are implemented at this time. The small glyphs half-way down the left side of the box offer the choice of display style. Clicking on the chosen glyphs produces a reverse-video display of that pictograph. MINIMUM, MAXIMUM and DEFAULT work by selecting their adjacent frames and filling in the desired values. Arrays can be specified by choosing the number of dimensions and inserting that number into the frame to the left of ARRAY DIMENSIONS. The number of elements in each array dimension is then specified by entering appropriate values into the dimension frames numbered 1 to 8. Selecting the INDICATOR ONLY box makes the control a passive indicator on the front panel. Selecting SHOW DIGITAL READOUT provides a digital readout of the value of the control. The current value of the control can be altered by adjusting the control itself or by altering the value in the digital read out by selecting and entering values from the keyboard.

Note the CONTROL menu is dimmed when the block diagram window is the active window. It is made available by making the front panel window the active window.

FIG. 29 shows the dialog box for the STRING control. String controls can be filled with values for use as controls or indicators. This capability is useful for sending command or address strings for writing to and reading from a GPIB.

FIG. 30 shows the dialog box for the GRAPHICAL control. This control is used to display graphs. It must be used with the INDICATOR ONLY box selected.

The FUNCTIONS menu name is dimmed when the front panel window is active. It becomes available when the block diagram window is made the active window.

Figure 31:
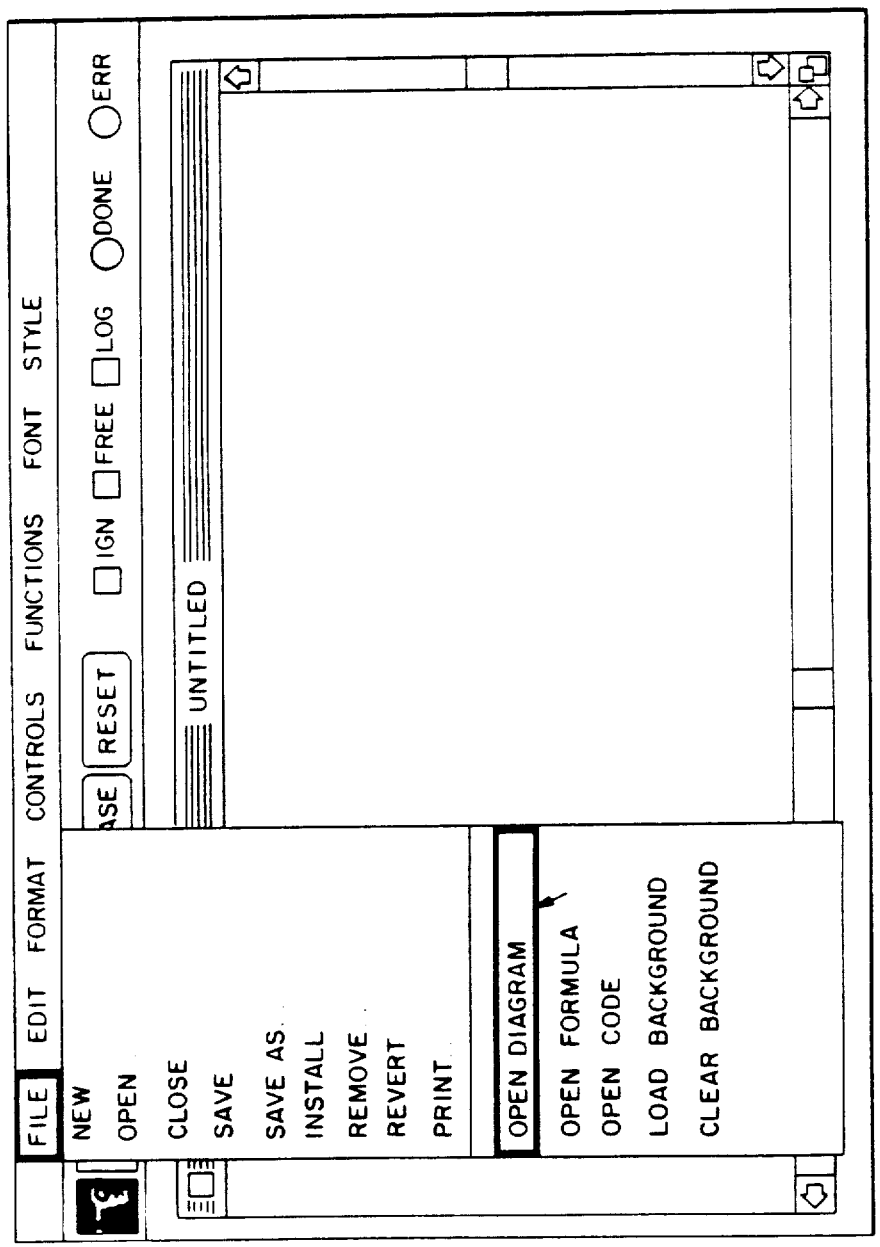
FIG. 31 illustrates an OPEN DIAGRAM selection from the FILE menu of the active front panel window pens and makes active a block diagram window.
Figure 32:
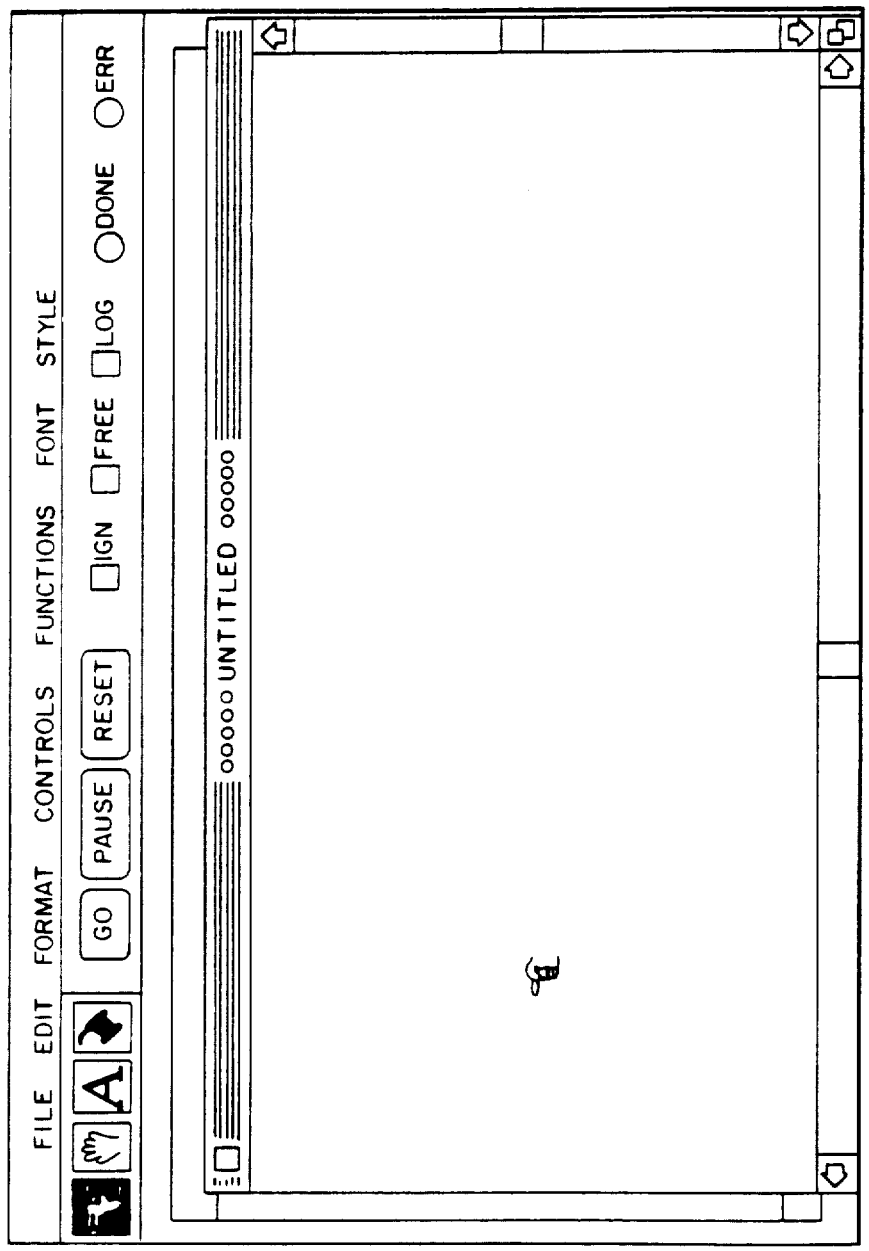
FIG. 32 illustrates employ, active Block-Diagram window created by choosing OPEN DIAGRAM from the FILE menu.

FIG. 31 shows the FILE menu displayed from the front panel window and the OPEN DIAGRAM item selected. Selecting this item opens a block diagram window. FIG. 32 shows the screen for a new block diagram window.

Notice that the untitled block diagram window is distinguishable from an untitled front panel window by the presence of the black bullets ( . . . ) in the title bar and the dimming of the CONTROL menu name. A block diagram is created by choosing items from the FUNCTIONS menu. FIG. 33 shows the contents of the Functions menu. Only a subset of functions from the items SPECIAL, ARITHMETIC, COMPARATIVE, INPUT-OUTPUT are working. Single functions are also available from STRING, SIGNAL PROCESS and CURVE FIT. The working functions from each of the menu options will be described in turn.

The functions available from the SPECIAL option of FUNCTIONS menu include STRUCTURES, SPECIAL ITEMS, and CONSTANTS. Each of the available functions is described below.

Structures

To remedy shortcomings of the conventional data flow, which makes it substantially unusable as a programming language, the present invention includes graphical operators. These structures implement in a data flow environment what typical structured programming control do.

Sequence Structure

The sequence structure in its simplest form serves to divide the data flow diagram into two subdiagrams, the inside of the structure and the outside of the structure. The outside diagram behaves exactly as if the sequence structure and its contents were replaced by an icon with hot spots for each line crossing the structure border.

FIG. 34 shows a 3D view of a three diagram sequence; however, to minimize screen space, only one diagram at a time is visible. Inside the structure border are multiple diagrams which execute in sequence. This sequence is indicated by the numeral in the upper left corner. When the first diagram in the sequence completes execution, the next one beings. The process is repeated until all the diagrams in the sequence have been executed.

Each diagram in the sequence uses a subset of the incoming arcs and produces a subset of the outgoing arcs (the outgoing subsets must be mutually exclusive to avoid arc fan in, but the incoming subsets are arbitrary). Constants may be used within any of the diagrams without any constraints. Variables used within a diagram are strictly local to the sequence structure and may be assigned only once. Variables can be used multiple times in the diagrams following the diagram where the variable was defined.

The sequence structure does not begin execution until all the incoming arcs have data available, and none of the outgoing arcs produce data until all the diagrams have completed execution. There may be at most one arc that terminates at the sequence structure border itself, acting as a trigger for the sequence (it is just one more input which must be present for the sequence to begin). An arc originating at the sequence structure border may be used as a ready signal indicating that the sequence has completed execution.

Interactive Loop ("for" loop) Structure

The iterative loop structure is similar to the sequence structure in that it partitions the data flow graphic into two pieces. The interior diagram represents the body of the loop and is similar to a sequence structure with N identical diagrams (FIG. 35). Arcs crossing the border of an iteration loop structure typically have a transformation applied. Incoming arcs are indexed in the most significant dimension so that the data inside the structure has dimensionality one less than outside. Outgoing arcs have the reverse transformation performed.

All arcs crossing the border must have the same size for the indexed dimension. It is possible to disable the indexing in which case an incoming arc behaves as if it were a constant available to each iteration. If indexing is disabled for an outgoing arc the value is repeatedly overwritten and only the last value propagates out from the iteration structure (this is one difference from the way N sequence diagrams would behave). By default, the most significant dimension is the one indexed but this may change to any dimension.

There are two special variables that behave as constants within the body of the iteration loop structure: the number of iterations (N) and iteration number, or index (i).

The number of iterations to be executed is automatically set by the size of the dimension being indexed. In the event that there are no incoming arcs a scalar value must be specifically connected to this variable to specify the number of iterations. The other variable is the iteration number (ranging from 0 to N-1, as in C).

Iterations are independent and could in principle be executed in any order or completely in parallel, except in the case where a non-reentrant virtual instrument is used. In this case, the iterations behave exactly like N identical sequence diagrams.

As usual, the iteration loop does not begin execution until all the incoming arcs have data available, and no outgoing arcs have tokens generated until all iterations have completed execution. An arc originating at the iteration loop structure border may be used as a ready signal indicating that the loop has completed execution.

Case (Conditional) Selection Structure

The case (conditional) selection structure of FIG. 36 is similar to the sequence structure in its usage of screen real estate, but it differs in its handling of arcs crossing the border in that each case diagram must use all incoming arcs and generate all outgoing arcs. The usual execution rules apply (all inputs available to start, all outputs generated simultaneously after all execution completes).

There must be exactly one arc that terminates at the case selection structure border itself, acting as a selector for the case. In the simplest case a boolean valued scalar is connected to the selector to select between case 0 (false) and case 1 (true). In the general case a scalar number (or string variable, if it is specified as a discrete list of strings) is connected to the selector.

A special diagram (default case) may be specified to be used in the event that the selector does not lie in the range of specified cases. An arc originating at the case selection structure border may be used a a ready signal indicating that the selected case has completed execution.

Indefinite Loop ("do-while" loop) Structure

Figure 37:
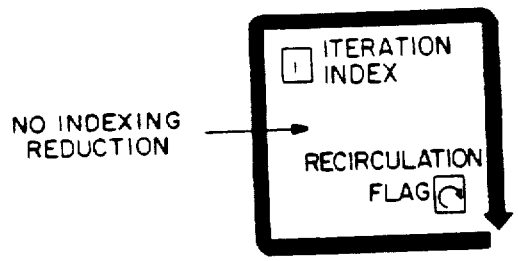
FIG. 37 shows a graphical presentation of an indefinite loop structure.

The indefinite loop structure is similar in concept to the iterative loop structure in that the interior diagram represents the body of the loop, but it differs in that arcs crossing the border of an indefinite loop structure typically do not have an indexing transformation applied. FIG. 37 shows a graphical representation of an indefinite loop structure.

There are two special variables available within the body of the indefinite loop structure. One is the iteration number which starts with a value of 0 and the other is the recirculation flag to which the value of the "while" expression is connected (if left unconnected it is equivalent to "while(true)").

Iterations are typically related so the operation of the indefinite loop is similar to an indefinite number of identical sequence diagrams. The usual execution rules apply. There may be at most one arc that terminates at the indefinite loop structure border itself, acting as a trigger for the loop (it is just one more input which must be present for the loop to begin). An arc originating at the indefinite loop structure border may be used as a ready signal indicating that the loop has completed execution.

Special Items: Shift Registers

There is one special construction which is available for use only within the loop structures. This construction is the shift register. The shift register eliminates the need for cycles in a data flow graph making the result much easier to understand and to prove correct. The shift register behaves as if it were an ordered set of two or more variables all of the same type and dimensionality.

Figure 38:
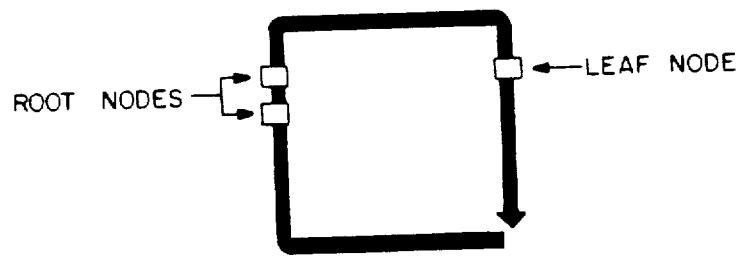
FIG. 38 shows a graphical representation of a shift register in loop.

The first one in the set must be a left node within the loop body diagram. The others must be root nodes within the loop body diagram. To include a shift register in the indefinite loop structure, one must first highlight the desired structure and then select the shift register from the functions menu item. The indefinite structure now shows two boxes on its left edge (root nodes) and one box on the right edge (leaf node). See FIG. 38.

At the conclusion of each iteration of the indefinite loop all shift registers within the body are "clocked", i.e., the value of the leaf node is placed in the first root node while the previous value of the first root node is placed in the second root node, etc.

Prior to the first iteration of the indefinite loop, root nodes of shift registers are set to false, zero, or empty string, as appropriate. These default initial values may be overridden by specifying alternative constants, or by setting the nodes using incoming arcs from arbitrary external expressions.

Using PROTO: The Fibonacci Number Problem

The best way to learn to use the presently preferred embodiment of the invention is to create a working virtual instrument. The following exercise is a standard one from introductory textbooks on computer programming: Creating a Fibonacci sequence. In place of the traditional programming languages like C or Pascal, we will use the presently preferred embodiment of the invention The Fibonacci sequence (1, 1, 2, 3, 5, 8, 13, 21, 34 . . . ) arises in such diverse applications as the number of petals in a daisy, the maximum time it takes to recognize a sequence of characters, and the most pleasing proportions for a rectangle. It is defined by the relations:

$$f(1)=1$$

$$f(2)=1$$

$$f(n)=f(n-1)+f(n-2) \text{ for } n<2$$

Starting with the third term, each Fibonacci number is the sum of the two previous Fibonacci numbers. In the Fibonacci instrument described below, the presently preferred embodiment is used to create a virtual instrument to generate and display a sequence of Fibonacci numbers. To accomplish this a number of features of the preferred embodiment are used including iterative-loop structure arithmetic functions, numeric and graphic controls and constants.

Getting Started

To get started, double click on the PROTO icon. Your new screen should like FIG. 1. Construction of virtual instrument can start from either the Front panel or the block diagram windows, however, since labels for the controls are not yet implemented, it is perhaps easier to begin from the block diagram window. To reach the block diagram window pull down the FILE menu and choose OPEN DIAGRAM. This action will open an active block diagram window (see FIG. 32) You are now ready to build your virtual instrument.

Figure 39:
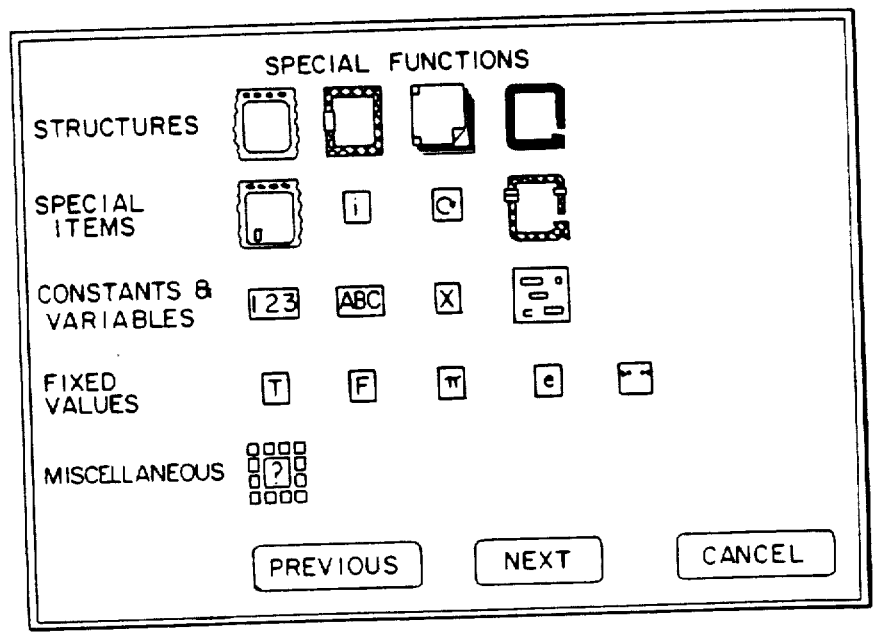
FIG. 39 illustrates a dialog box obtained by choosing SPECIAL from the FUNCTIONS menu.

Pull down the FUNCTIONS menus and choose SPECIAL. This choice will produce a dialog box with a display of functions (see FIG. 39). The four functions represented on the first line in the dialog box are described above. All four of these functions are implemented. An item is selected by placing the cursor on it and clicking. This action closes the dialog box and deposits the chosen item in your active block diagram window. FIG. 40 shows an example of a "for" loop structure layed down in the block diagram window in this manner.

Items chosen from the FUNCTIONS menu are always deposited near the center of the window, and if previous items are not moved new items may obscure old items.

Items may be selected and moved about in the active window by using the grabber glyph. Placing the cursor on the grabber glyph in the tool palette in the upper left portion of the screen just beneath the menu bar and clicking will change the cursor into the grabber when you move the mouse back down into the active-window area. The TAB key can also be used to change the tool. Pressing the TAB selects the next cursor in the palette.

Note: the "hot spot" on the grabber icon is at the base of the thumb and first finger.

Several actions, including moving objects, require that the object be "selected" before some action can be performed. To select a structure its "select regions" must be identified. The "for" loop structure object has two select regions, one along the right edge and a second along the bottom edge of the object. FIG. 41 shows the location of these regions. Positioning the grabber's hot spot in one of these regions and clicking will select the object. The case and "do-while" structures are selectable anywhere along their borders The sequence structure is also selectable along its border except for the upper corners which perform the function of shifting forward and backward through the sequence. When selected, the object is surrounded by a moving dashed box. The object can now be moved by placing the grabber on the object and click-dragging to a new location. Releasing the mouse button will leave the object selected in its new location. Moving the cursor off the object and clicking will de-select the object.

Sometimes you may need to duplicate the structure you are working with. You could return to the FUNCTION menu, choose SPECIAL again and click on the object you want to use. There is a short-cut to duplicate objects from within the block diagram window. To duplicate the object from within the active window, use the grabber tool to select the objection to be duplicated, press the OPTION key and click-drag a copy off the original.

Note: Select can be an ambiguous term with reference to the Mac user interface. It is not synonymous with choose, rather, it is used to indicate that the object is to be "selected" by placing the cursor into a select region for that object and clicking the mouse button.

Two "for" loop structures are required for the Fibonacci instrument we are building. Use one of these two methods to duplicate a copy of the structure in your active window. Your active window should now contain two identical "for" loop structures.

It is often necessary to place objects within objects. To do this, it is helpful to be able to resize objects The structures can all be resized in the same fashion Place the grabber tool in the lower right-hand corner of the structure and click-drag the object to the desired size Figure shows the proper placement of the grabber for the resize operation and the results of enlarging the original structure object.

Figure 43:
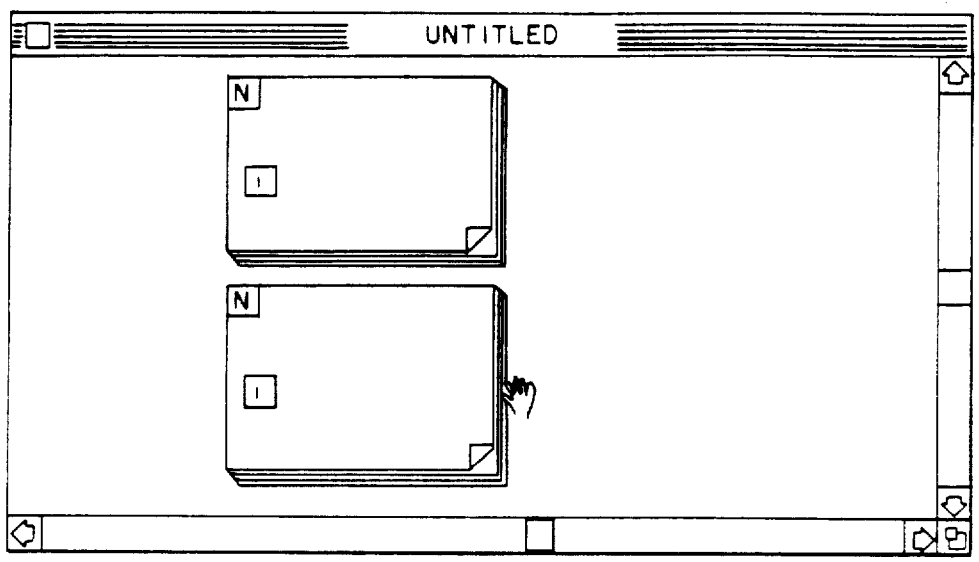
FIG. 43 shows two enlarged "for" loop structures rearranged for the Fibonacci instrument.

Additional functions are required in both loop structures for our instrument. Resize both loop structures to be about the same size of the larger objection in FIG. 42. Now reposition the two structures into locations similar to those shown in FIG. 43.

Figure 44:
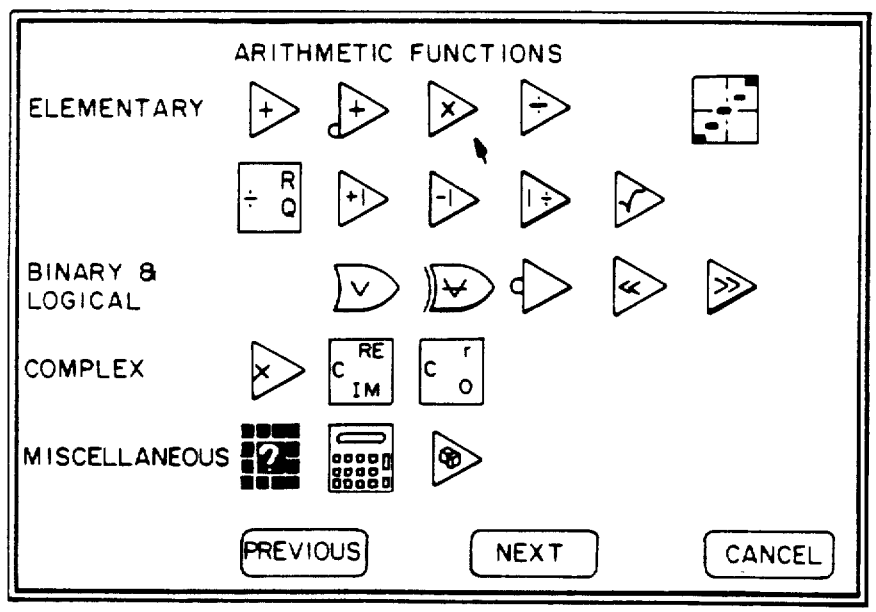
FIG. 44 shows the dialog box obtained by choosing ARITHMETIC from the FUNCTION menu.

The Fibonacci virtual instrument uses two arithmetic functions: addition and multiplication. These functions are obtained by choosing ARITHMETIC from the FUNCTIONS menu (see FIG. 33). Choosing this menu item opens the dialog box shown in FIG. 44. The functions currently implemented are: addition, subtraction, multiplication and division. Choose addition by clicking on the addition function glyph. FIG. 45 shows the result of choosing the addition function. The dialog box is closed and an object is placed near the center of the Block-Diagram window. Select this object by placing the grabber on it and clicking. The entire area of the arithmetic-function object is a select region. The selected object can now be click-dragged to a new position. Move the addition-function object to a location on the upper loop structure similar to the position shown in FIG. 46. Select a multiplication function and position it in the lower loop similar to FIG. 46.

Three more functions are needed before we move to the front panel and install some controls and indicators. First, pull down the FUNCTIONS menu again and select CURVE FIT. This choice will display the dialog box shown in FIG. 47. At this time only the linear-fit function is implemented. Choose LINEAR FIT. The object will drop approximately in the center of the screen. Click-drag the object to a position similar to the one illustrated in FIG. 48.

The next function we need is a shift register. This function must be used within a control structure, therefore a structure object must be selected before the shift register is selected from the SPECIAL menu item. Select the top loop, pull down the FUNCTION menu and select SPECIAL. From the SPECIAL dialog box choose the shift register glyph from the row of glyphs labelled: SPECIAL ITEMS (see FIG. 39). FIG. 49 shows what the loop structure looks like with the shift register function installed. Operation of the shift register function was reviewed above.

The last functions to be implemented in the block diagram window are constants. Constants are available from the FUNCTIONs menu from the menu item labelled SPECIAL. We need two constants. Choose a numeric constant glyph from the dialog box and duplicate its object in the window. FIG. 50 shows the two constant objects moved into position alongside the inputs to the shift register. Set one constant to 1 and the other to 0 by using the operator (the "pointing finger") tool and double clicking in the constant box then typing in values from the keyboard.

Now we will move to the front panel window to implement some controls and indicators. Click on the exposed edge of the front panel (see FIG. 32). The Front-panel window should come to the front with an empty window. Notice that now the FUNCTIONS option in the menu bar is dimmend, by the CONTROLS option is darkened indicating that it can be accessed. Pull down the CONTROLS menu and choose NUMERIC. The contents of the CONTROLS menu are described above.

Choose the NUMERIC option from the menu. The dialog box should look like the one in FIG. 28. Move your cursor to the area of the three display styles on the left side of the dialog box and select the center glyph representing a "pointer" control. Notice that then selected the image of the glyph will change to reverse video. Move the cursor to the box labelled MINIMUM and double click to select it. If the interior of the box does not darken move your cursor around inside the box while clicking until you find the right spot. When the interior is darken enter 1 from the keyboard. Move the cursor to the box labelled MAXIMUM and enter 20. Now move the cursor to the box labelled OK and click. This action will close the dialog box and return you to the front panel window where you should see a larger representation of the pointer control you selected from the dialog box inside a moving dashed rectangle. Controls can be moved about the front panel window just as objects were moved in the block diagram window. Notice that the behavior of the controls is more like the non-structure objects in the block diagram window: the entire control is electable, there is not a limited select region like on the structures. Click-drag the pointer control to the upper left-hand region of the Window to a position similar to the one shown in FIG. 51. This control will determine the length of the Fibonacci sequence that your instrument calculates.

Return to the CONTROLS menu and again choose the NUMERIC option. This time select the box labelled INDICATOR ONLY and choose the DIGITAL CONTROL glyph (the right-most control glyph), then click in the OK box. The front panel window should now display a rectangle within a rectangle with the interior rectangle containing a 0. This control is a passive indicator. it will be used to display intermediate was well as final values of our Fibonacci instrument. We need a second indicator display. Controls can be duplicated in the same manner as objects in the block diagram window. Use the grabber tool. First select the control to be duplicated, depress the OPTION key and click-drag a copy off of the original. Arrange these two indicators to the left of the front panel window similar to the positions shown in FIG. 52.

Figure 53:
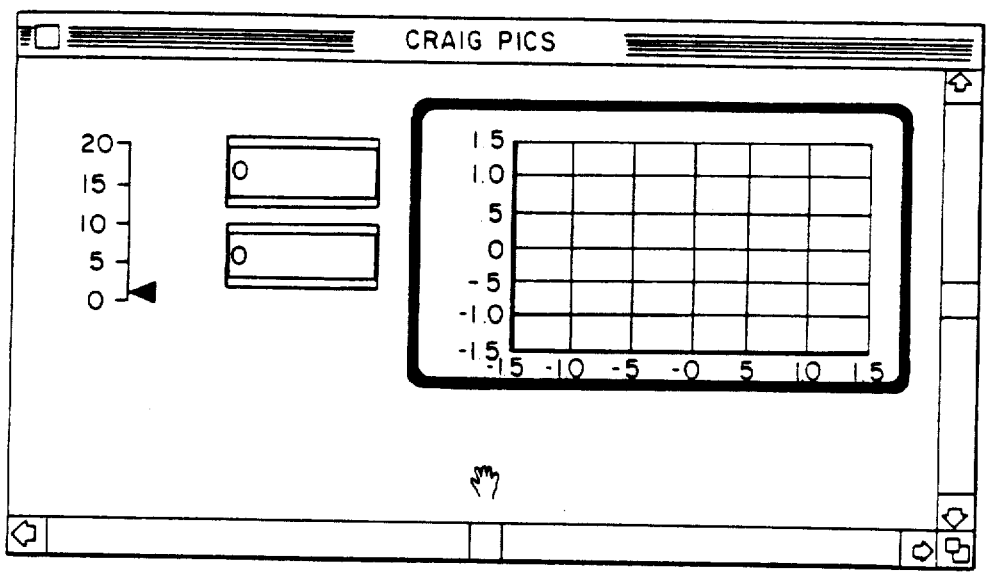
FIG. 53 shows the front panel window with graphical display repositioned to the upper right-hand corner of the window.

We need one more front panel control to complete or instrument, a graphical display. Return to the CONTROLS menu one more time and choose the GRAPHICAl option. This option will produce a dialog box like the one shown in FIG. 29. Choose INDICATOR ONLY. Do this and click the OK box to return to the front panel window. There should now be a rectangular-shaped graph with linear coordinates setting in the middle of the window. This is the graphical display control. It can be moved just like the objects in the block diagram window and the other controls on the front panel. It can also be resized, as can the other controls. The procedure for resizing is identical to the procedure used to resize objects in the block diagram: select the control and then click-drag with the grabber tool from the lower right-hand corner of the selected area. The situation with the NUMERIC controls is the same but because the fullness of the select region the area to "grab" with the grabber is less obvious, but it is the same region just interior to the lower right-hand corner of the select area. It may take a little practice to be able to reliably resize these controls. Move the graphical display to the upper right-hand corner of the window. Your screen should now look like the one shown in FIG. 53. At this point we can return to the block diagram window to "wire-up" the components of our block diagram into a working instrument that will be controlled by the front panel and display its output there as well.

Figure 54:
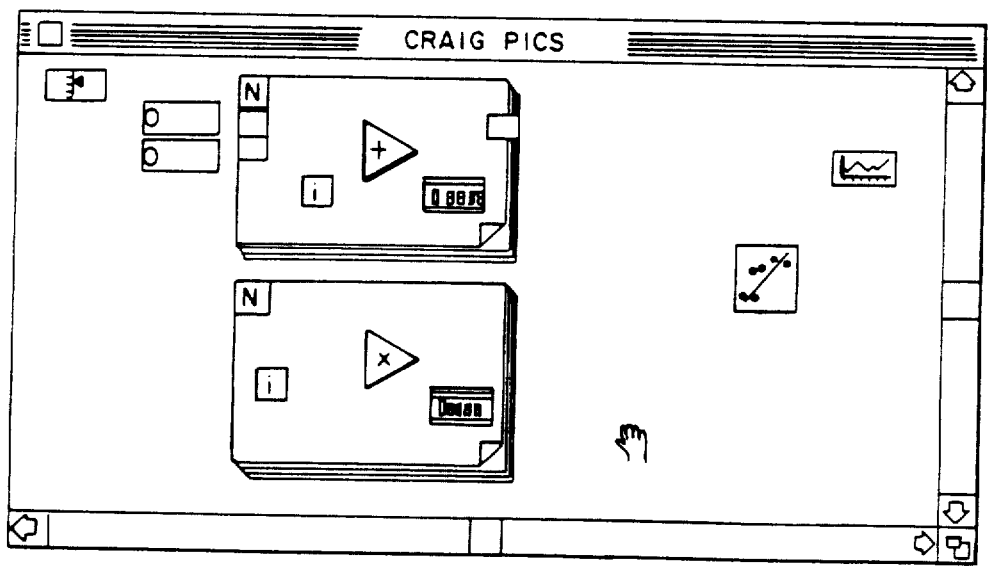
FIG. 54 shows the block diagram for the Fibonacci instrument with components in position ready for wiring.

You can return to the block diagram window either by clicking on the exposed edge of that window or by choosing OPEN DIAGRAM from the FILE menu. The first think you will notice is that your block diagram has changed. There are now four new objects in the block diagram window that were not there when we left. These block diagram representations of the front panel controls are called "terminals". These objects can be moved about the block diagram just like the original block diagram elements. Notice that with the exception of the constants, each of these elements bears a resemblance to the control laid down on the front panel. The constants are distinguished by their numerical contents representing the values they hold. When a control is "selected on the front panel, its terminal equivalent on the block diagram is "highlighted", and vice-versa. Before we begin wiring up the block diagram we need to move the control terminals into closer proximity to their points of action. Using the grabber tool, click-drag each of the control terminals into positions similar to those shown in FIG. 54. We are now ready to begin to wire the elements into a working instrument. Note: If you original positioning of the block diagram objects differed significantly from our example, now is the time to rearrange your block diagram so that it more closely resembles FIG. 54. Eventually it should be relative easy to move about pieces of a wired diagram, but at present this is not possible.

Figure 55:
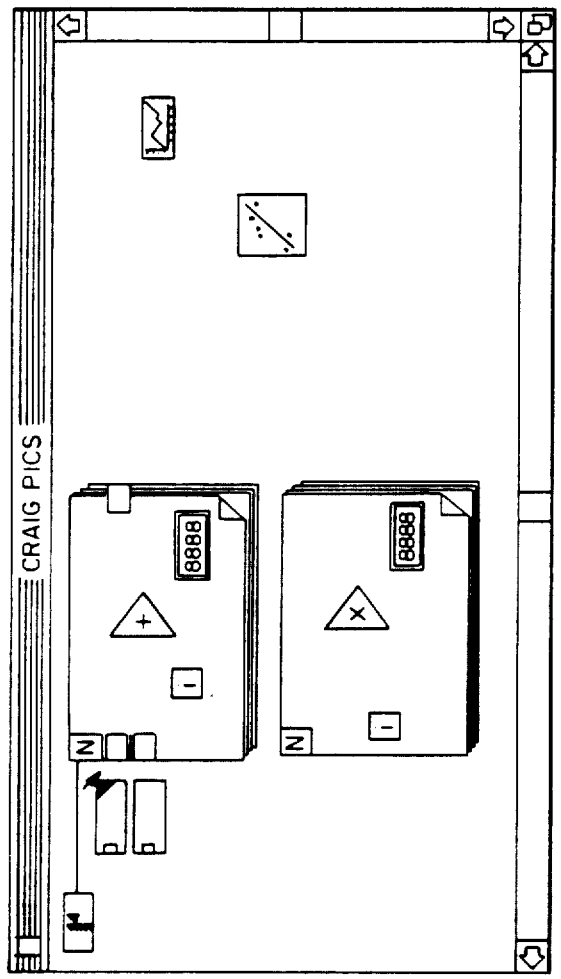
FIG. 55 illustrates thata connection is established between the slide-pointer control and the iteration variable box of the loop structure using the wiring tool.

To connect component in the block diagram you must use the wiring tool. This tool is represented in the tool palette in the upper left-hand corner of the block diagram window by the wire-roll glyph. The hot spot on this took is the end of the unrolled stretch of wire. Move the cursor to the tool palette and click to select the connector, when you move the cursor back into the active-window area your cursor will now be the connector tool. Connections are established between block diagram components by clicking in a hot spot of one element and pulling the flickering line to a hot spot of component to which you want to connect. FIG. 55 shows the connection between the slide-pointer control used to set number of iterations in the loop and the iteration-variable box in the loop (labelled N). The "wire" is represented by a flickering line during the connecting operation. Clicking in a hot spot of the terminal component will change the wire to a non-flickering representation of the connection. The interior of objects, or object elements, represented by heavy black borders are "hot" anywhere within their borders. Other objects, for example, the LINEAR FIT object, have localized hot spots representing specific inputs and outputs. FIG. 56 shows the arrangement of hot spots for all available functions.

Connecting wires can be "forced" to turn corners where the user wants them to for purposes of neatness and legibility of the diagram. A single click while dragging a wire outside of a structure or other object, will allow the user to change direction at that point by 90°. Pulling the wire again will allow the user to continue toward their target connection. Try using this technique to connect the pointer control to the iteration variable box on the lower loop structure.

Often it is necessary to erase and redraw lines. To do this, use the grabber tool to select the line segment to be removed. Remember where the grabber hot spot is located (at the junction of the thumb and first finger) when trying to select wires. With the line segment selected, pull down the EDIT menu and choose CLEAR.

This action will erase only the selected line segment. Successive pieces of the line must be removed individually repetitions of this sequence of actions. Tiny pieces of line segment may be difficult to select. Sometimes line segments successfully selected and cleared appear to remain on the block diagram. Trial-and-error is the name of the game here. Drawing replacement lines is identical to rawing new lines.

FIG. 57 shows the Fibonacci virtual instrument completely wired. Notice that the representations of the wires vary when they exit from various structures and functions.

These changes reflect the data type being represented. FIG. 58 shows the data types used by the preferred embodiment and their representations in the block diagram. Notice that the data type output from the LINEAR CURVE function in FIG. 57 is a structure. This structure consists of two arrays representing the two functions to be graphed. One function is the connected data points, the second the linear fit calculated by the LINEAR CURVE function.

You are now ready to return to the control panel and operate your instrument. Return to the front panel by finding the edge of the hidden window and clicking to bring it to the front. The front panel window has not changed and should still appear as it did in FIG. 53. To operate the front panel choose the operator tool from the tool palette. The operator tool is the left-most glyph in the palette, with the appearance of a finger about to press a button. This tool's hot spot is at the end of the pointed finger. Use this tool to move the pointer on the pointer control to some value between 1 and 20. Bring the pointed finger into proximity with the pointer on the control, click and drag the pointer to a new location. This action changes the value of the number of iterations, N, to be performed by the upper control loop in the block diagram to which it is connected. To the right of the tool palette, above the front panel window, but below the menu bar are several controls (see FIG. 3). Only GO is currently operable, but this is all you need to set your instrument into motion. Use the operator tool to select the button and watch the indicators and graph. The top indicator represents the current value of the Fibonacci number generated in the top loop and the bottom indicator displays the square of the index used to increment the loop. At the end of the loop a graph is displayed that contains two functions, the dark line is the connected data points representing the relation between a Fibonacci number and the square of its index in the sequence. The grey line represents the linear fit performed by the LINEAR CURVE function.

You now have a working instrument, the construction of which has used many, but not all of the working features of the current prototype of the preferred embodiment.

To help you in your further exploration of the system, two sections follow which describe the use of the tools in more detail, and provide some hints for using the sequence and "for" loop structures. These appendices and FIG. 56 are probably useful as "cheat sheets" for the new user after the first walk-through with the Fibonacci virtual instrument.

First Additional Explanation Section

OPERATE TOOL: Use this tool to operate the controls on the front panel or set constants on the block diagram.
    Set or change control values
        DOUBLE-CLICK in control to select region for typing in value
    Begin execution
        CLICK in log or free box
    Set or change constants on block diagram
        DOUBLE-CLICK in control to select region for typing in value
    Duplicate control, indicator, constants or structures
        select object, then OPTION-CLICK and DRAG copy
    Clear object from front panel or Block Diagram
        select object, then chose clear from edit menu GRABBER: Use this tool to select regions and move or resize objects.
    Select control, indicator, or non-structure object
        CLICK anywhere on control or indicator on front panel, or non-structure object on block diagram
    Select structure
        CLICK on bottom or right edge of structure
    Move object
        once selected, CLICK anywhere in selected region and drag
    Resize object
        CLICK-AND-DRAG on lower right corner to desired shape and size (sometimes it is easier to see "corner" you are looking for if you select the object first)

WIRING TOOL: Use this tool to connect objects in the block diagram and to associate controls and indicators with terminals on the front panel.
    Connect objects on the block diagram
        CLICK on first object, draw wire to second object and CLICK
        CLICK to make 90° turn in wire
    Choose Term Pane Pattern
        drop TermPane (Format menu)
        OPTION-COMMAND-CLICK to go to next pattern
    Associate control or indicator and terminal
        with chosen pattern visible in Term Pave, CLICK on control then CLICK on terminal Check association of control and terminal
        CLICK on control (associated terminal will be hilighted)
    Disassociate control or indicator and terminal
        OPTION-CLICK on control to be disassociated

ALL TOOLS

Select new tool
    CLICK on tool
Select menu item
    CLICK on menu bar and drag down menu
Drop Control, function or structure
    within dialog boxes, any tool may be used
Move windows
    CLICK-AND-DRAG on title bar of window
Title windows
    DOUBLE-CLICK on title bar of one of the windows
Resize window to full screen
    DOUBLE-CLICK on title bar of window
Scroll windows
    CLICK on arrows, or inside scroll bars
Resize windows
    CLICK-AND-DRAG on grow-box in lower right corner of window

Second Additional Explanation Section

SEQUENCE STRUCTURE: Express explicit time dependencies, i.e., execute block diagram in frame 0, then frame 1, then frame 2.

For best results, follow this sequence:
(1) Determine how may frames you want
  the first frame, 0, is given when you drop the structure
  to make a new frame COMMAND-CLICK with the grabber in the upper right corner and the frame number will increment
  do this for each frame desired - before filling any frames
(2) Build block diagram in each frame
  select frame to work on by CLICKING with the grabber in the upper left corner
(3) A wire coming into a sequence can be used in any of the frames in the sequence by wiring to the dark rectangle at the border.
(4) Wires leaving a sequence can only come from one source.

"FOR" LOOP STRUCTURE: Execute block diagram within loop N times.

Some hints:
(1) To force the number of iterations connect a numeric control to the box in the upper left corner of the structure containing an N, otherwise the loop will iterate ARRAYSIZE times
(2) If new element from an array is used at each iteration, the array must be outside of the loop. The number of iterations will be set by the number of elements in the array (unless overridden by setting N ?). Notice the array wire outside of the loop changes to a scalar wire inside the loop.
(3) The index (boxed i) in the structure is for your use, but need not be wired up
(4) When building an array by producing a value at each iteration, the array is an indicator outside of the loop. Notice the scalar wire inside the loop, and array wire outside the loop structure.
(5) To view intermediate values at run-time, place a scalar indicator inside the loop and connect it to the wire carrying the value of interest before the wire leaves the structure.

CASE (CONDITIONAL) SELECTION STRUCTURE: Executes the block diagram chosen by the selector.
(1) Same as sequence
(2) Same as sequence
(3) A wire coming in (same as sequence)
(4) All wires leaving a sequence must have sources (be wired) in every frame of the sequence.
(5) The little box on the left-hand border is the selector box. At present, only numbers can be wired to it.

"WHILE" LOOP STRUCTURE: Execute diagram within loop until test becomes false.

Some hints:
(1) The little box with the Q in it should receive a boolean. When the input boolean is FALSE the loop will terminate. If it is not wired the loop will be infinite!
(2) The diagram in the "while" loop will always execute at least once.
(3) The index (boxed i) in the structure is for the user's use, but it need not be wired up.
(4) Arrays are not presently indexed when entering a while loop.
(5) Same as "for" loop.

Creating and Using Hierarchical Instruments

The capability of the preferred embodiments to use previously implemented virtual instruments within new instruments is a fundamental and powerful feature of the system. This capability allows the user to construct a hierarchy of virtual instruments by including previously implemented virtual instruments as "parts" in a new instrument. To facilitate the construction of such complex instruments the user must "prepare" the instruments to be included as components in an instrument hierarchy. This preparation includes defining the connections that will exist between the "controlling" (superior?) and "Component" (inferior?) virtual instruments and designing an icon to represent the "component" virtual instrument in the block diagram of the "controlling" virtual instrument. Three items in the FORMAT menu support these features: ICON PANE, ICON EDIT PANE and CONNECTOR PANE.

Figure 61:
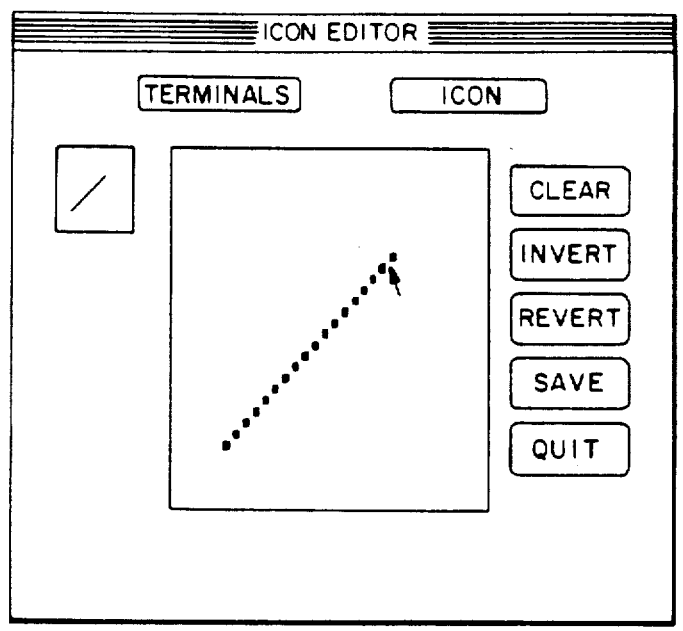
FIG. 61 is a drawing in the icon editor.

Choosing the ICON EDIT PANE option brings up the dialog box shown in FIG. 49. Clicking on the ICON button brings forth two boxes, one large and one small (see FIG. 60). The large box is the icon editing pane. Placing the cursor inside this box and clicking the mouse button produces a signal black square. Each square will appear as a single black dot on the screen in the finished icon. Click dragging inside the box produces a line of these squares (see FIG. 61). Clicking on existing squares removes them.

Operations inside this window are similar to the operation of MacPaint's FatBits mode. Actions performed in the large square are mimicked in the small square. The image in the small box is the default size of the object that will represent the instrument in the block diagram of the superior instrument. The dialog window has several additional buttons for manipulating the editing pane. The CLEAR button clears the contents of the window. The INVERT button swaps black squares for white squares (and vice-versa) across the whole editing pane. REVERT replaces the current contents of the editing window with the last saved version of the icon. SAVE saves the current contents of the editing pane. Possibly useful if you have made a number of changes in the image and are uncertain, about the remaining changes you are about to make! The save version is the version returned upon choosing the REVERT button. QUIT returns the user to the front panel window.

Displaying the Instrument Icon

Figure 62:
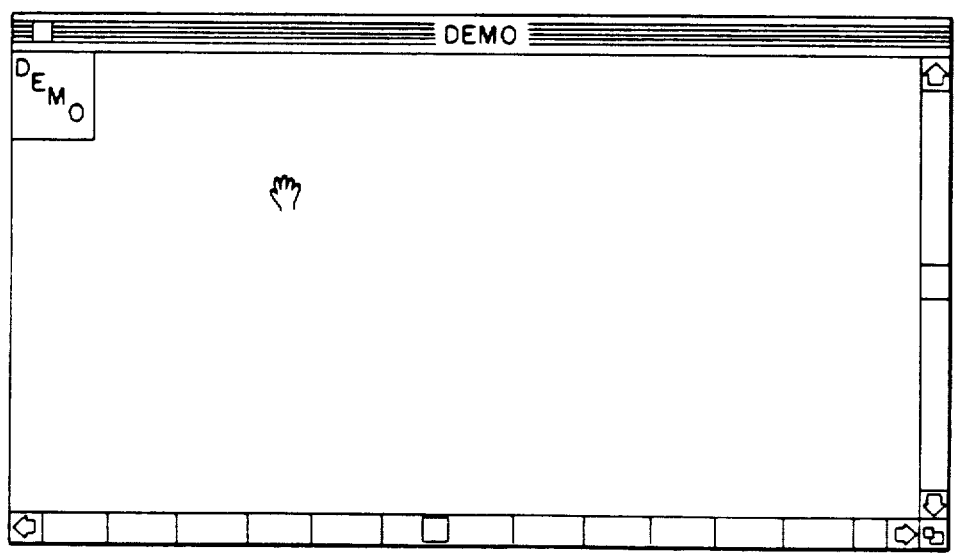
FIG. 62 is an illustration displaying the instrument icon in the front panel window.

Chosing the ICON PANE option from the FORMAT menu puts the icon, Demo here, associated with the current instrument in the upper left-hand corner of the front panel window (see FIG. 62). Choosing the same option again (now "checked" in the menu) removes the icon from the active window.

Using the Connector Pane to Establish Terminals

Creating instruments to serve as components within other virtual instruments requires that input-output connections or "terminals" be established to provide a means for transferring information between instruments. These connections are established through the mechanism of the CONNECTOR PANE.

In the front panel window, selecting the CONNECTOR PANE option from the FORMAT menu places a small rectangular pane in the upper left-hand corner of the active window (see FIG. 63). Within this pane are several sectors, or "terminals". The configuration of terminals displayed in this pane represent the pattern of "hot spots" or terminal connections thru which information can flow between this instrument and other instruments, or instrument components. There are currently eight different patterns of connector terminals available (see FIG. 64). The user can view the selection of available terminal patterns, when the wiring tool is in use, by holding down both the OPTION and COMMAND keys, clicking the mouse button. Note: the cursor does not have to be in the connector pane to shift patterns. Each click will bring up a new terminal pattern. Once the eight available patterns are displayed, continuing to click will cycle through the selection again. The pattern displayed in the connector pane is the one available for "wiring". To make an association between a terminal in the connector pane and a control (or display) select the terminal by clicking in it with the wiring tool. The selected terminal will turn black (see FIG. 65a). Move the cursor to the control to be associated with this terminal and click. The selected control will be encircled by the familiar moving dashed rectangle to indicate its selected status (see FIG. 65b). Moving the cursor off the selected control and clicking will de-select both the terminal and the control. The connected but de-selected terminal will now appear grey to show that it is connected (see FIG. 65c). Connections can be established in the opposite order also: select the control and then select the terminal. At any later time the established associations between terminals in the connector pane and controls or displays on the Front panel can be examined by clicking on either a terminal or a control. The associated elements will both appear selected.

Associations between terminals and controls can be disconnected by selecting the control, holding down the COMMAND key and clicking. All connections can be severed by holding down both the OPTION and COMMAND keys and clicking (cursor must be the wiring tool). This action bring sup the dialog box show in FIG. 66. Choose OK and all associations will be removed and a new terminal pattern can be selected.

Associations between terminals and controls can be disconnected by selecting the control, holding down the COMMAND key and clicking. All connections can be servered by holding down both the OPTION and COMMAND keys and clicking (cursor must be the wiring tool). This action rings up the dialog box shown in FIG. 66. Choose OK and all associations will be removed and a new terminal pattern can be selected.

Once you have created an icon and implemented terminal connections in the connector pane you can use this instrument as a component in another instrument. From the block diagram window, pulling down the FUNCTIONS menu and selecting the INSTRUMENTS option will bring up the familiar dialog box offering a choice of file names in a window. Select the name of the instrument you wish to use in your block diagram. The dialog box will close and the icon associated with your chose virtual instrument will appear in the block diagram window. At this point the virtual instrument object can be manipulated in exactly the same fashion as the functions you have used previously. In the next section a simple hierarchical instrument will be constructed in which two low-level instruments are operated through a controlling virtual instrument.

A Hierarchial Virtual Instrument

The simple hierarchical virtual instrument we will walk through calculates the total resistance for a parallel circuit with two resistive elements;

$$1/R_T = 1/R_1 + 1/R_2$$

Since we must perform several inversion operations to obtain RT, a first instrument to construct is a simple inverter:

Note:
1. In building this hierarchial instrument it is assumed that the reader is familiar with the system as described in earlier sections of this patent application, and has successfully implemented the Fibonacci number generator.
2. To illustrate the construction of this instrument "tiled" windows are used to conserve time and space in generating the figures (see FIG. 26 re TILE option).

The first task, then, is to build a simple inverter. FIG. 67 shows the front panel and block diagram for this instrument. In the block diagram, a constant and a variable quantity are the input to a division operator. The output from the division operation is fed to an "indicator-only" control. The constant has been set to one (in the block diagram. The slide control (with digital display) in the front panel determines the value to be inverted. When these elements have been wired together, their correct function should be verified by setting the slide control in the front panel window should display the inverse of the value specified on the slide control (see FIG. 68). You are now ready to establish the terminal that will accept a value from a higher-level instrument to set the slide control's value in this instrument, and to return the calculated value displayed here to the higher-level virtual instrument.

To obtain the connection pane in the front panel window, pull down the FORMAT menu and select CONNECTOR PANE. This action will display a connector pane in the upper left corner of the front panel window. With the wiring tool selected, "toggle" through the terminal patterns by clicking the mouse button while holding down both the OPTION and COMMAND keys until the two-terminal pattern is displayed (the left-most pane in FIG. 63). Use the wiring tool to select the left terminal and then select the slide control. The terminal will blacken and the slide control will be surrounded by the familiar moving dashed line when they are selected (see FIG. 65) for the consequences of a similar sequence of actions). Click outside the control to complete the connection. The selected terminal will turn grey and the moving dashed line will disappear. The grey terminal is now "connected" to the slide control. The indicated portion of the square connector pane corresponds to the input "hot spot" region on the instrument's to-be-built icon. Select the remaining terminal and connect it to the indicator-only control. In the same fashion as described above, this newly selected region will correspond to the output region on the instrument's icon. When both connections are complete, both terminals in the connector pane will be grey. At this time your screen display should appear similar to FIG. 64b. The next task is to create an icon to use with the inverter instrument.

Review the section on icon editing, set forth above, and create an icon similar to the one shown in FIG. 69.

When your icon has been created, and saved, QUIT the icon editor. The inverter instrument is now ready to be saved. From the FILE menu select CLOSE and save the instrument with a descriptive name, like INVERTER.

Figure 71:
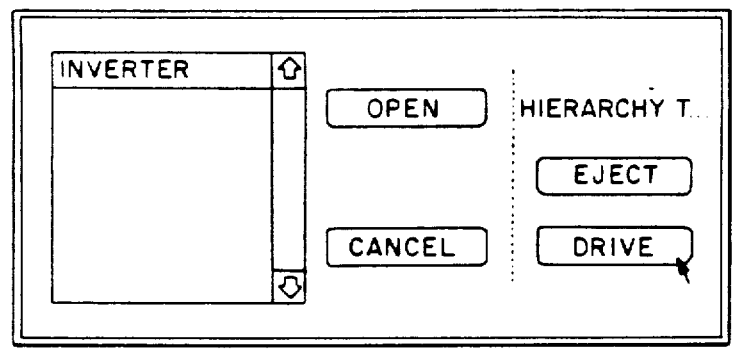
FIG. 71 is an illustration of the dialog box for selecting instrument to drop into block diagram window.

In your next instrument you will use the INVERTER instrument to calculate $1/R_T$ for two resistances in parallel. FIG. 70 shows the front panel and block diagram for an instrument to perform this calculation. At this point, only one new piece of information is necessary to construct this instrument. How to drop the new instrument into the block diagram window. Pull down the FILE menu and select NEW. Pull down the FILE menu again and select OPEN DIAGRAM. Pull down the FORMAT menu and select TILE. From within the block diagram window, pull down the FUNCTIONS MENU and select INSTRUMENTS. A dialog box similar to the one shown in FIG. 71 will appear.

Figure 72:
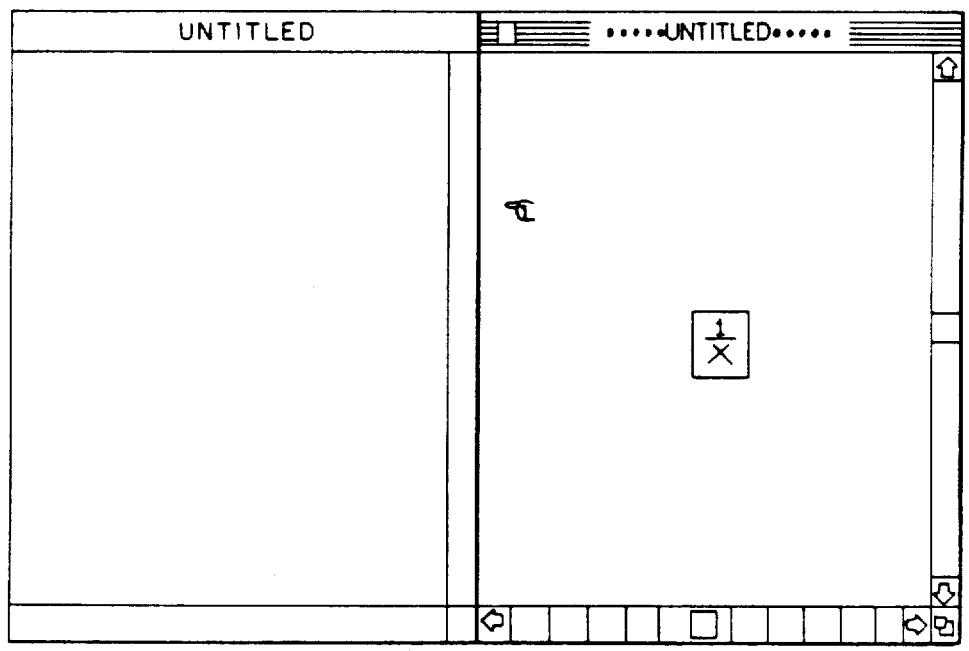
FIG. 72 is an illustration of an user-created INVERTER virtual instrument dropped into block diagram window.
Figure 73:
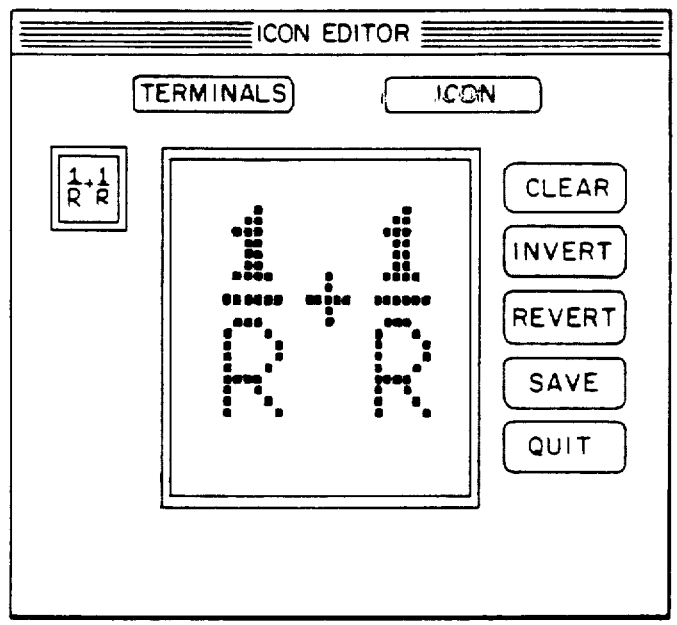
FIG. 73 is an illustration of an icon for user-created invert-and-add instrument.

Unless you have done this before, or are using someone else's system, only one instrument will be available: the INVERTER instrument you just created. Select this instrument by double clicking on the instrument name (or single clicking on the name and then single clicking on the OPEN button). The dialog box will disappear and your icon for the inverter instrument will appear in the block diagram window (see FIG. 72). This icon now represents an object that can be moved about in the block diagram window just like the pre-defined functions and structures you have previously used. The "hot spot" for wiring to and from the instrument are the ones you specified when you connected the terminals in the connector pane. As defined above in the connector panel, the left half of this icon's area accepts inputs to the control which it is wired and the right half provides output from the lower-level instrument's indicator-only control.

Verify that the virtual instrument correctly (see FIG. 70) displays the sum of the inverses of the two resistances set with the two front-panel controls on the present instrument. Now use the icon editor to construct an icon for this instrument. FIG. 51 shows the one used here. Finally, assign terminals to the controls and display in the connector pane. Use the 2-to-1 terminal pattern (second from the left in FIG. 64). Close and name the instrument.

Armed with the two low-level instrument you have created you are ready to implement a solution to the problem set: compute $R_T$ for two resistances wired in parallel. FIG. 74 shows the example solution to the problem. Two controls are provided to provide the two resistances to be summed and an indicator-only control is implemented to display the answer. The block diagram window shows the two quantities specified by the front panel controls as input to the invert-and-add instrument (here named ADD1OVERR, see FIG. 75). The output from this instrument is input to the inverter to yield the solution, $R_T$, shown in the display of the front panel window. Use several different values for input to verify the correct operation of your instrument (see FIG. 75).

At this point you have created a hierarchical virtual instrument using native preferred embodiment functions and two user-created instruments. Hierarchical virtual instruments work. Libraries of instruments can be created and selected instruments can be used as components in new instruments. With the principles demonstrated in this exercise you should be able to carry out your assignment and create libraries of instruments that perform functions useful to you as an end-user.

ADDITIONAL FEATURES

Parallel virtual instruments

Before describing parallel virtual instruments (VIs) additional explanation regarding of the execution description will be provided. Referring once again to FIG. 19b, a node (icon or structure) begins execution when all its inputs are available. If a diagram has two or more icons referring to the same VI and a second one has all its inouts available before the first finishes execution it is not always clear how to handle this second node. In fact, it depends on the "execution mode" of the VI. Absent some way to execute VIs in parallel, VIs would be executed in serial. In a serial mode of execution, the second node is placed on a FIFO queue associated with the VI and execution of the VI in the context of the second node is delayed until the execution in the context of the first node is completed.

Furthermore, if the VI is a code type VI (i.e., it has an icon and front panel but code instead of a diagram) then it executes "atomically" (from start to finish without any other LabVIEW component intervening, because there is just one computer). Atomic execution is not relevant to diagram VIs.

Parallel execution dynamically creates multiple instances of the VI at execution time in order to allow multiple nodes to execute in parallel. In the current version of LabVIEW parallel execution is implemented for certain built-in code VIs. However, it can be implemented for diagram VIs as well.

Asynchronous execution is a related alternative behavior for code type VIs. In this case a code type VI does not execute in parallel (i.e., the second node is enqueued) but neither does it execute atomically. This allows other LabVIEW components to execute in parallel with an asynchronous code VI.

Figure 76:
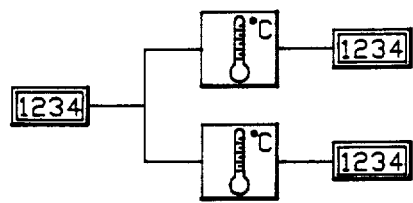
FIG. 76 illustrates serial execution mode.
Figure 77:
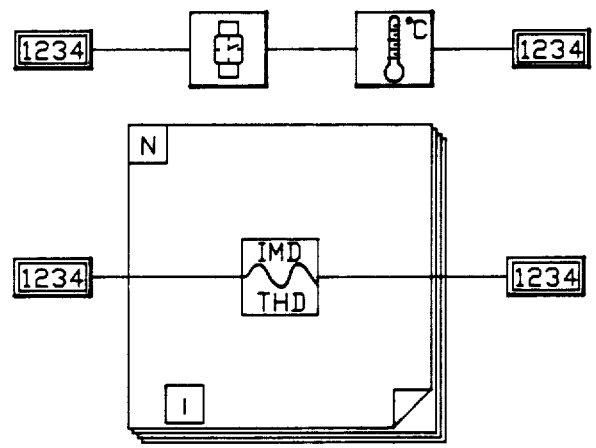
FIG. 77 illustrates "wait" icon execution.
Figure 78:
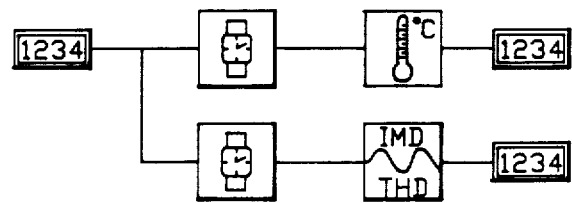
FIG. 78 illustrates the parallel execution mode.

FIGS. 76–78 illustrate serial and parallel execution modes. In FIG. 76, one "thermometer" icon must wait until the other finishes execution before it can start, even though it has all its inputs at the same time as the other. This is because the "thermometer" VI is a serial VI.

In FIG. 77, the asynchronous behavior of the wait VI (the watch icon). It is a code type VI that does not execute atomically. During the time that it is executing (waiting) other components of the diagram may execute.

In FIG. 78, both "wait" icons execute at the same time showing the parallel execution mode of the wait VI. If execution were not parallel either the "thermometer" VI or the "IMD/THD" VI would effectively wait for the sum of the time delay intervals caused by the two "wait" Vis together.

LabVIEW can be embodied in software, hardware, or a combination of both. One way to implement a parallel VI in hardware is to have enough instances of the hardware to account for the maximum number of VI instances that must run in parallel.

The present invention provides the ability of a virtual instrument (with icon, front panel, and diagram or code) to be a template and effectively automatically replicate itself as necessary in order to allow multiple instances to run in parallel.

Figure 79:
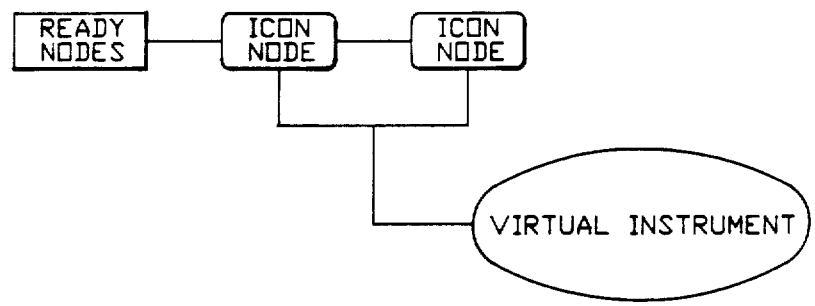
FIG. 79 illustrates a ready mode lost.

A node is executed when all its inputs have data ready. When this happens the node is put on a list of ready nodes. This is illustrated in FIG. 79. One by one the ready nodes are taken off the list and executed. When more than one of the ready nodes are icon nodes which refer to the same virtual instrument the scheduling of the execution depends on the mode of the virtual instrument. The possible modes are serial, parallel and atomic.

Atomic Mode (Code Instruments)

Figure 80:
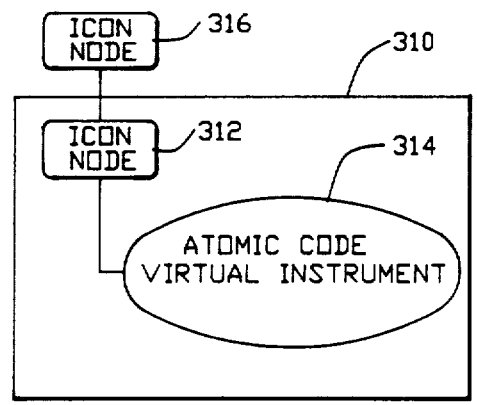
FIG. 80 illustrates atomic execution mode.

Virtual instruments which have code instead of a block diagram must generally execute all at once without interruptions because there is but one processor on the computer. The contending nodes in this mode wait on a list of nodes and execute the code one at a time. This is the mode in which most code instruments are implemented. FIG. 80 illustrates this form of execution. The dashed box 310 contains the node 312 which is currently executing the code for the virtual instrument 314. The node 316 outside the dashed box 310 must wait for the node 312 inside the box to finish the use of the Virtual Instrument's code.

Serial Mode (Block Diagram Instruments)

Figure 81:
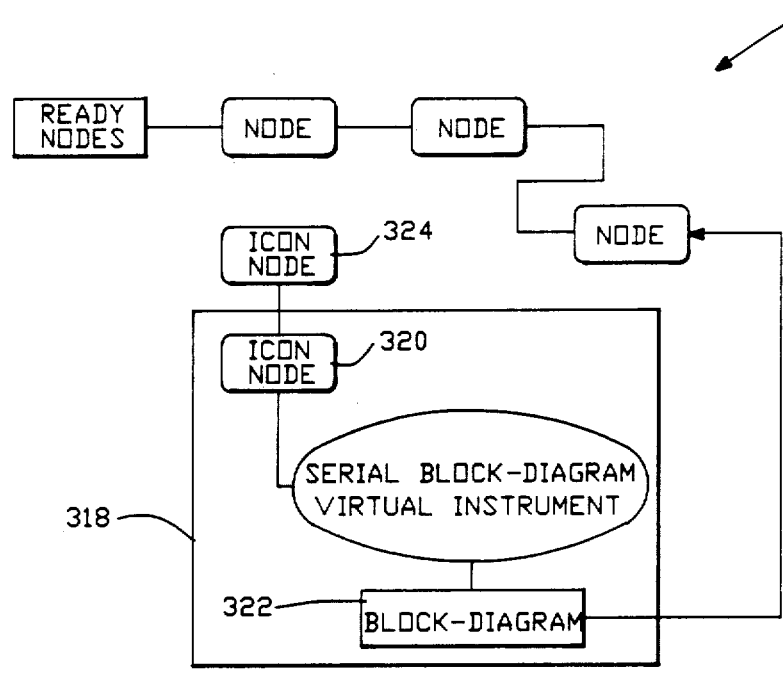
FIG. 81 illustrates serial execution mode.

Like atomic mode, serial mode instruments place contending nodes on a list of nodes which execute the block diagram of the virtual instrument in turn. Because the block diagram of an instrument consists of more nodes which will become ready, the execution of the block diagram instrument is not atomic. The nodes of the diagram are put onto the ready node list as they become ready and are "interleaved" with ready nodes from other diagrams. This is illustrated in FIG. 81. The dashed box 318 once again contains the node on whose behalf the block diagram 322 of the virtual instrument is executing. The node 324 outside the dashed box must wait for the diagram to complete before it gets its turn. The arrow from the block diagram to the Ready Nodes list 326 shows that the block diagram 322 will produce more ready nodes which will be added to this list.

Parallel Mode (Code virtual instruments)

Certain code virtual instruments may execute non-atomically because the code portion of the instrument has been structured into increments each of which is atomic in its execution. Between the execution of the increments other activity, such as the execution of another node or another code increment, may take place. Code virtual instruments which poll for an external event (passage of time, signal from a I/0 channel etc) are implemented such that each atomic execution of an increment of code checks for the polled condition once on behalf of all nodes queued to the virtual instrument.

Figure 82:
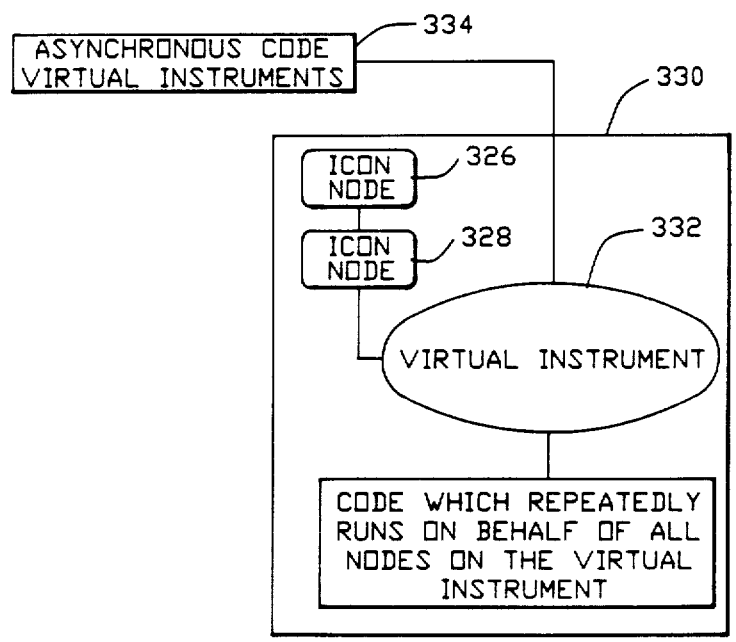
FIG. 82 illustrates parallel execution mode for code virtual instruments.

Thus, all contending nodes share the execution of the code. The key feature which makes this mechanism possible is the addition of an asynchronous virtual instruments list on which a parallel code virtual instrument is placed. In each cycle of the main program loop of LabVIEW, this list is checked and each virtual instrument on it executes one increment of its code on behalf of all nodes on its queue of ready nodes. This is illustrated in FIG. 82. In FIG. 82, both of the nodes 326 and 328 are within the dashed box 330 because the code increment which executes does so in behalf of all nodes ready for the virtual instrument. Note that the virtual instrument 332 is on the Asynchronous Code virtual instruments list 334.

Parallel Mode (Block Diagram virtual instruments)

Figure 83:
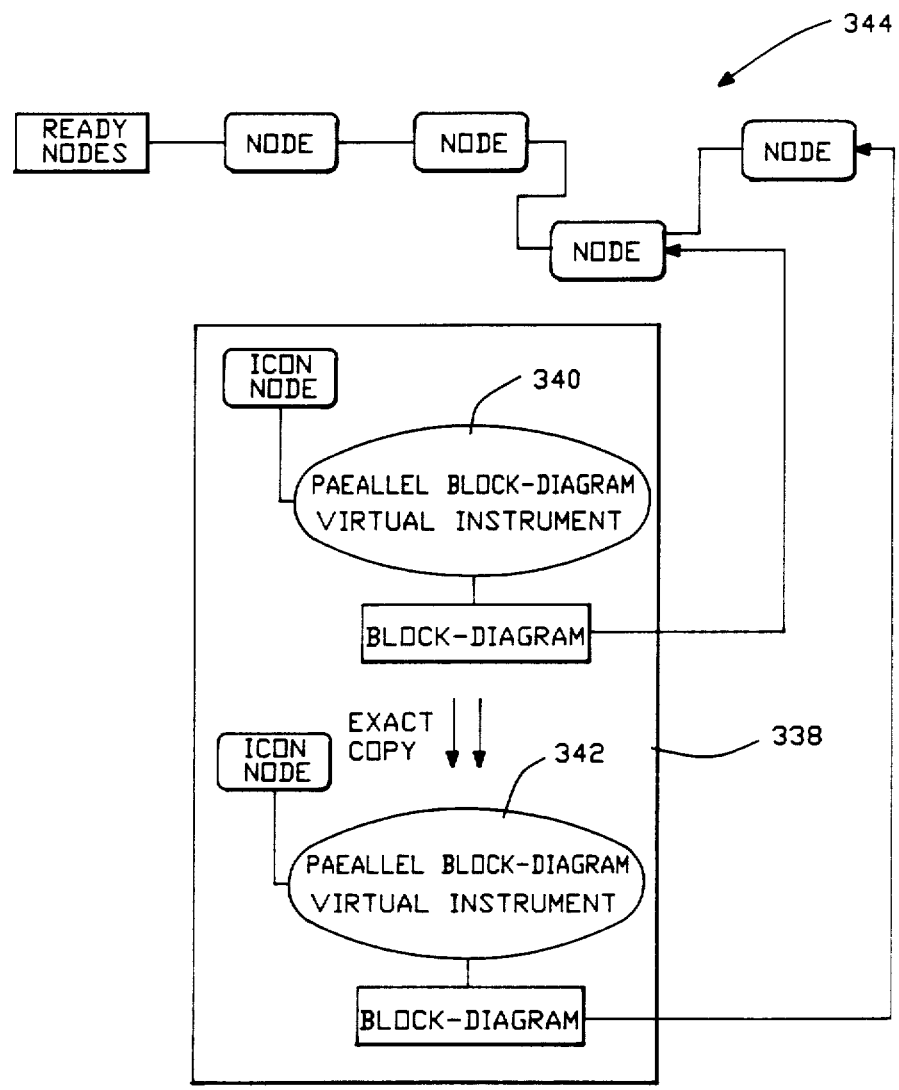
FIG. 83 illustrates parallel execution mode for block diagram virtual instrument.

Block diagram instruments can be built to execute in parallel mode; although in the present invention code is only partially in place to accomplish it. The means of making parallel execution possible for block diagram instruments is by using the instrument as a template to make identical copies of the instrument automatically as needed for contending nodes. Each block diagram then executes, producing ready nodes for the Ready Nodes list in such a way that the nodes can be "interleaved" and the execution of the identical diagrams takes place "at the same time". This is illustrated in FIG. 83. Inside the dashed box 338 the replicated virtual instrument 340, 342 is shown and each node has "its own copy" of the instrument. Both diagrams are shown putting ready nodes onto the Ready Nodes 334 list.

Execution States

The fundamental capability which execution states permit the interactive operation of more than one virtual instrument at a time, as well as the construction or editing of some virtual instruments while others are executing.

When a VI is interactively started (i.e., run from its front panel) it enters its active state. It remains active until it completes, at which time it returns to its idle state. At the point it becomes active all lower level VIs are "reserved". This prevents them from being changed (a change could result in an execution error). A reserved VI executes in the context of one or more icon nodes within the diagrams of one or more higher level VIs. It is unreserved when all those higher level VIs become idle.

Reserved VIs can have their front panel and block diagram windows open while they execute. This ability to observe VIs at any and all levels of the hierarchy while they execute is a powerful troubleshooting aid. While a VI is reserved it may not be edited; however the values assigned to its front panel controls may be changed. Depending on the design of the VI and the point in time when the control value is changed such a change may produce unexpected results.

A "breakpoint" may be set so that a reserved VI enters its "suspended" state when it is about to execute. "Suspended" is similar to idle in that the VI can be run interactively one or more times. However, a suspended VI can be resumed (passing its outputs back to the icon node) and reenter its reserved state. It can actually be resumed without running it at all. While it is suspended its indicators (outputs) can be modified as well as its controls (inputs). This capability enables top-down implementation and testing. "Stub" VIs can be built (icons and front panels but no diagram or code), and their execution simulated by setting the breakpoint, supplying relevant outputs when the VI becomes suspended, and then resuming.

Breakpoints have been used in conventional programming languages, but there is no analogy in instrumentation systems. A related but different analogy in instrumentation is remote/local/loosely related to related to reserved/idle (no analogy to suspended). Stubs are known in programming but not in hardware or instrumentation development.

The present invention provides the ability of VIs to exist in different states in order to protect execution from editing changes. Furthermore, it provides the ability to change the value of a VI indicator (output) while it is in its suspended state.

TABLE

| UI Kinds | VI Features |
|---|---|
| Block Diagram | Calls block diagram, built-in code, or code resource VIs |
| Code Resource | Calls built-in code VIs (when dynamic link possible) |
| Built-in Code | Calls built-in code VIs |

VI Execution Modes

Atomic (code)
Serial
Parallel all code VIs (except primitives) should have diagrams for documentation purposes.
Code VIs calling other code VIs should be able to use or bypass front panel argument passing (and coercion, etc.)

all code VIs (except primitives) should have diagrams for documentation purposes. Code VIs calling other code VIs should be able to use or bypass front panel argument passing (and coercion, etc.).

Controls

Figure 84:
FIGS. 84–94 illustrate various virtual instrument execution states.

As illustrated in FIG. 84, whenever a token is propagated to a control the control is set to its normal or error state depending on whether the value of the token is in or out of range for the control.

Signals

Figure 85:
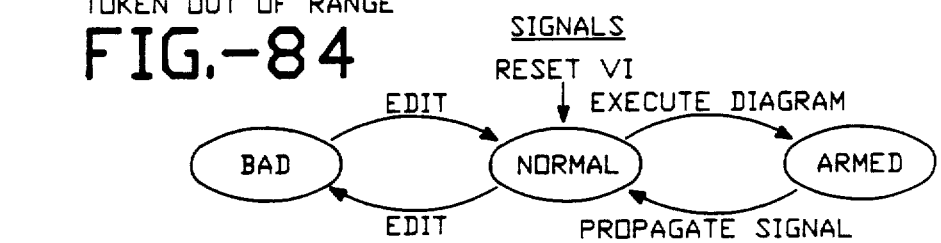

In FIG. 85, after a wiring change or a control type, dimension, direction, or unit change the type propagation code will set each signal to bad or normal. The VI is not executable unless all its signals are normal. When a diagram is about to be executed all its signals are set to their armed state. When a signal is propagated from its source node it is set to its normal state. When the owning VI becomes idle all remaining armed signals are set to their normal states.

Diagrams

Figure 86:
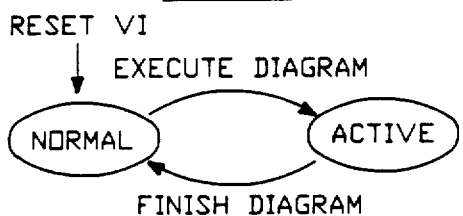

In FIG. 86, when a diagram begins execution it is set to its active state. When it finishes it is set to its normal state. When the owning VI becomes idle all active diagrams are set to their normal states. The diagram state is needed only for reset to be able to identify the active diagram of a select or sequence structure.

Self Reference Nodes

Figure 87:
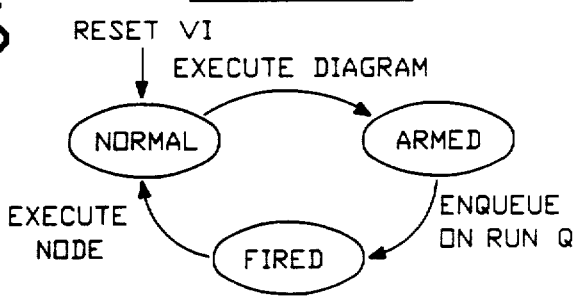

In FIG. 87, when a diagram is about to be executed the self reference node as well as all the other nodes in the diagram are set to their armed states. When all the other nodes have finished executing the self reference node is scheduled to run by being placed on the run queue. At that point it is set to its fired state. When it is removed from the run queue and executed, signaling the completion of the diagram, it is set to its normal state. When the owning VI becomes idle all remaining armed self reference nodes are set to their normal states.

Structure Nodes

Figure 88:
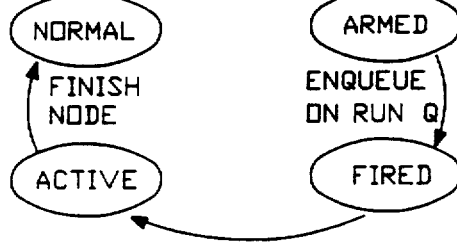

In FIG. 88, when a diagram is about to be executed all the nodes in the diagram are set to their armed states. When a node's short count is decremented to zero it is scheduled to run by being placed on the run queue. At that point the node is set to its fired state. When it is removed from the run queue and begins execution it is set to its active state. When the subdiagrams) finish (the required number of iterations) the structure node is set to its normal state and its outputs are propagated. When the owning VI becomes idle all remaining armed structure nodes are set to their normal states.

Instrument Usage Nodes

Figure 89:
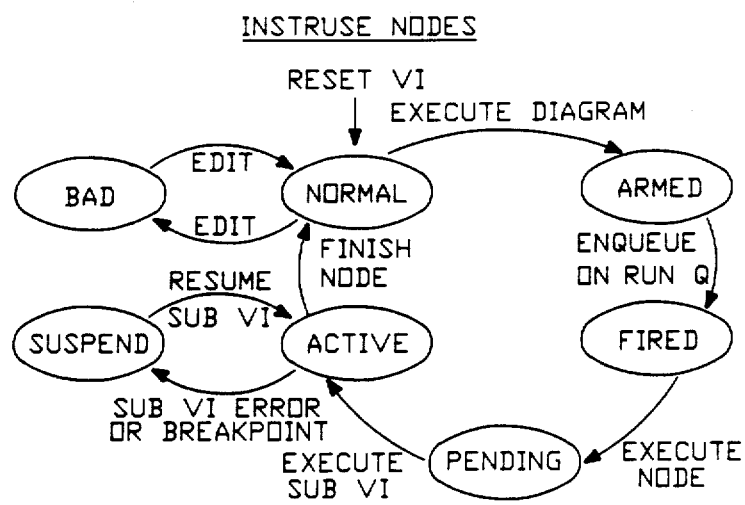

In FIG. 89, after a load operation or a change to the front panel of the sub VI the linking code will set the node to bad or normal (a node is bad also if the link is good but the sub VI is not executable). The owning VI is not executable unless all its nodes are normal. When a diagram is about to be executed all nodes are set to their armed states. When a node's short count is decremented to zero it is scheduled to run by being placed on the run queue. At that point the node is set to its fired state. When an instrument usage node is removed from the run queue and enqueued on the sub VI's ready queue it is set to its pending state. When the sub VI actually begins execution in the context of the calling node the calling node is set to its active state. When the sub VI completes normally and the calling node is dequeued from the VI's ready queue the calling node is set to its normal state. If the referenced VI is stopped in its suspended state or executing in its retrying state the calling node is set to its suspended state. When the owning VI becomes idle all remaining armed nodes within it are set to their normal states.

Serial virtual instruments

Figure 90:
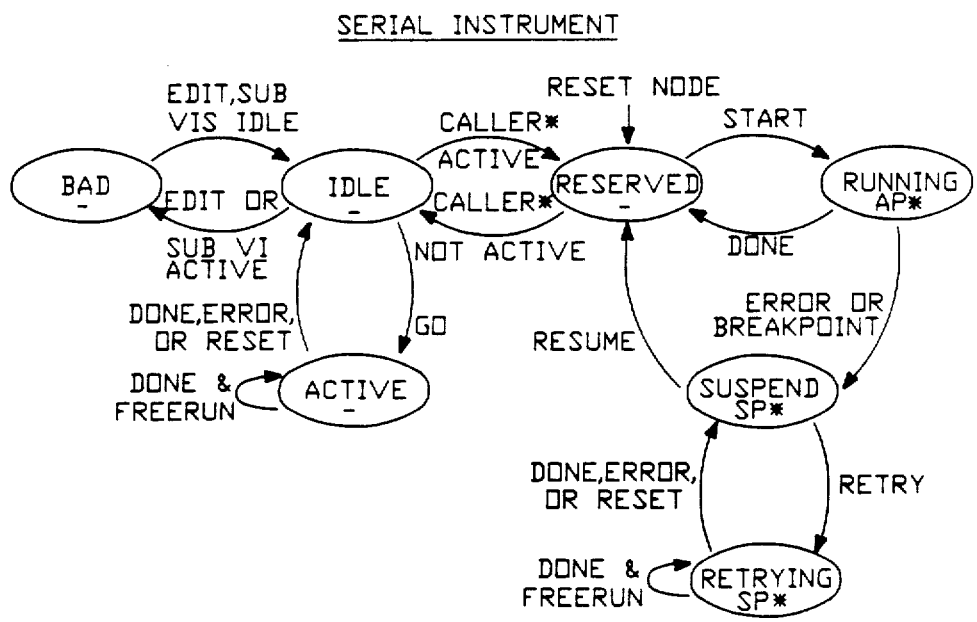

In FIG. 90, after a block diagram edit operation the type propagation code sets the VI to its bad or normal state depending on the presence of bad signals or nodes (a serial VI is bad also if any sub VI is not executable, or if it or any sub VI contains a recursive reference to it). When the go button is hit the VI in the front window (panel or diagram) is set to its active state. At this point all of its sub VIs and all of theirs, etc., are set to their reserved states. When the VI completes normally or with an error it is placed in its idle state. If the reset button is hit while the VI is in its active state it is placed in its idle state, and all nodes in their pending, active, or error states are reset (which may involve resetting their sub VIs). When a VI enters its idle state from its active or reserved state each of its sub VIs still in its reserved state checks all its callers to see if it too can return to its idle state.

When a reserved VI actually begins execution in the context of a calling node it is placed in its running state. Whenever as VI has to abort execution because its calling node is being reset it is placed in its reserved state (it may subsequently have the opportunity to discover whether it should return to its idle state).

If the VI has a breakpoint set or if it detects an error on a control then instead of being placed in its running state at the start of execution it is placed in its suspended state.

When a VI completes normally it is placed back in its reserved state. If a VI detects an error on an indicator the VI is placed in its suspended state. When the retry button is hit the VI is placed in the retrying state. If the VI then completes normally or with an error or if the reset button is hit it is placed in the suspended state. A suspended VI is placed in the reserved state when the resume button is hit.

Front panel controls can be adjusted in any VI state but the effects are nondeterministic except for the idle and suspended states. Edit changes to the front panel or block diagram are not allowed in any state except idle and bad. The go button is inoperative except in the idle state. The reset button is inoperative except in the active and retrying states. The resumer and retry buttons are inoperative except in the suspended state.

While the VI is in its running, suspended, or retrying state, additional pending nodes may be enqueued on its ready queue. When the current node is completed it is dequeued from the ready queue, the next one is set active, and the VI begins execution in its context. A serial VI typically does not complete the execution immediately but rather requires one or more calls to its asynchronous advance routine before it can complete.

Atomic virtual instruments

Figure 91:
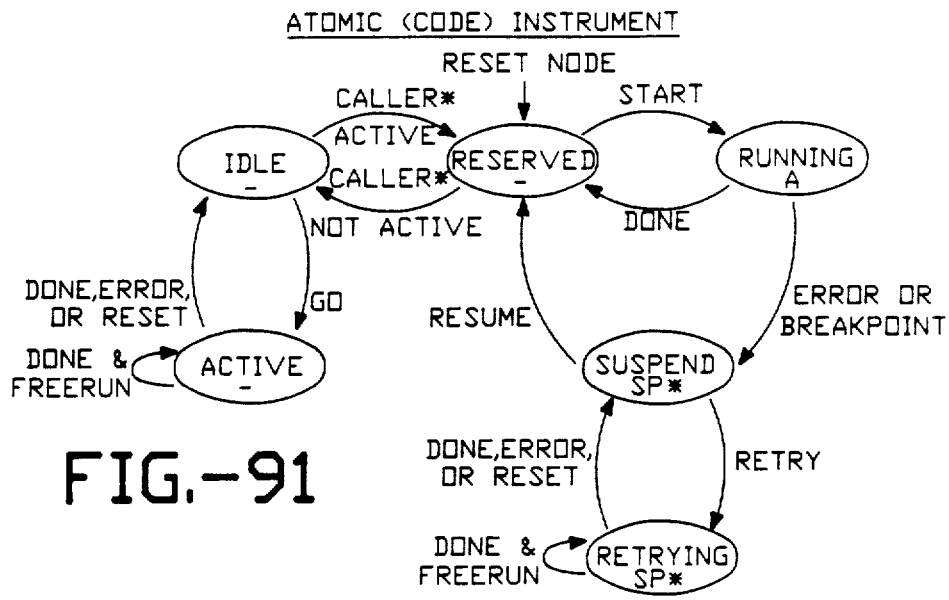
Figure 92:
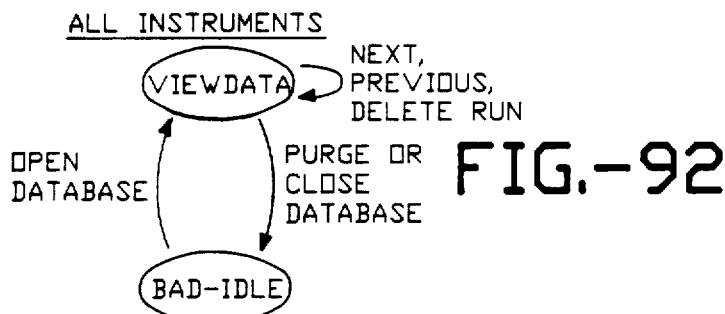

In FIG. 91, an atomic VI is similar to a serial VI except that it has no bad state and it always completes its execution immediately. This means that its ready queue usually has only one node. However, while an atomic VI is in its suspended or retrying state additional pending nodes may be enqueued on its ready queue. And just like the serial VI case, when the current node is completed it is dequeued from the ready queue, the next one is set active, and the VI begins execution in its context.

Parallel Built-in or Code Virtual Instruments

Figure 93:
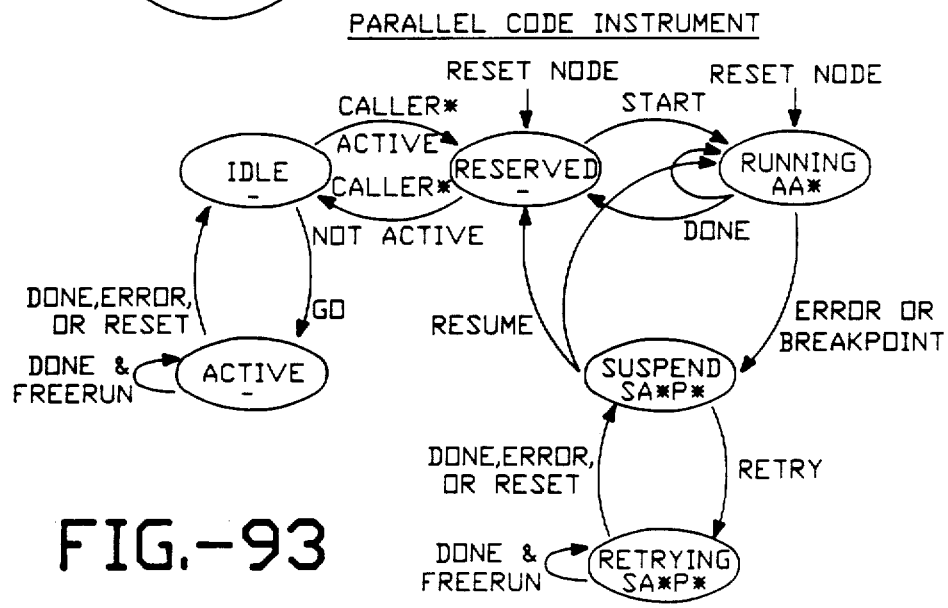
Figure 94:
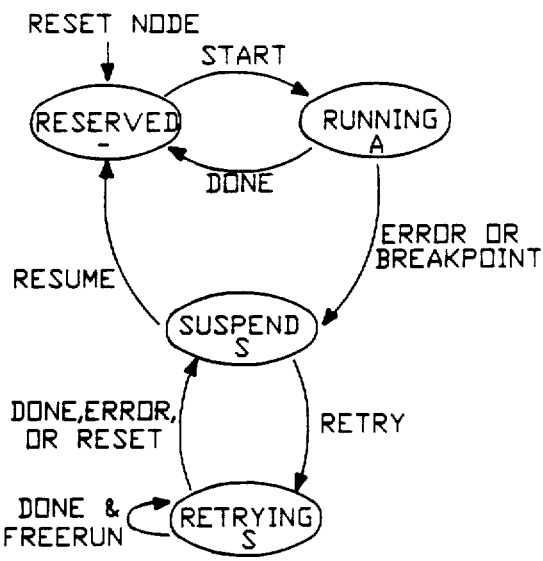

In FIG. 93, a parallel built-in or code VI is similar to a serial VI except it has no bad state (yet). It also may have multiple active nodes on its ready queue. Its advance routine advances the execution of all the active nodes and notifies the VI when one has completed (it moves it to the front of the ready queue for this purpose). If an error is detected at the start or at the completion of the VI execution the VI enters its suspended state (the offending node is guaranteed to be the first on the ready queue). While the VI is in its suspended or retry state the advance routine does not complete any nodes and any pending nodes that are enqueued on the VI's ready queue are not started until the VI resumes.

Parallel Block Diagram virtual instruments

Figure 95:
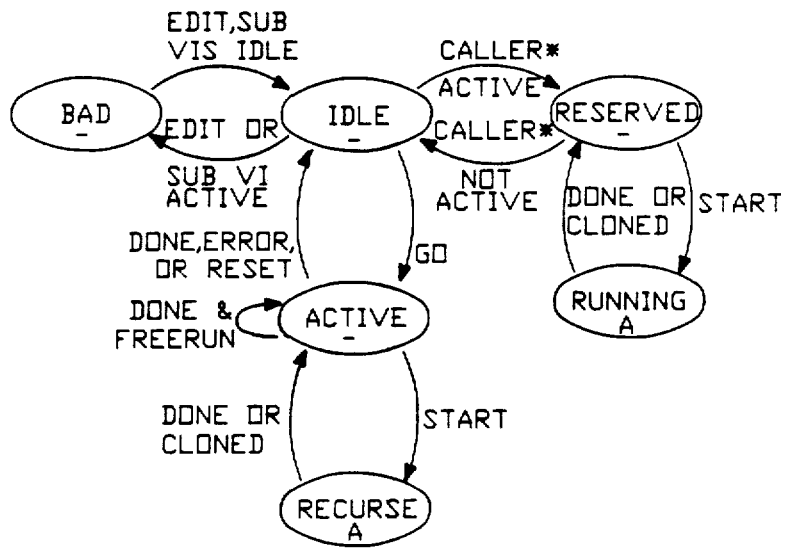

In FIG. 95, a parallel block diagram VI is similar to a serial VI except it has no suspended or retrying states. When a parallel VI actually begins execution in the context of a calling node (other than dataKind) a clone is created and placed in its running state. FIG. 93 illustrates a clone. When the clone completes normally it is discarded. The clone is discarded also whenever it has to abort execution because its calling node is being reset. If the VI has a breakpoint set then instead of placing the clone in its running state it is placed in its suspended state. The execution behavior of a VI clone is similar to that of a reserved serial VI. DataKind nodes do not cause a clone to be created because they complete atomically and cannot produce errors or be suspended.

| State Indication and Transition Methods |
| --- |
| Controls and indicators: |
|     normal: normal image |
|     error: gray indicator |
| Signals: |
|     Bad: grayed |
|     Normal: normal wire pattern |
|     Armed: normal width light gray line |
| Nodes: |
|     Bad: Grayed out icon |
|     Normal: Normal image |
|     Armed: ? |
|     Fired: ? |
|     Pending: ? |
|     Active: ? |
|     Error: ? |
| VIs: |
|     Bad: go button absent |
|     Idle: go button present |
|     Active: reset button in place of go button |
|     Reserved: reserved indicator in place of go button |
|     Running: running indicator in place of go button |
|     Suspended: retry button in place of go button, resume button present |
|     Retrying: reset button in place of go button, resume button disabled |
|     Error on VI Control: go button disabled |
|     Error on VI Indicator: resume button disabled |

Figure 96:
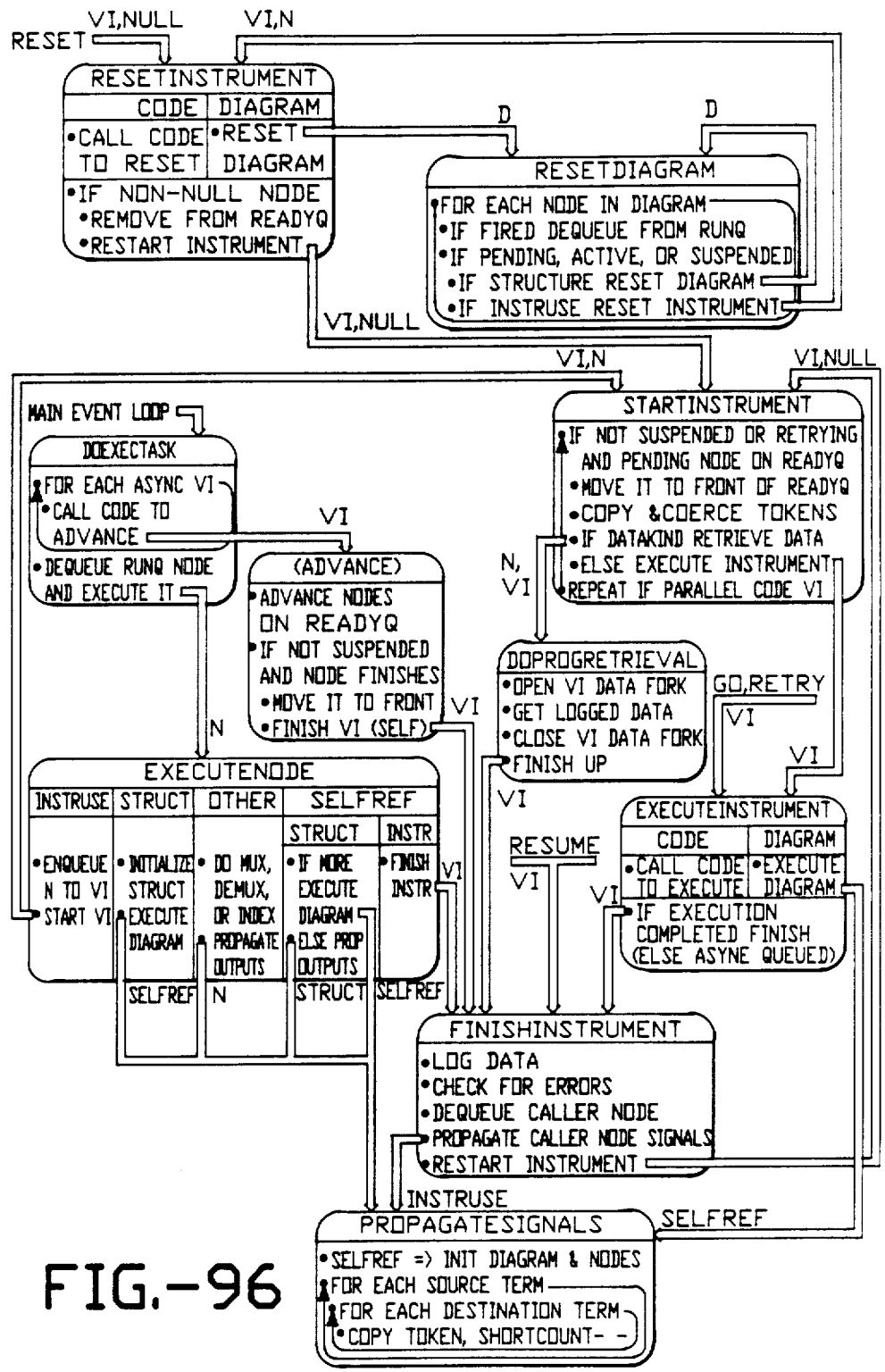
FIG. 96 illustrates an execution road map.

The drawings of FIG. 96 and the flow chart of Appendix B which explains the drawings of FIG. 96 further explains execution states. Appendix B is incorporated herein by this reference.

Execution States

The fundamental capability which execution states provides the interactive operation of more than one virtual instruments at a time, as well as the construction or editing of virtual instruments while others are executing.

Figure 97:
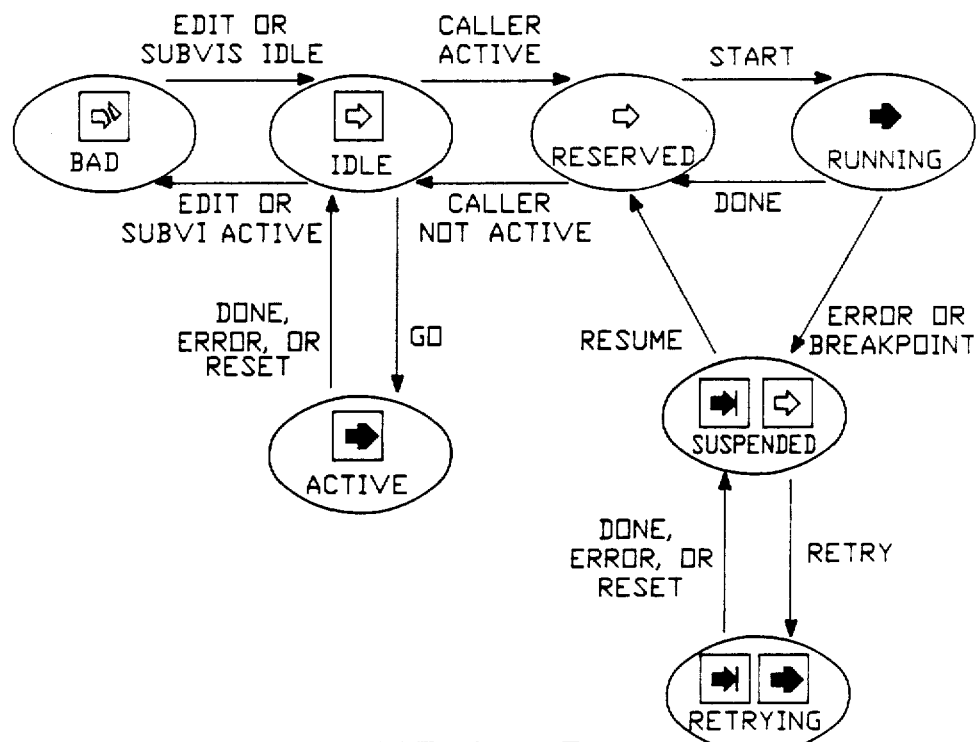
FIG. 97 illustrates execution state symbols.

The execution state diagram is shown in FIG. 97. State information is maintained internally for each virtual instrument. When the VI is in the front window, the state information for that VI is shown on the control palette by the one or two controls shown within each state in FIG. 97.

When the VI is interactively started (i.e., run from its front panel) it enters its active state. It remains active until it completes, at which time it returns to its idle state. At the point it becomes active, all lower level VIs are "reserved". This prevents them from being changed (a change could result in an execution error). A reserved VI executes in the context of one or more icon nodes within the diagrams of one or more higher level VIs. It is unreserved when all those higher level VIs become idle.

Reserved VIs can have their front panel and block diagram windows open while they execute. This ability to observe VIs at any and all levels of the hierarchy while they execute is a powerful trouble-shooting aid. While a VI is reserved it may not be edited; however the values assigned to its front panel controls may be changed. Depending on the design of the VI and the point in time when the control values is changed such a change may produce unexpected results.

Figure 98:
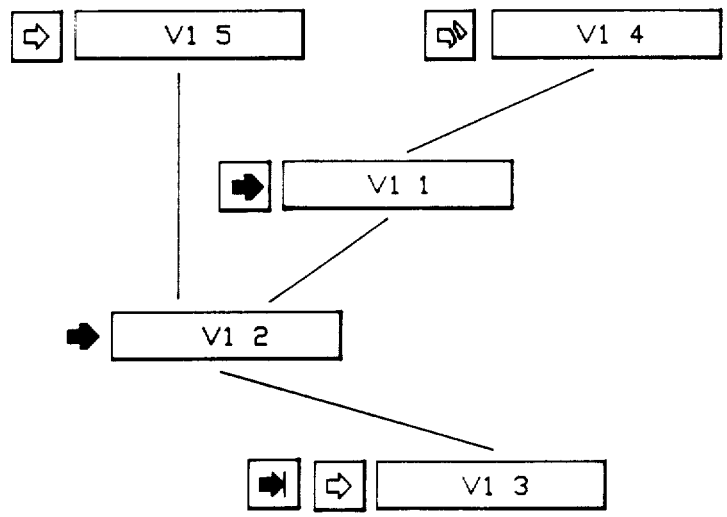
FIG. 98 illustrates virtual instruments in various execution states.
Figure 99:
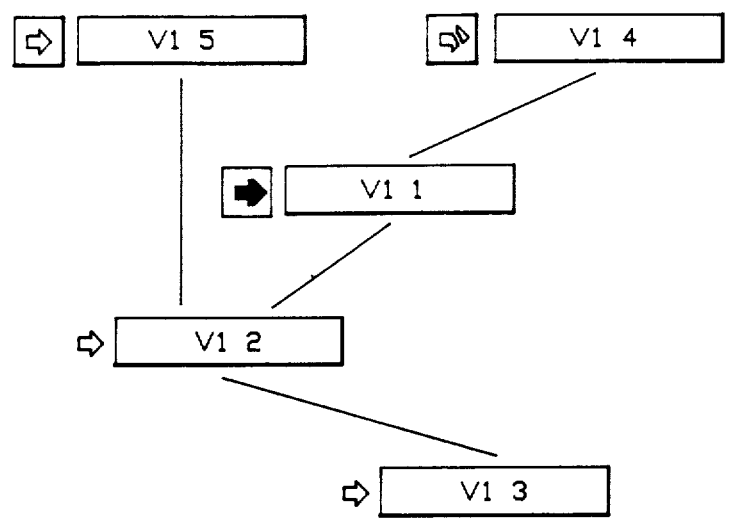
FIG. 99 illustrates virtual instruments in various execution states.

FIG. 98 and FIG. 99 show five VIs in various stages of execution. The purpose of this example is to show how the change in state in one VI may cause state changes in other VIs, both above and below in the hierachy. Assume all VIs have been loaded into LabVIEW and all are initially in the idle state. FIG. 98 shows the execution states of all of the VIS after VI 1 is interactively started. Notice the changes caused in the execution states of VI 1's sub-VIs, VI 2 and VI 3, which are now reserved. They may not be edited or executed interactively. Notice also the state of VI 4. It is in the bad VI state because a sub-VI is active. VI 4 may not be executed interactively, but editing is allowed. If VI 4 was allowed to be executed interactively, it would attempt to reserve VI 1, which is already active. There is no transition from active to reserved in the state diagram, so we must guarantee that a VI cannot become active if any of its sub-VIs are already active. VI 5 has not changed states. It may be edited or executed interactively. One of its sub-VIs is reserved, but that does not affect the state of VI 5.

Setting breakpoints is a useful debugging tool. Stopping on a breakpoint is implemented with execution states. A "breakpoint" may be set so that a reserved VI enters its "suspended" state when it is about to execute. Suspended is similar to idle in that the VI can be run interactively one or more times. However, a suspended VI can be resumed (passing its outputs back to the icon node) and reenter its reserved state. It can actually be resumed without running it at all. While it is suspended its indicators (outputs) can be modified as well as its controls (inputs). This capability enables top-down implementation and testing. "Stub" VIs can be built (icons and front panels but no diagram or code) and their execution simulated by setting the breakpoint, supplying relevant outputs when the VI becomes suspended, and then resuming.

Breakpoints are known in conventional programming languages, but there is no analogy in instrumentation systems. Stubs are prior art in programming but not in hardware or instrumentation development.

FIG. 99 shows the control palette execution state buttons corresponding to the VIs when VI 3 becomes suspended. A breakpoint was set on VI 3, and execution is suspended before it is executed. VI 1 is still active, VI 2 is running, and VI 3 is suspended. The VI states of VI 4 and VI 5 do not change.

The system is protected from executing with an error on the block diagram (wiring error). If the VI is in the bad state, the VI may not be executed interactively, or programmatically by a higher level instrument. When a VI becomes bad, all of its callers are also bad because they now contain a bad sub VI. When a VI changes from bad to idle, all of its callers are notified of the state change and they must check to see if any of their sub VIs are still bad. This guarantees that when a VI is interactively executed, it does not contain errors on the block diagram or any sub VI block diagrams.

To protect execution from editing changes that may cause errors, editing is not allowed except in the idle or bad state. Since the system guarantees that there are no block diagram errors when the execution begins, and no editing is allowed during execution, no diagram errors will be encountered during execution.

The present invention provides the ability of VIs to exist in different states in order to protect execution from editing changes. Furthermore, the ability of VIs to have a breakpoint and suspended state to enable top-down implementation (running a top level VI without having all the sub-VIs finished yet). Also, it provies the ability to change the value of a VI indicator (output while it is in its suspended state.

Appendix C includes source code listing useful in implementing the execution of different VI states. Appendix C is incorporated herein by reference.

Strip Chart Displays

Before describing strip charts a clarification of the execution is required.

When a control or indicator is placed on the front panel of a VI a terminal corresponding to it is placed in the diagram. It is possible to place this terminal within a subdiagram of a structure. Whenever data is propagated to a terminal of a control or indicator its representation on the front panel is updated (if the front panel window is open). If a terminal is placed within a loop then data may be propagated to/from that terminal multiple times. This is the basis of the "real-time display" capability in LabVIEW: the front panel representation is updated before the data is actually available outside the loop structure in the diagram.

A strip chart display extends the real time display cability because it shows previous as well as current data. This is a new capability in LabVIEW. It is important in interactive control systems.

Strip charts are known in instrumentation systems. They exist in the form of paper scrolling past a moving pen. Electronic displays typically do not simulate scrolling paper because of the graphics performance required. They "wrap around" instead (e.g. oscilloscopes). A more realistic simulation of scrolling paper results in a significant advantage: the latest value is always displayed adjacent to the vertical scale. It is much easier to keep your eye on that fixed region of the screen than it is to scan your eye in sync with a wrap around display.

The strip chart appears to be an array of data on the front panel, but its appearance on the diagram is a scalar. This is made possible by storing the previous data with the strip chart display itself instead of external to the strip chart display.

Multiple-pen and higher dimensional analogs of the strip chart are also possible.

The present invention provides the ability of a front panel control or indicator to retain previous values and effectively appear to be higher dimensional than its corresponding terminal on the block diagram. Additionally, it provies the ability of a strip chart display to scroll the data in graphical form (along with the background grid, if shown) with new data values being appended at a fixed horizontal or vertical) position (as opposed to a wrap around technique).

INSERT SEVEN

Figure 100:
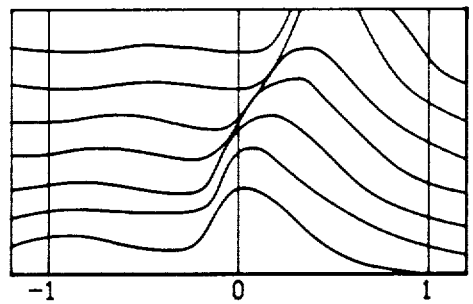
FIG. 100 illustrates s scrolling waterfall graph.
Figure 101:
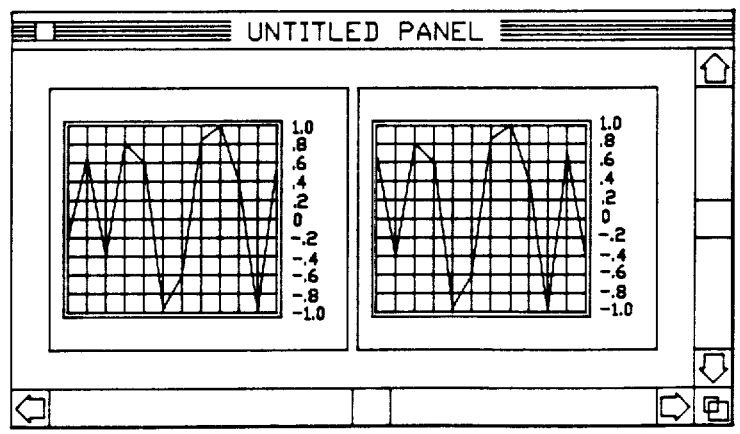
FIG. 101 illustrates a strip chart recorder.

An example of higher dimension strip chart is provided in FIG. 100 which illustrates a two-dimension scrolling waterfall graph. As each new curve is plotted at the bottom of the graph, the display scrolls upwards.

Details of Strip Chart Recorder Construction and Operation

The strip chart recorder's appearance in the context of a LabVIEW front-panel window is illustrated by the pair of strip charts in FIG. 100.

The strip chart on the right shows how the display looks after sending a new data item to the strip chart on the left. The display is scrolled to the left, and the new point is plotted at the scale and connected to the previous plot.

The strip chart recorder is a specialization of the numeric data-type front panel control; its data structure and operation is illustrated in the following FIG. 102.

Figures 102, 103:
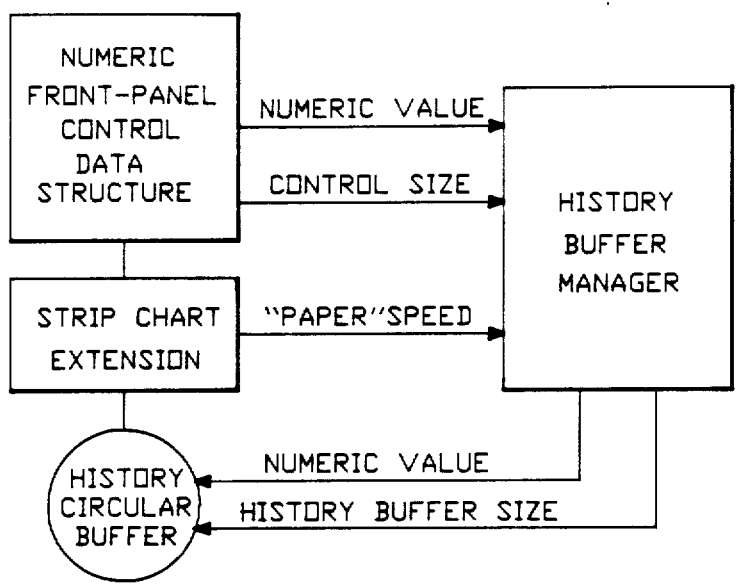
FIG. 102 illustrates a block diagram of strip chart recorder operation.
FIG. 103 illustrates a relational data base.
Figure 107:
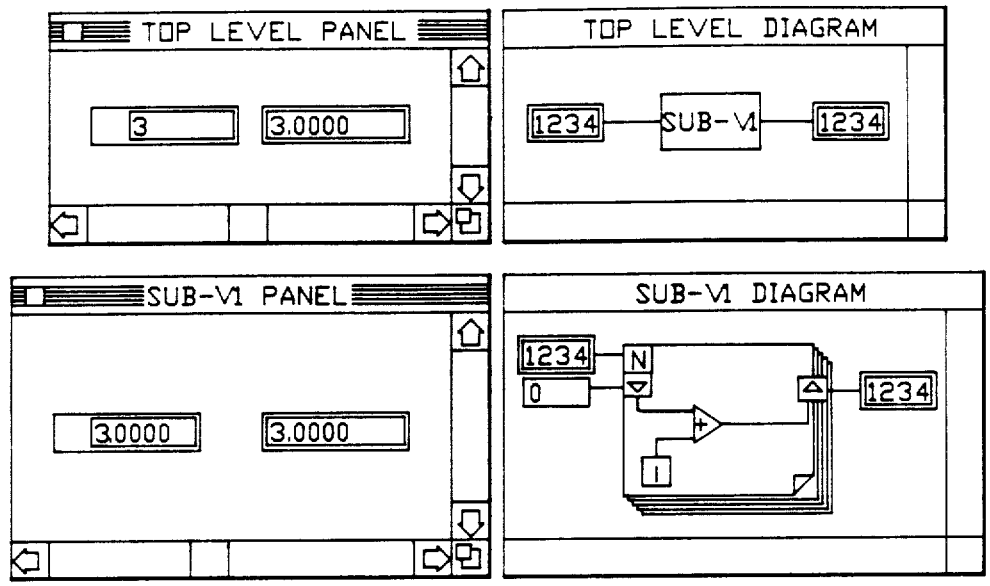
FIGS. 107–110 illustrates LabVIEW error handling.

In FIG. 102, the heavy black lines show data structures; the box drawn with dashed line represents procedures used to manipulate the data structures.

The strip chart recorder aguments the data structure common to all numeric front-panel controls with additional data structures for storing some number of previous values that have been sent to the strip chart for display (the "History Circular Buffer") as well as for keeping track of user-specified parameters that determine how the values will be displayed. Examples of such parameters are the presence or absence of a grid, whether or not consecutive points are connected by a line, and scrolling amount per data item or "paper speed" (which will be explained later).

As the name suggests, the History Circular Buffer holds a fixed number of data items; as new items are added to full buffer, they overwrite the oldest item in the buffer. The path of items from control to the history buffer is illustrated by the black arrow in FIG. 102. The size of the buffer is determined by two factors: the size of the strip chart on the screen, and the amount by which the display is scrolled with each new value. This scrolling amount is analogous to the "paper speed" of a physical strip-chart recorder, and can be varied by the user. The parameters involved in setting history buffer size are shown by the gray arrows in the above Figure.

When the strip chart is operating during virtual instrument execution, each new data item that is passed to it is added to the History Buffer, the display is scrolled by an amount proportional to the "paper speed", and the new item is plotted at one edge of the strip chart recorder. When the position of the strip chart recorder is changed on the screen, or the display is resized, (the changing number of items the history buffer can hold), the display can be redrawn using the values from the history buffer. This is the advantage of keeping track of history by maintaining a series of prior data items instead of simply keeping a copy of the picture; changing the style of display doesn't erase the history.

The strip chart recorder enhances the operation of the LabVIEW system by allowing the operator to monitor a changing data value, and see the changing values in relation to each other.

Appendix D provides a source code listing useful in implementin the strip chart recorder. Appendix D is incorporated herein by this reference.

Database Management

It is possible to "log" the data on a VI front panel. Each "snapshot" of the front panel represents a record in the VI database of logged data. Each record may be individually inspected via the front panel or discarded. The VI front panel effectively defines a "relation" (the controls and indicators are the "attributes") and the logged data constitutes a relational data base.

Each record of a VI database may also be retrieved in the context of a block diagram similar to the way the VI itself is used within the context of a block diagram. Instead of placing the VI icon in the diagram (which is a node that uses the VI) the VI icon along with a database-access structure is placed in the diagram (which is a data node that accesses logged VI data). The data base-access structure has input terminal to specify the record number and an output terminal for the date and time at which the data was logged. The terminals on the VI icon are still operative except that all the controls (inputs) are changed to indicators (outputs) since the data on the controls was logged also.

The present invention provides the ability of a VI to define and contain a relational database where the front panel controls and indicators represent the relation attributes. It also provies the ability to retrieve logged VI data records within a block diagram by means of a database-access structure which references the VI icon. Additionally, it provides the ability to have the successful completion of VI execution automatically triggered a database "append" transaction (log the data).

Database Management

It is possible to "log" data on a VI front panel. Each "snapshot" of the front panel represents a record in the VI data base of logged data. Each record may be individually inspected via the front panel or discarded. The VI front panel affectively defines a "relational schema" (the controls and indicators are the "attributes" of the relational schema) and the logged data constitutes a relational database. Data is saved in the same file as the virtual instrument definition. The VI defines the data which is used for both the operation of the VI and the logging of data. The control list defines the inputs and outputs of the VI and is a specification to log data.

By definition, a "relational database" is an instance of a relation defined by a list of attributes (where the order is important) called "relational schema". And a "relation" in database is viewed as table where each row is a member (tuple) of the relation and each column corresponds to one attribute. In LabVIEW, each front panel controls or indicator defines the one attribute of the relational schema which is used to define the logged data that constitutes a relational database. An example is shown in FIG. 103. The values stored in the table are not always scalar. FIG. 104 is the chart (a subset of all possible control and indicator types) that displays how different control and indicator types are stored in the table.

An instrument can be set to perform automatic logging of data upon the successful completion of VI execution or data can be logged for each successful run explicitly. When the data is logged, it creates an entry in the TMAP structure (which keeps track of the location and the size of logged data for each run) in the resource file and saves the values of controls on the front panel in the data fork file in the same order in which they exist in the control list.

The ordering of the controls in the control list is crucial since the control list is used to save and retrieve logged data. Therefore, adding new controls, deleting controls, deleting and then adding the same control on the front panel would result in errors while retrieving. LabVIEW prevents editing the front panel until any logged data is discarded.

Each record (run) of a VI data base can be retrieved programatically or interactively by specifying the record (run) number of the VI database. The record number is used to index TMAP structure which defines the location and the size of records (runs) in VI database. Once the record is located, the values of controls are read using the control list. The retrieved data appears on the front panel controls and indicators just as it did when it was logged. This is the most natural presentation for logged data.

In programatically retrieval, each record of a VI database is retrieved in the context of a block diagram similar to the way the VI itself is used within the context of a block diagram. Instead of placing the VI icon in the diagram (which is a node that uses the VI, FIG. 105) the VI icon along with a database-access structure is placed in the diagram (which is a data node that accesses logged VI data, FIG. 106). The database-access structure has an input terminal to specify the record number and an output terminal for the date and time at which the data was logged. The terminals on the VI icon are still operative except that all the controls (inputs) are changed to indicators (outputs) since the data on the controls was logged also.

The present invention provides the ability of a VI to define and contain a relational database where the front panel controls and indicators represent the attributes of the relational schema. It provides the ability to retrieve logged VI data records within a block diagram by means of a database-access structure which references the VI icon. Also, it provides the ability to have the successful completion of VI execution automatically trigger a data base "append" transaction (log the data).

Appendix E provides a source code listing useful in implementing the data base management function. Appendix E is incorporated herein by this reference.

Error Handling

Errors in instrumentation systems are particularly problematical because of the difficulty in distinguishing the ones that can be handled programmatically from the ones that require operator intervention. Most instrument programmers typically ignore errors rather than provide code to handle them explicitly. LabVIEW takes a different approach from previous instrumentation systems by classifying errors and providing alternative automatic methods for handling certain classes.

Errors in LabVIEW are defined as out-of-range values on variables, or as values on multiple variables that are in range but inconsistent with each other. Inconsistencies among variables of a structure are handled automatically within LabVIEW (e.g., if all arrays being indexed on a for-loop are not the same size then the number of iterations of the for-loop is equal to the smallest array size). There is not automatic handling of inconsistencies among variables on a front panel (these must be explicity checked for the block diagram).

Out-of-range values, or range errors, imply the existence of ranges for controls and indicators (the source code filed with the original application implemented ranges for numeric controls and indicators but there was not associated error checking; there is only partial error checking and handling in the current version of LabVIEW).

Numeric ranges can be unbounded on both ends, bounded on one end, or bounded on both ends. In addition, the range can be continuous or discrete steps (only linear steps are currently implemented). Ranges for binary and string controls and indicators can also be defined (none are implemented in the current version of LabVIEW).

Ranges errors on internal controls/indicators are handled automatically. Range errors on front panel controls/indicators can be handled in one of three ways, selectable by the VI builder or user, coerce, ignore, or stop. Coerce means the value is changed to a value that is within the allowed range. Ignore means the value is imply passed along as if it were within range. Stop means that the VI containing the range error is put in its suspended state (unless it was active, in which case it just goes to its idle state).

In some earlier programming languages allowance was made for specification of numeric ranges. Earlier instrumentation systems allowed for controls with detents (bounded discrete range) as well as continuously settable controls (bounded continuous range. Coercion to within range is a common technique in both disciplines. Stopping, by automatically switching to interactive mode at the point the range error was detected, is done in some interpretive programming languages. There is nothing comparable done for instruments.

The present invention provides the ability of an out-of-range value on a control or indicator to cause a VI to enter its suspended state (allowing interactive use of the VI). It provides the ability of the diagram execution system to automatically coerce an out-of-range value to an in-range value without having to explicitly diagram such behavior.

Error Handling

All errors in LabVIEW are range errors, i.e, a token is placed on a control such that the value of the token is outside the range specified in the control.

LabVIEW does not detect errors described as inconsistencies among a set of controls. Consistency checking must be explicitly programmed by the VI designer.

LabVIEW's response to a range error can be specified by the VI designer to be one of three possibilities:
- ignore the error and propagate the out-of-range token as if it were ok
- coerce the value to be in range; round to nearest or set to min or max
- stop execution at the node or VI where the error was detected Any other possibility (e.g., coerce using a different algorithm) must be explicitly programmed by the VI designer. Coercing is the default for front panel controls and stopping is the default for front panel indicators.

Range errors that occur on block diagram controls are handled by LabVIEW in a prescribed manner that is not changeable:
- a number $<1$ or negative NaN propagated to [N] is coerced to 1
- a non-integer $<1$ propagated to [N] is rounded to the nearest integer
- a number $<=2^{32}$ positive NaN propagated to [N[ is coerced to $2^{32}-1$
- a number $<0$ or negative NaN propagated to [? ] is coerced to 0
- a non-integer $<0$ propagated to [?] is rounded to the nearest integer
- a number $<$maxD or positive NaN propagated to [?] is coerced to maxD
- an index $=$d mSize for the array indexer node or for an indexed- array input to a while loop is coerced to dimSize 1
- a non-integer propagated to the run input of a data node is rounded to the nearest integer
- a number $<0$ or $<$maxRun or any NaN is ignored and results in eof=True Certain consistency errors are detected by LabVIEW and handled in a prescribed manner that is not changeable:
- for conflicting dimSizes (and value propagated to [N]) [N] is set to the smallest value If coercion is necessary the token is first copied by value into the control's myToken and then the myToken copy is coerced.

Boolean ranges
True only
False only
True or False (defaults)
Numeric ranges
Natural number (1, 2, . . . )
Positive integer (p, 1, 2, . . . )
Negative integer -continued Integer
Positive real number including +infinity (atan interpolation graphics)
Negative real number including −infinity (atan interpolation graphics)
Real number including ±infinity (atan interpolation graphics) (default)
Bounded integer range
Bounded real number range (linear, log, pseudo-log interpolation graphics)
Discrete real number list
String ranges
Uppercase alphabetic
Lowercase alphabetic
Alphabetic
Numeric
Printable
ASCII
Binary (default)
String length ranges
non-zero
Fixed length
Bounded length
Arbitrary length (default)
Array (index) ranges
Fixed length
Bounded length
Unbounded length (default)

Error Handling

Errors in instrumentation systems are particularly problematical because of the difficulty in distinguishing the ones that can be handled programmatically from the ones that require operator intervention. Most instrument programmers typically ignore errors rather than provide code to handle them explicitly. LabVIEW takes a different approach from previous instrumentation systems by classifying errors and providing alternative automatic methods for handling certain classes.

Errors in LabVIEW are defined as out-of-range values on variables, or as values on multiple variables that re in range but inconsistent with each other. Inconsistencies among variables on a front panel (these must be explicitly checked for in the the block diagram).

Out-of-range values, or range errors, imply the existence of ranges for controls and indicators (the course code filed with the original application implemented ranges for numeric controls and indicators but there was no associated error checking; there is only partial error checking and handling in the current version of LabVIEW). These range errors are detected when a token is placed on a control such that the value of the token is outside the range specified in the control.

Numeric ranges can be unbounded on both ends, bounded on one end, or bounded on both ends. In addition, the range can be continuous or discrete steps (only linear steps are currently implemented). Ranges for binary and string controls and indicators can also be defined. Boolean ranges can be true only, false only, and true or false. Ranges for string controls and indicators can be non-zero, fixed length, uppercase, lowercase, alphabetic, non-zero, fixed, bounded and arbitrary. Array index ranges are fixed, bounded or unbounded length (boolean, string and array index ranges are not currently implemented).

Range errors on internal controls/indicators are handled automatically. Range error on front panel controls/indicators can be handled in one of three ways, selectable by the VI builder or user; coerce, ignore, or stop. Coerce means the value to be changed to a value that is within the allowable range by rounding to nearest or setting to maximum or minimum values. Ignore means the value is imply passed along as if it were within range. Stop means that the VI containing the range error is put in its suspended state (unless it was active, in which case it just goes to its idle state).

Error states are represented internally within each virtual instrument. Two flags are maintained within each VI: control error and indicator error. None, one or both of these flags may be set for each VI. In addition, each control has one flag to indicate a bad value.

Two additional flags are maintained to represent the chosen error handling response within each front panel control/indicator. One flag specifies whether to ignore or act upon an out-of-range error. If ignore is not selected, the second flag signifies stop on error or coercion. Coercion is the default for front panel controls and stopping is the default for front panel indicators.

At execution time, each control's range is checked through these flags along with the method of error handling. Control range error flags are checked before a VI execution. Indicator range error flags are checked after VI execution.

FIGS. 109–112 illustrates LabVIEW error handling with user interaction. The instrument being executed, TopLevel, makes a call to sub-VI. Both of these instruments have a numeric front panel control and a numeric front panel indicator, each with range—checking set to stop on error and range of 0 to 10.

Figure 108:
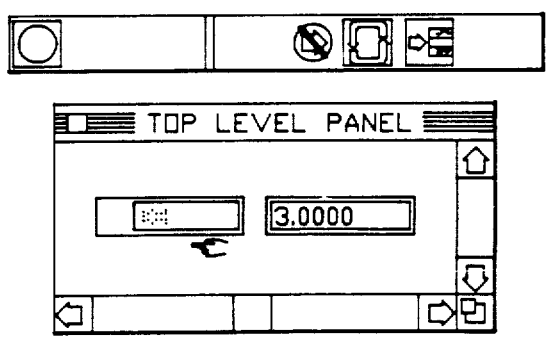

As shown by FIG. 108, as out-of-range values are entered into controls, the value is dimmed and the control out-of-range icon appears in the control palette.

Figure 109:
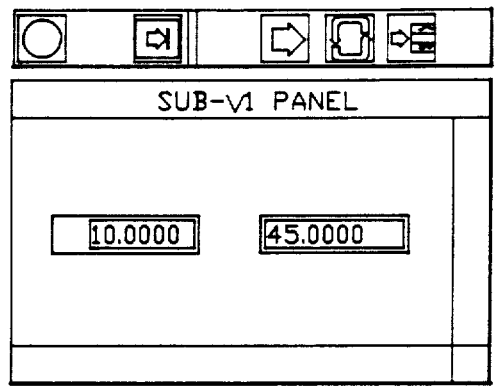

As shown by FIG. 109, if an indicator is detected to have an out-of-range value, execution is suspended, and the suspended icon is displayed in the instrument's control palette.

Figure 110:
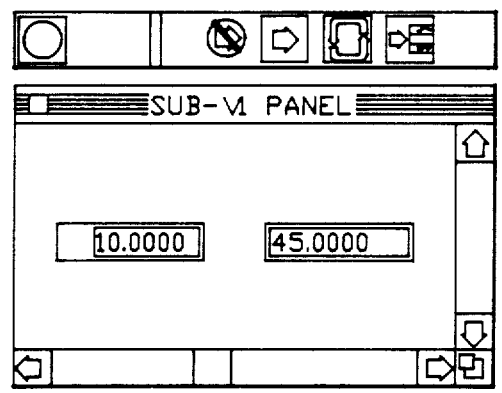

Moreover, as illustrated by FIG. 110, clicking on the suspended icon makes sub-VI the front window and displays an out-of-range indicator error icon along with the dimmed-out indicator.

This error display prompts the user to correct the indicator or control value. When the control value has been corrected interactively, the front panel control list is traversed to detect other out-of-range control values. Each out-of-range control remains dim until the user corrects the value. Once the values are corrected, the user can retry the VI execution. Resuming execution returns control to Top-Level. Because the above error occurred in a lower-level instrument, the VI was suspended. If an indicator in the To-Level instrument is out-of-range, the value will be dimmed and the instrument will be in an idle state.

Previously in some programming language allowance was made for specification of numeric ranges. Additionally, earlier in instrumentation systems allowance was made for controls with detents (bounded discrete range) as well as continuously settable controls (bounded continuous range). Coercion to within range is a common technique in both disciplines. Stopping, by automatically switching to interactive mode at the point the range error was detected, is done in some interpretative programming languages. There is nothing comparable done for instruments.

The present invention provides the ability of an out-of-range value on a control or indicator to cause a VI to enter its suspended state (allowing interactive use of the VI). Furthermore, it provides the ability of the diagram execution system to automatically coerce an out-of-range value to an in-range value without having to explicitly diagram such behavior.

Conclusion

The system and method of the present invention, therefore, permit the computer-aided modelling of a process using graphical techniques which generally are more easily comprehended, especially by persons who do not possess specialized skills in computer programming techniques. The use of a computer-generated image o a front panel display permits a user to easily understand how data is provided to a system being modelled and how data is provided by the system. The block diagram editor permits a user to construct a graphical representation of a procedure for producing input data from output data using icons which reference modulaized procedural units. A user may use the icon editor to construct his/her own icons; or he/she may call upon a ready-made library of icons. The execution subunit executes execution instructions which are constructed in response to the graphical images produced by a user to model a process. Thus, a user can program a computer substantially by constructing a hierarchy of icons connected to one-another so as to model a process. A user, therefore, can use the system and method of the present invention to program a computer to model a process using graphical techniques which generally are easier to comprehend.

Furthermore, the system and method of the present invention advantageously can use data flow techniques. The use of the structures, illustrated in FIGS. 8-17, facilitates the use of such data flow techniques. By using such techniques, a system modelled in block diagram form can operate in a parallel fashion, since each individual icon in a hierarchy comprising such a block diagram, operates as soon as all input data provided to it are available. In addition, such structures render graphical representations of block diagrams using such data flow techniques more comprehensible to a user, and, therefore, simplify the task of using such techniques. It will be understood that the above-described embodiments and methods are merely illustrative of many possible specific embodiments and methods which can represent the principles of the invention. Numerous and varied other arrangements and methods can be readily devised in accordance with these principles without departing from the spirit and scope of the invention. Thus, the foregoing description is not intended to limit the invention which is defined by the appended claims in which:

What is claimed is:

1. A method for programming a computer system including means for displaying images on a screen to control at least one of a virtual instrument and an instrument, the method comprising the steps of:
   providing a class of respective function-icons that reference respective control means for controlling respective functions;
   selecting from the class of function-icons at least one first function-icon that references at least one first control means for controlling a first function;
   providing a class of respective variable-icons wherein each respective variable-icon references a respective variable, the class of variable-icons including a strip chart-icon that displays past and present values of a variable and that references strip chart control means for storing past and present values for a variable;
   selecting at least one first input variable-icon from the class of variable-icons;
   selecting the strip chart-icon from the class of variable-icons;
   assembling on the screen a first front panel including the at least one first input variable-icon and the strip-chart-icon; and
   assembling on the screen a first data flow diagram including the at least one first function-icon and the at least one first input variable-icon and the strip chart-icon, wherein the first diagram displays a first procedure for producing at least one value for the strip chart-icon from at least one value for the at least one first input variable-icon.

2. The method of claim 1 and further comprising the step of:
   in the course of said step of assembling on the screen said front panel, displaying on the screen the at least one first input variable-icon and the strip chart-icon.

3. The method of claim 1 and further comprising the step of:
   in the course of said step of assembling on the screen said first data flow diagram, displaying on the screen the at least one first function-icon and the at least one first input variable-icon and the strip chart-icon.

4. The method of claim 1 and further comprising the step of:
   simultaneously displaying on the screen the first front panel and the first data flow diagram.

5. The method of claim 1 and further comprising the steps of:
   assembling on the screen a first user-defined-function-icon that displays on the screen a reference to the first diagram;
   selecting from the class of function-icons at least one second function-icon that references at least one second control means for controlling a second function;
   selecting at least one second input variable-icon from the class of variable-icons;
   selecting at least one second input variable-icon from the class of variable-icons;
   assembling on the screen a second front panel including the at least one second input variable-icon and the at least one second output variable-icon; and
   assembling on the screen a second data flow diagram including the first user-defined-function-icon and the at least one second function-icon and the at least one second input variable-icon and the at least one second output variable-icon, wherein the second diagram displays a second procedure for producing at least one value for the at least one second output variable-icon from at least one value for the at least one second input variable-icon;
   whereby a hierarchy of diagrams is produced in which the first diagram is referenced by the first user-defined-function-icon in the second diagram.

6. The method of claim 5 and further comprising the steps of:
   assembling on the screen a second user-defined-function-icon that displays on the screen a reference to the second-diagram;

selecting from the class of function-icons at least one third function-icon that reference at least one third control means for controlling a third function;

selecting at least one third input variable-icon from the class of variable-icons;

selecting at least one third output variable-icon from the class of variable-icons;

assembling on the screen a third front panel including the at least one third input variable-icon and the at least one third output variable-icon; and assembling on the screen a third data flow diagram including the second user-defined-function-icon and the at least one third function-icon and the at least one third input variable-icon and the at least one third output variable-icon, wherein the third diagram displays a third procedure for producing at least one value for the at least one third output variable-icon from at least one value for the at least one third input variable-icon;

whereby a hierarchy of diagrams is produced in which the first diagram is referenced by the first user-defined-function-icon in the second diagram and the second diagram is referenced by the second user-defined-function-icon in the third diagram.

7. The method of claim 6 and further comprising the steps of:

assembling on the screen a third user-defined-function-icon that displays on the screen a reference to the third diagram;

selecting from the class of function-icons at least one fourth function-icon that references at least one fourth control means for controlling a fourth function;

selecting at least one fourth input variable-icon from the class of variable-icons;

selecting at least one fourth output variable-icon from the class of variable-icons;

assembling on the screen a fourth front panel including the at least one fourth input variable-icon and the at least one fourth output variable-icon; and assembling on the screen a fourth data flow diagram including the third user-defined-function-icon and the at least one fourth function-icon and the at least one fourth input variable-icon and the at least one fourth output variable-icon, wherein the fourth diagram displays a fourth procedure for producing at least one value for at least one fourth output variable-icon from at least one value for the at least one fourth input variable-icon;

whereby a hierarchy of diagrams is produced in which the first diagram is referenced by the first user-defined-function-icon in the second diagram and the second diagram is referenced by the second user-defined-function-icon in the third diagram and the third diagram is referenced by the third user-defined-function-icon in the fourth diagram.

8. The method of claim 7 and further comprising the steps of:

assembling on the screen an (n−1)th user-defined-function-icon that displays on the screen a reference to an (n−1)th data flow diagram, wherein n is an integer and n≧5;

selecting at least one nth function-icon from the class of function-icons;

selecting at least one nth input variable-icon from the class of variable-icons;

selecting at least one nth output variable-icon from the class of variable-icons;

assembling on the screen an nth front panel including the at least one nth input variable-icon and the at least one nth output variable-icon, and assembling on the screen an nth data flow diagram including the (n−1)th user-defined-function-icon and the at least one nth function-icon and the at least one nth input variable-icon and the at least one nth output variable-icon, wherein the nth diagram displays an nth procedure for producing at least one value for the at least one nth output variable-icon from at least one value for the at least one nth input variable-icon;

whereby a hierarchy of diagrams is produced in which the (n−1)th diagram is referenced by the (n−1)th user-defined-function-icon in the nth diagram.

9. The method of claim 5 wherein said step of assembling on the screen a first user-defined-function-icon includes the steps of:

displaying on the screen at least one panel-pattern-icon from a set of respective panel-pattern-icons wherein each respective panel-pattern-icon references a distinct arrangement of panels;

selecting a first panel-pattern-icon from the set of panel-pattern-icons;

displaying on the screen the first panel-pattern-icon and the at least one first input variable-icon;

displaying on the screen the first panel-pattern-icon and the strip chart-icon;

defining an association between at least one first inlet panel of the first panel-pattern-icon and the at least one first input variable-icon; and defining an association between at least one first output panel of the first panel-pattern-icon and the strip chart-icon.

10. The method of claim 9 and further comprising the step of:

in the course of said step of defining an association between the at least one first input panel of the first panel-pattern-icon and the at least one first input variable-icon, displaying the defining association between the at least one first input panel of the first panel-pattern-icon and time at least one first input variable-icon; and in the course of said step of defining an association between the at least first output panel of the first panel-pattern-icon and the at least one first output variable-icon, displaying the defined association between the at least one first output panel of the first panel-pattern-icon and the strip chart-icon.

11. The method of claim 1 and further comprising the step of:

displaying on the the screen a first menu identifying a class of functions that respectively correspond to the function-icons of the class of function-icons.

12. The method of claim 1 and further comprising the steps of:

displaying on the screen a first menu identifying a class of functions that respectively correspond to the function-icons of the class of function-icons; and displaying on the screen a second menu identifying a class of variables that respectively correspond to the variable-icons of the class of variable-icons.

13. The method of claim 1 and further comprising the step of:

selecting the at least one first control means.

14. The method of claim 13 wherein:

said step of selecting the at least one first control means is performed automatically in the course of said steps of selecting the at least one first function-icon and assembling on the screen the first front panel and assembling on the screen the first diagram.

15. The method of claims 13 or 14 wherein said first control means is substantially implemented in software.

16. The method of claim 15 and further comprising the steps of:
reserving first input variable space in memory of the computer system corresponding to the selected at least first input variable-icon; and
reserving first output variable space in memory of the computer system corresponding to the strip chart-icon.

17. The method of claim 16 wherein:
said step of reserving first input variable space is performed automatically in the course of said steps of selecting the at least one first input variable-icon and assembling on the screen the first front panel and assembling on the screen the first diagram; and
said step of reserving first output variable space is performed automatically in the course of said steps of selecting the strip chart-icon and assembling on the screen the first front panel and assembling on the screen the first diagram.

18. The method of claim 16 wherein said step of assembling on the screen the first diagram further includes the steps of displaying on the screen at least one first input arc between the at least one first input variable-icon and the at least one first function-icon and displaying on the screen at least one first output arc between the strip chart-icon and the at least one first function-icon; and further comprising the steps of:
forming first input means for moving respective input values for the at least one first input variable between the at least one first input variable space and the at least one first control means.

19. The method of claim 18 wherein:
said step of forming first input means is performed automatically in the course of said step of displaying on the screen the at least one first input arc.

20. The method of claim 18 wherein:
the at least one first control means and the first input means are substantially implemented in software.

21. The method of claim 18 and further comprising the steps of:
assigning at least one value for each at least one first input variable-icon;
storing in the reserved first input variable space each at least one assigned value;
after said steps of assigning and storing at least one value for each at least one first input variable-icon, moving each at least one value for the at least one first input variable-icon from the reserved first input variable space to the at least one first control means using the first input means;
after said steps of assigning and storing at least one value for each at least one first input variable-icon, producing at least one value for the strip chart-icon using the at least one first control means to control the first function; and
storing each value for the at least one first output variable-icon in the reserved first output variable space.

22. The method of claim 16 and further comprising the steps of:
assigning at least one value for each at least one first input variable-icon;
storing in the reserved first input variable space each at least one assigned value;
after said steps of assigning and storing at least one value for each at least one first input variable-icon, producing at least one value for the strip chart-icon; and
storing each value for the at least one first output variable in the reserved first output variable space.

23. The method of claim 22 wherein:
said step of storing each at least one assigned value is performed automatically in the course of said step of assigning.

24. The method of claim 1 wherein said step of assembling on the screen the first diagram further includes the steps of displaying at least one first input arc between the at least one first input variable-icon and the at least one first function-icon and displaying on the screen at least one first output arc between the strip chart-icon and the at least one first function-icon.

25. The method of claim 1 and further comprising the steps of:
assigning at least one value for each at least one first input variable-icon;
after assigning at least one value for each at least one first input variable-icon, producing at least one value for the strip chart-icon from the at least one value for each at least one first input variable-icon.

26. The method of claim 25 wherein said step of assigning includes the steps of:
displaying said first front panel; and
instructing the at least one first input variable-icon to display the at least one assigned value.

27. The method of claim 26 and further including the step of:
displaying the at least one produced value in conjunction with the strip chart-icon.

28. The method of claim 25 wherein said step of producing at least one value for the strip chart-icon includes using said at least one first control means to control the first function.

* * * * *